(12) United States Patent
Hennighausen et al.

(10) Patent No.: US 11,832,535 B2
(45) Date of Patent: Nov. 28, 2023

(54) TWO DIMENSIONAL MATERIALS FOR USE IN ULTRA HIGH DENSITY INFORMATION STORAGE AND SENSOR DEVICES

(71) Applicant: Northeastern University, Boston, MA (US)

(72) Inventors: Zachariah Boston Hennighausen, Mount Rainer, MD (US); Swastik Kar, Belmont, MA (US)

(73) Assignee: Northeastern University, Boston, MA (US)

( * ) Notice: Subject to any disclaimer, the term of this patent is extended or adjusted under 35 U.S.C. 154(b) by 396 days.

(21) Appl. No.: 17/416,094

(22) PCT Filed: Dec. 18, 2019

(86) PCT No.: PCT/US2019/067298
§ 371 (c)(1),
(2) Date: Jun. 18, 2021

(87) PCT Pub. No.: WO2020/132152
PCT Pub. Date: Jun. 25, 2020

(65) Prior Publication Data
US 2022/0085287 A1  Mar. 17, 2022

Related U.S. Application Data

(60) Provisional application No. 62/781,561, filed on Dec. 18, 2018.

(51) Int. Cl.
*H10N 70/20* (2023.01)
*C09K 11/88* (2006.01)
(Continued)

(52) U.S. Cl.
CPC ........ *H10N 70/257* (2023.02); *C09K 11/881* (2013.01); *G11C 13/04* (2013.01);
(Continued)

(58) Field of Classification Search
None
See application file for complete search history.

(56) References Cited

U.S. PATENT DOCUMENTS

2017/0102332 A1* 4/2017 Spanier .............. G01N 21/6489
2017/0194144 A1* 7/2017 Duan ................ H01L 21/02601
(Continued)

OTHER PUBLICATIONS

"Oxygen-Induced In Situ Manipulation of the Interlayer Coupling andExciton Recombination in Bi2Se3/MoS22D Heterostructures" by Hennighausen et al. (Year: 2019).*
(Continued)

*Primary Examiner* — Evren Seven
(74) *Attorney, Agent, or Firm* — Verrill Dana, LLP

(57) ABSTRACT

2D heterostructures comprising $Bi_2Se_3/MoS_2$, $Bi_2Se_3/MoSe_2$, $Bi_2Se_3/WS_2$, $Bi_2Se_3/MoSe_{2-2x}S_{2x}$, or mixtures thereof in which oxygen is intercalated between the layers at selected positions provide high density storage devices, sensors, and display devices. The properties of the 2D heterostructures can be configured utilizing a beam of electromagnetic waves or particles in an oxygen controlled atmosphere.

22 Claims, 34 Drawing Sheets

(51) Int. Cl.
  *H10N 70/00* (2023.01)
  *G11C 13/04* (2006.01)
  *B82Y 10/00* (2011.01)
  *B82Y 20/00* (2011.01)
  *B82Y 40/00* (2011.01)

(52) U.S. Cl.
  CPC ......... *H10N 70/023* (2023.02); *H10N 70/235* (2023.02); *H10N 70/8822* (2023.02); *H10N 70/8825* (2023.02); *B82Y 10/00* (2013.01); *B82Y 20/00* (2013.01); *B82Y 40/00* (2013.01)

(56) References Cited

U.S. PATENT DOCUMENTS

| | | | |
|---|---|---|---|
| 2017/0373263 A1* | 12/2017 | Stubbs | H10K 50/81 |
| 2018/0026422 A1* | 1/2018 | Cronin | C01G 39/06 |
| | | | 252/510 |
| 2018/0186653 A1* | 7/2018 | Daniels | B01J 27/051 |
| 2020/0235245 A1* | 7/2020 | Torrisi | C09D 11/324 |

OTHER PUBLICATIONS

"Tunable and laser-reconfigurable 2D heterocrystalsobtained by epitaxial stacking of crystallographicallyincommensurate Bi2Se3and MoS2atomic layers" by Vargas et al. (Year: 2017).*

* cited by examiner

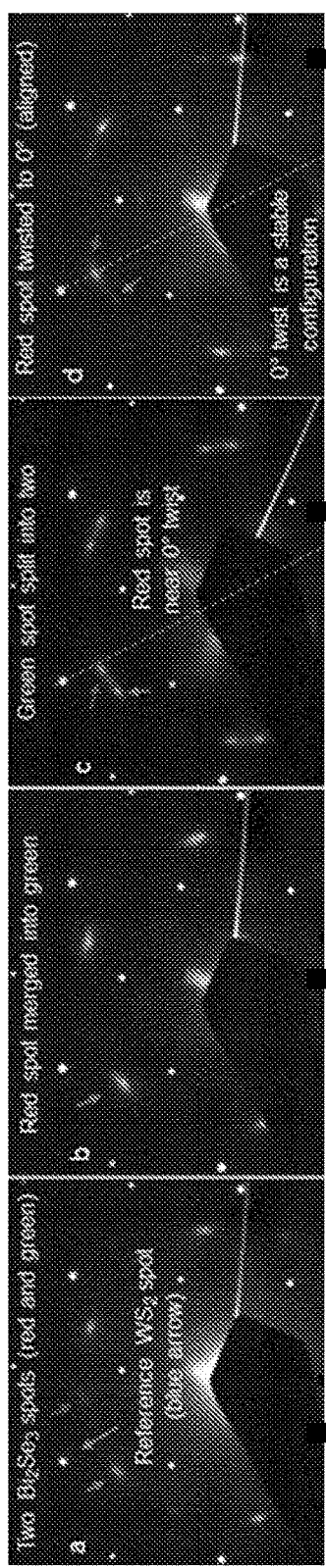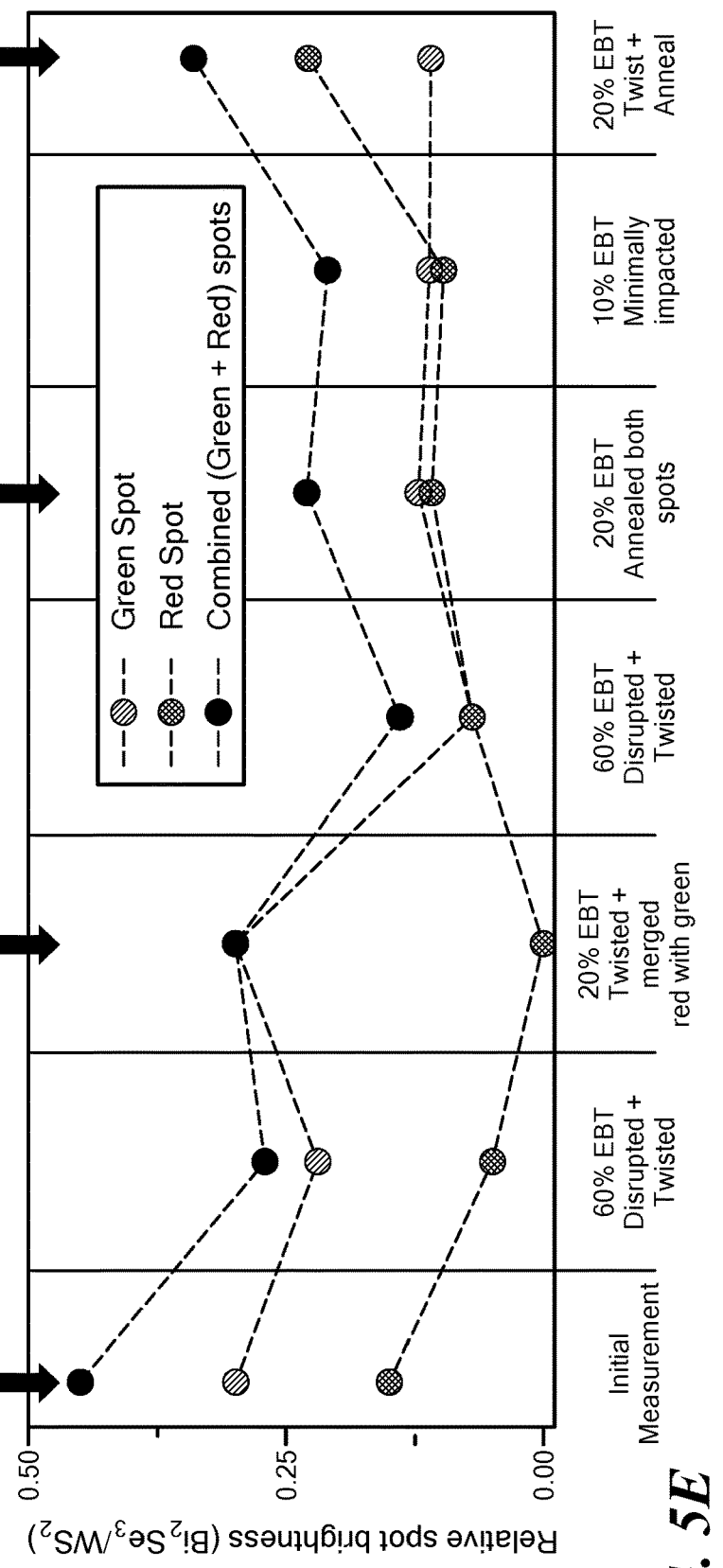
FIG. 5A  FIG. 5B  FIG. 5C  FIG. 5D
FIG. 5E

| 2D Heterostructure | Total # of Data Points | # of Data Points not at 0° |
|---|---|---|
| $Bi_2Se_3/MoSe_2$ | 69 | 14 |
| $Bi_2Se_3/MoS_2$ | 78 | 46 |
| $Bi_2Se_3/WS_2$ | 286 | 216 |
| $Bi_2Se_3/MoSe_{2-2x}S_{2x}$ | 93 | 93 |

*FIG. 11C*

$Bi_2Se_3/MoSe_2$: 14 data points randomly placed in 151 bins.

If the value is above 67 then it qualifies for 4-sigma.

| # of counts in the tallest bin | 1 instance | 2 instances | 3 instances | 4 instances | 5 instances |
|---|---|---|---|---|---|
| 1 | 5.354e5 | N/A | N/A | N/A | N/A |
| 2 | 4.493e5 | N/A | N/A | N/A | N/A |
| 3 | 14963 | 49 | 0 | 0 | 0 |
| 4 | 282 | 0 | 0 | 0 | 0 |

$Bi_2Se_3/MoS_2$: 46 data points randomly placed in 151 bins.

| # of counts in the tallest bin | 1 instance | 2 instances |
|---|---|---|
| 2 | 5.639e5 | N/A |
| 3 | 6.975e5 | N/A |
| 4 | 3.605e4 | N/A |
| 5 | 2014 | 1 |
| 6 | 101 | 1 |
| 7 | 3 | 0 |

$Bi_2Se_3/WS_2$: 216 data points randomly placed in 151 bins.

| # of counts in the tallest bin | 1 instance | 2 instances | 3 instances | 4 instances |
|---|---|---|---|---|
| 6 | 5.038e5 | N/A | N/A | N/A |
| 7 | 79127 | 2922 | 61 | 1 |
| 8 | 1490 | 99 | 0 | 0 |
| 9 | 2286 | 1 | 0 | 0 |
| 10 | 297 | 1 | 0 | 0 |

$Bi_2Se_3/MoSe_{2-2x}S_{2x}$: 216 data points randomly placed in 151 bins.

| # of counts in the tallest bin | 1 instance | 2 instances | 3 instances | 4 instances | 5 instances | 6 instances |
|---|---|---|---|---|---|---|
| 4 | 310315 | 68617 | 8661 | 719 | 42 | 1 |
| 5 | 54632 | 1232 | 9 | 0 | 0 | 0 |
| 6 | 5481 | 12 | 0 | 0 | 0 | 0 |
| 7 | 448 | 1 | 0 | 0 | 0 | 0 |
| 8 | 35 | 1 | 0 | 0 | 0 | 0 |

*FIG. 12*

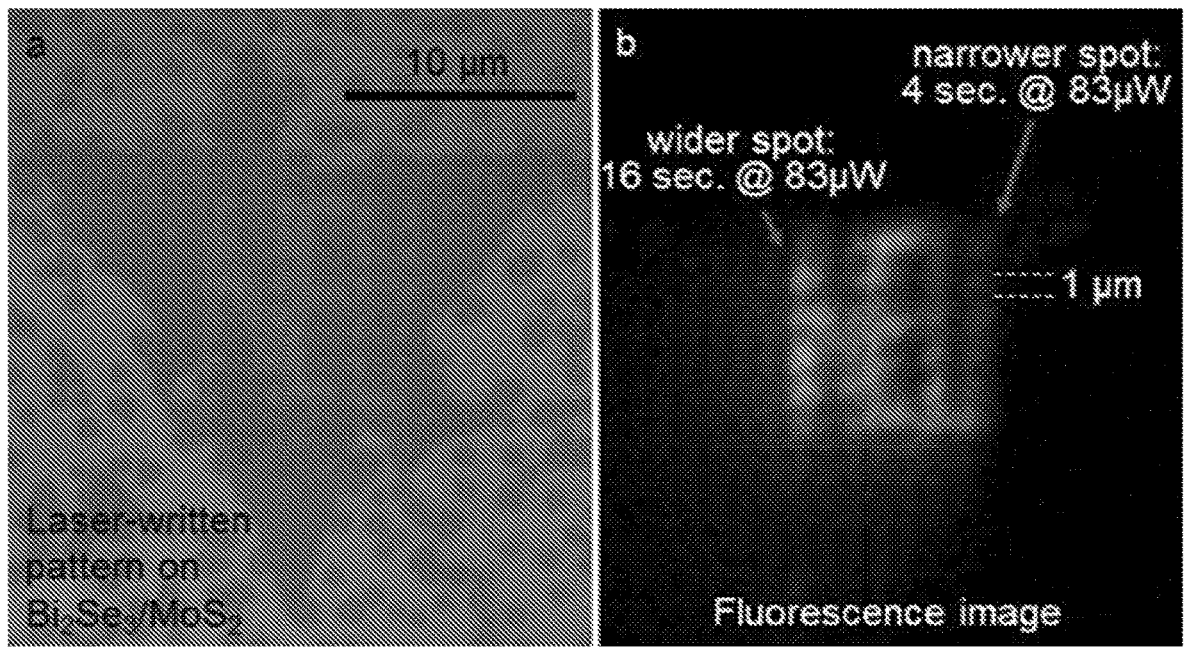
FIG. 19A  FIG. 19B
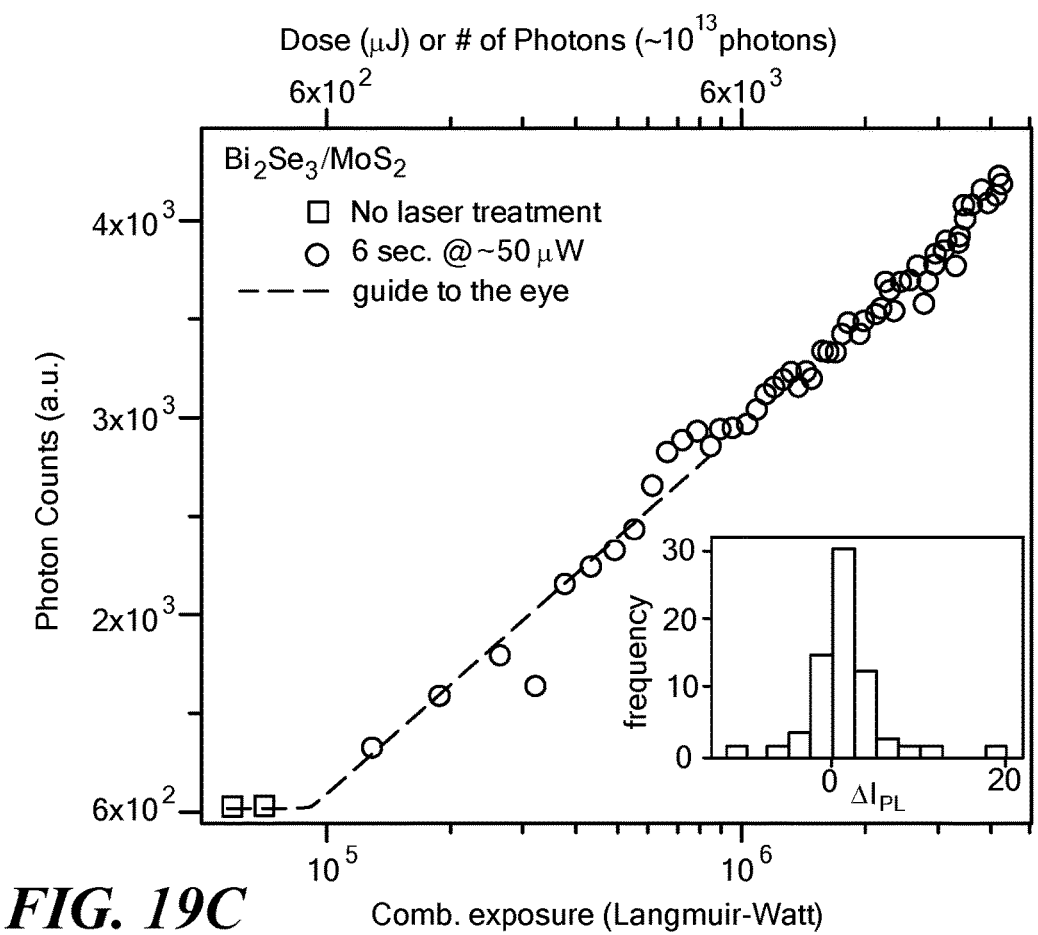
FIG. 19C

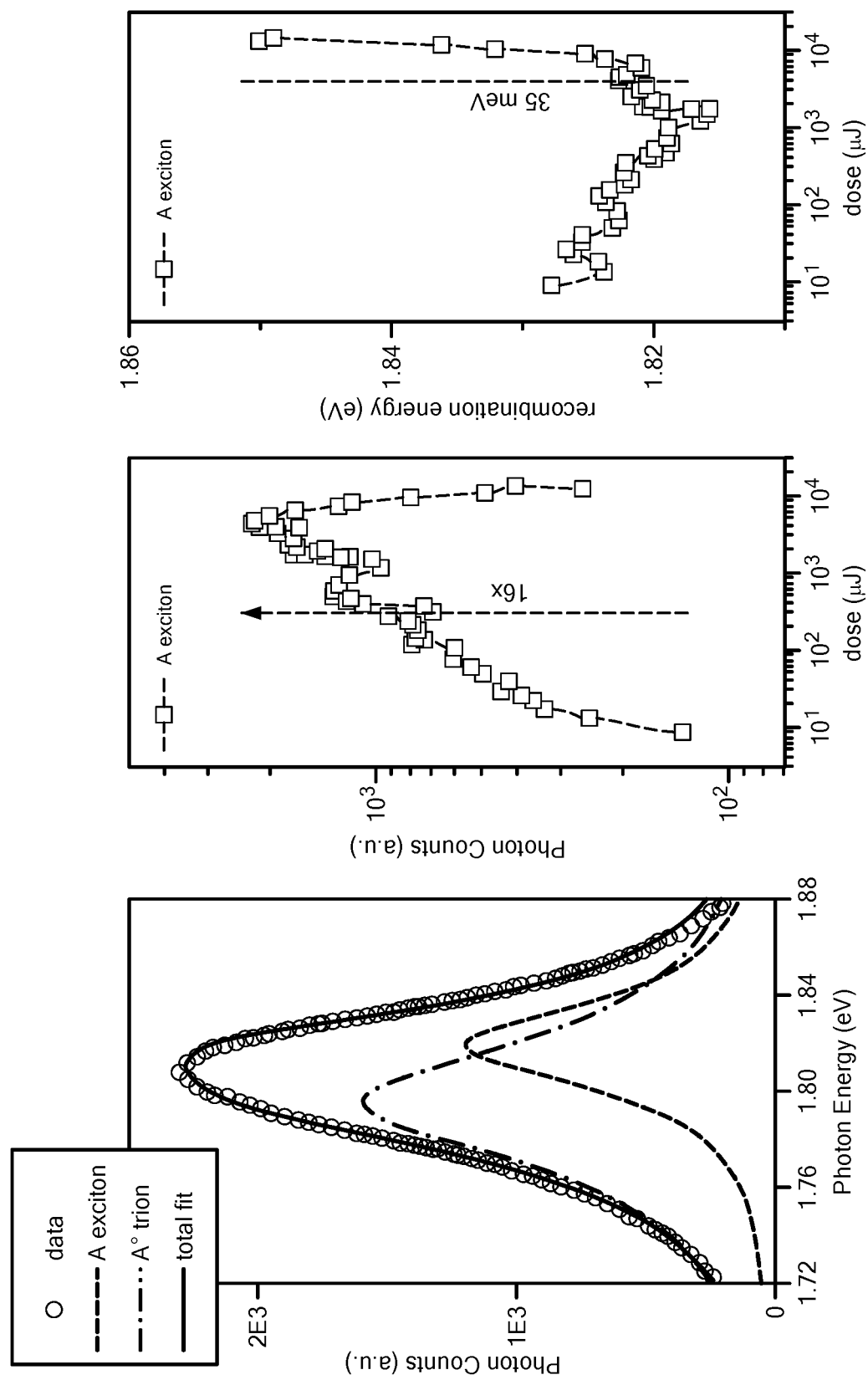

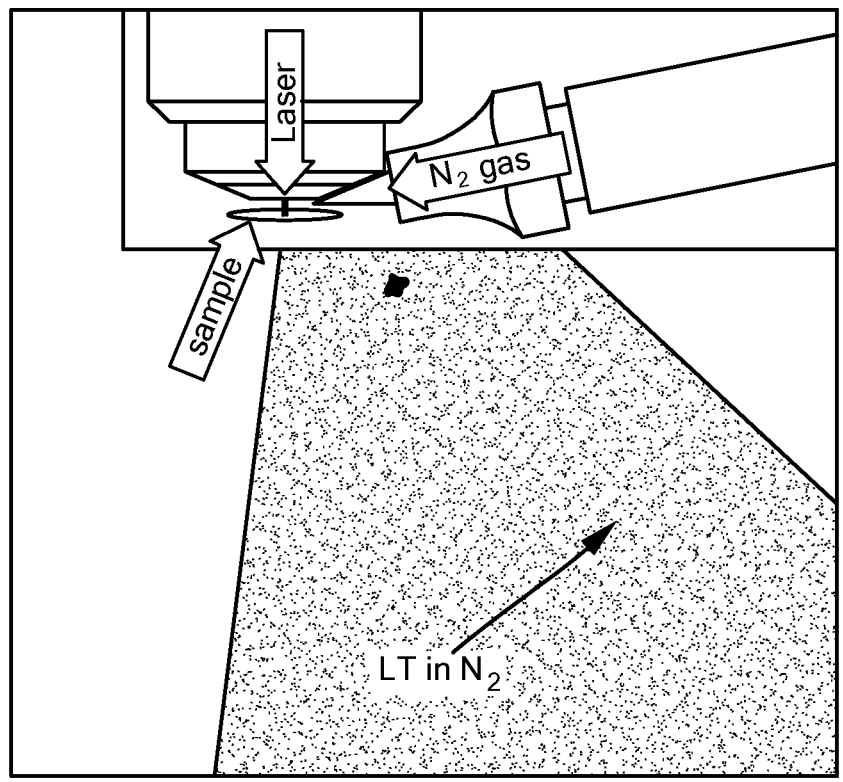
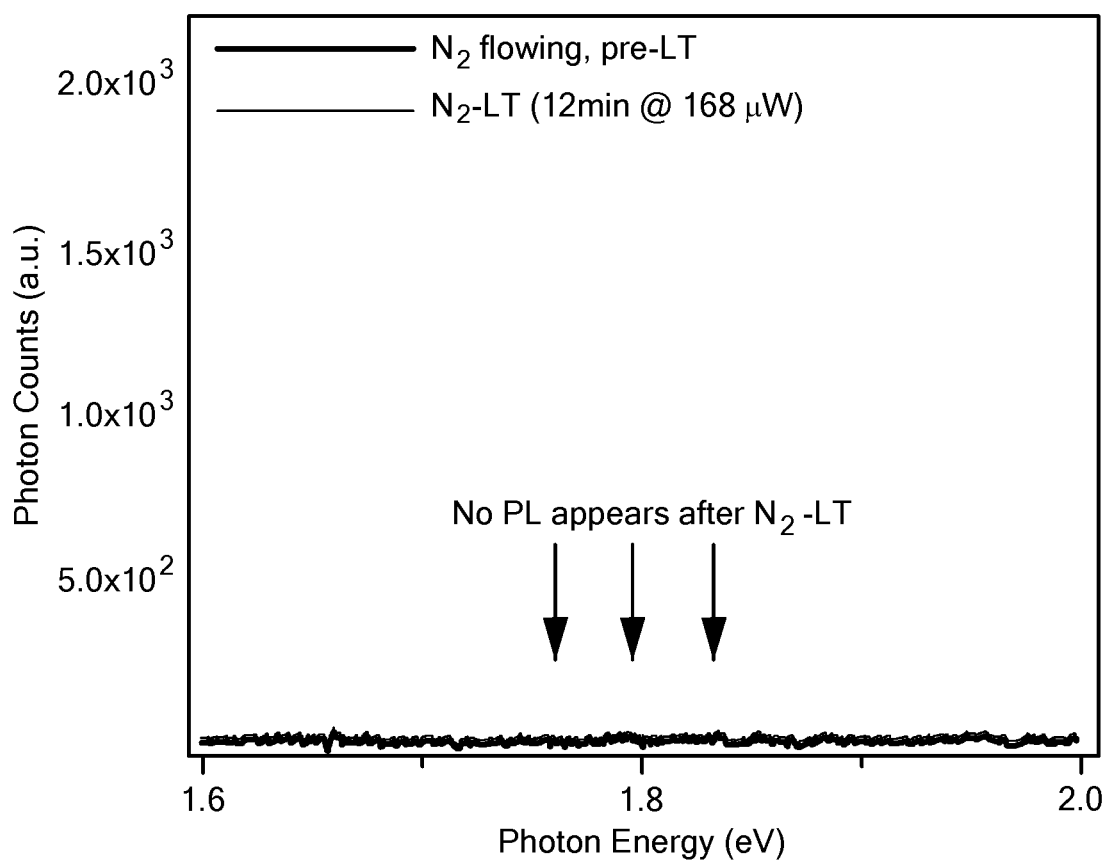
FIG. 21B

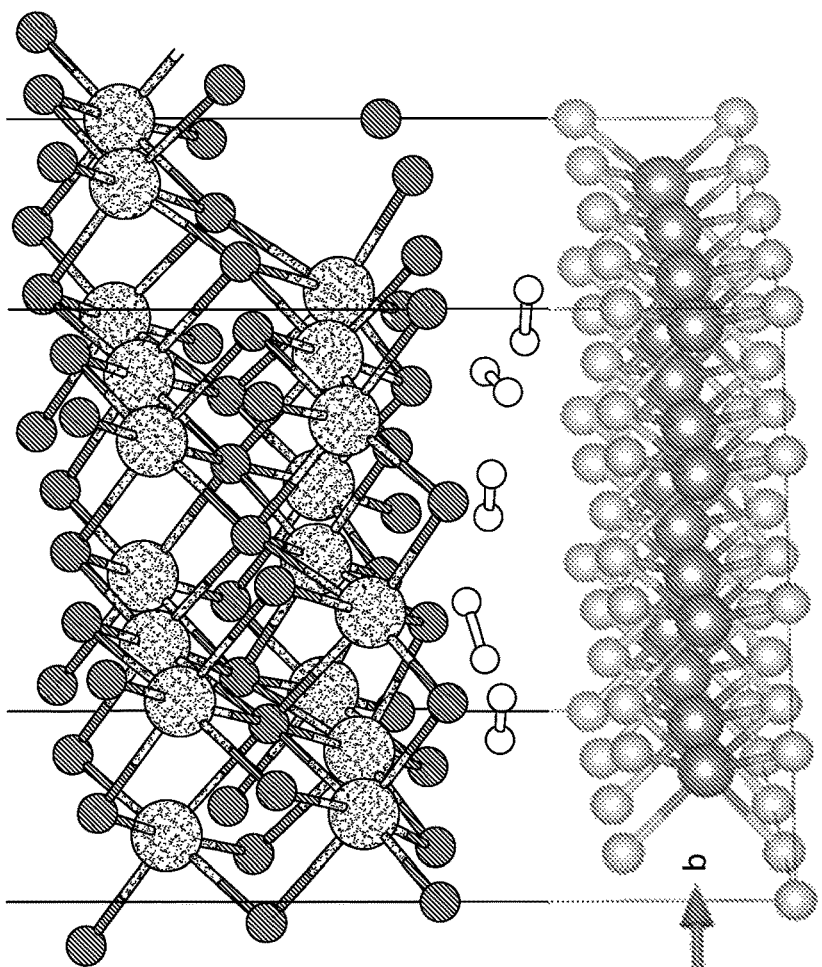
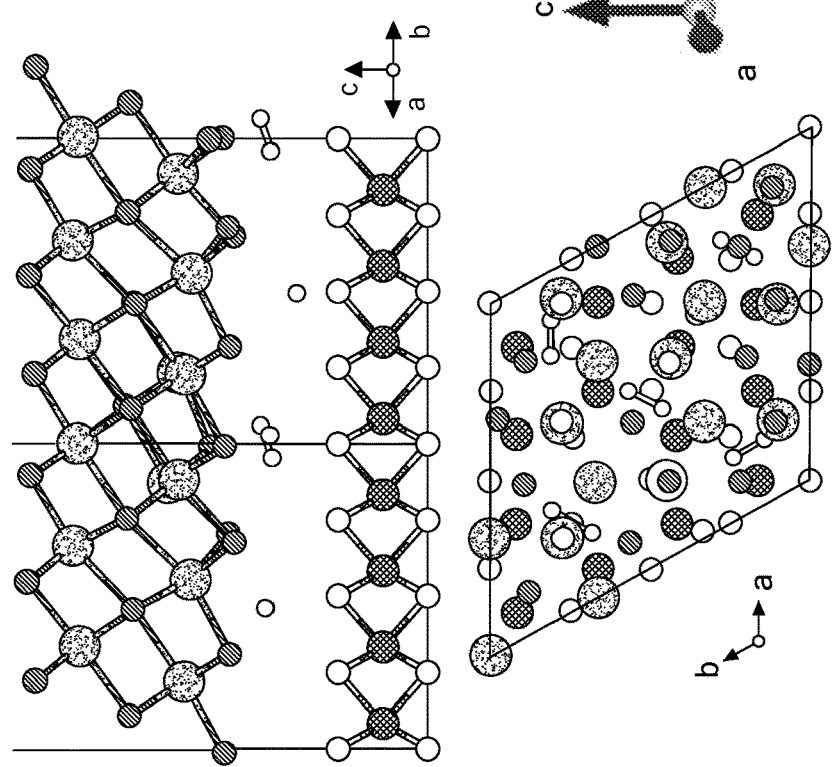
FIG. 23

11,832,535 B2

TWO DIMENSIONAL MATERIALS FOR USE IN ULTRA HIGH DENSITY INFORMATION STORAGE AND SENSOR DEVICES

CROSS-REFERENCE TO RELATED APPLICATIONS

This application claims priority to U.S. Provisional Application No. 62/781,561, filed 18 Dec. 2018, the entirety of which is incorporated herein by reference.

STATEMENT REGARDING FEDERALLY SPONSORED RESEARCH OR DEVELOPMENT

This invention was made with government support under Grant Number $ECCS_{1351424}$ awarded by the National Science Foundation. The government has certain rights in the invention.

BACKGROUND

In recent times, atomically-thin, layered, or 2D transition metal dichalcogenides (TMDs) have attracted enormous attention both due to their remarkable electronic, optical, spin, and valley properties[5] and their potential for diverse nanoelectronic, optoelectronic, sensing, and energy applications[6]. Carriers in these systems form tightly-bound neutral and charged excitons,[1], [7] and monolayer TMDs show strong photoluminescence peaks which result from a direct-recombination of these excitons. Controlling the population and recombination energy of these excitons is extremely important for both fundamental and applied research, and hence, methods for direct manipulation of excitons is a topic of rapidly-growing interest.[8]-[10]

Bismuth selenide, another layered material, is a strongly spin-orbit-coupled topological insulator, with a narrow band gap of $E_g$~350 meV and with topologically-protected gapless surface states.[11] When reduced to few-layered thickness, this material loses the protected surface states and achieves a widened band $E_g$>0.5 eV.[12] $Bi_2Se_3$ is also well-known for its oxygen-affinity. Initial absorption of oxygen p-dopes the crystal,[11], [13], [14] gradually destroying its exotic topological properties and eventually forming wide-band bismuth and selenium oxides.[13] Indeed, the deleterious oxidation of $Bi_2Se_3$ has so far restricted most practical applications using $Bi_2Se_3$.

Deposition of a thin layer of bismuth selenide over TMDs produces 2D heterostructures. 2D heterostructures are more than the sum of the two parent crystals—the interlayer interaction facilitates the exchange of electrons and charge that can induce new properties.[1b]-[6b] These artificial materials hold promise for new science and tailorable applications, due in part to their diverse properties.[7b]-[9b] They often manifest properties from both parent layers, as well as new ones that result from the interlayer interaction. [1b]-[3b], [5b], [6b] Recent works have shown that the effect of the interlayer interaction can be substantial, and even dominate the effective electronic and optical properties. Despite its importance, the interlayer interaction is not fully understood and there are a limited number of tools to probe it. The control of TMD excitons has focused on understanding the underlying crystal lattices. For example, the lattice matching of single-layer metal dichalcogenides and $BiS_3$, $Bi_2Se_3$, or $Bi_2Te_3$ has been disclosed in U.S. Patent Application Publication US 2019/0211474 A1, the entirety of which is incorporated herein by reference. It has been shown to create interlayer excitons,[10b], [11b] change the perceived color, [12b] shift e-h recombination paths,[3b] modify band structure,[13b] and even induce superconductivity.[1b] The importance of the interlayer interaction has given rise to research that attempts to tune and manipulate it;[6b], [14b]-[16b] however, this is challenging to accomplish experimentally, and even theoretical descriptions are incomplete.

"Interlayer interaction", sometimes called "interlayer coupling", is a broad term that encompasses the known and unknown parameters affecting the exchange of electrons and charge. The atomic registry (or interlayer nearest neighbors), [17b], [18b] interlayer spacing,[13b] interlayer charge redistribution,[3b], [19b] intercalation of atoms,[20b], [21b] and interlayer electron energy barrier[22b] are some parameters that affect the interlayer interaction and 2D heterostructures properties. When quantifying and studying this interaction, an important metric is the heterostructure's stability (i.e. the energy required to disrupt the current configuration, including twist angle and crystal structure). Higher stability implies increased bonding (or charge redistribution) between the layers, which facilitates increased electron and charge transfer, the primary "communication" medium that leads to the manifestation of new properties. Hence, studying the stability will reveal information about the interlayer interaction. Two notable parameters that affect the stability are the layer-to-layer atomic registry, and the chemical compositions. These parameters determine how strongly one of the layers adheres to the other. Conversely, the ease with which one could manipulate one layer with respect to the other would be a measure of their interlayer strength. However, there is currently no facile method for directly manipulating one layer of a bilayer structure with respect to the other, for example in-situ relative twisting. There are several methods to manipulate the twist angle, including optically aligned mechanical transfers,[23b], [24b] thermal annealing induced self-alignment,[25b], [26b] growing 2D heterostructures at preferred twist angles,[3b], [27b]-[29b] and AFM controlled twisting.[30b] Each of these methods has limitations. However, the relative orientation obtained by the first three methods cannot be altered once the 2D heterostructure is fabricated, and the fourth has only been demonstrated for bulk-monolayer heterostructures (i.e. one material is bulk). A method for in-situ modification of twist angles would provide valuable insights into the nature of the interlayer interactions in 2D heterostructures.

SUMMARY

Exciton recombination is integral to the science and application of 2D materials, especially in optics and optoelectronics. Application of energy to the 2D materials herein can provide oxygen-induced switching between "non-radiative" and "radiative" exciton recombination in a family of 2D heterostructures: $Bi_2Se_3$ grown on arbitrary monolayer transition metal dichalcogenides (TMDs). The signature photoluminescence (PL) peaks of TMDs, which are quenched in all as-grown heterostructures, appear distinctly when they are annealed in air ($O_2$) and re-quench when thermally annealed in $N_2$ or Ar (FIG. 21E). The diffusive intercalation and de-intercalation of $O_2$ molecules is believed to be the mechanism for the observed switching. DFT calculations predict an increase of ~17% in the interlayer separation, disrupting the interlayer interaction and inducing the layers to behave as electronically independent. This switching can also be accomplished locally, controllably, and reversibly using a low-power focused laser, while changing the environment from pure nitrogen to air. This allows for site-programmable 2D light-emitting pixels whose emission intensity could be precisely varied by a factor exceeding 200×, with a wide range of emission energy values in the visible (1.5 eV<$E_{ph}$<2 eV). Results show that these atomically-thin layers may be used for oxygen sensing and standard temperature-pressure high-density oxygen storage.

TMDs are well known for having a bright photoluminescence, where each TMD photoluminesces with a different color. However, when one layer of bismuth selenide ($Bi_2Se_3$) is grown on the monolayer TMD using chemical vapor deposition (CVD), the bright photoluminescence is over 99% quenched. The photoluminescence is quenched because the interaction of the materials (i.e. the interlayer interaction) disrupts the direct electron-hole recombination path in the TMD and creates an indirect electron-hole recombination path. The photoluminescence intensity can be controllably and tunably recovered at small (~3%) intervals by applying heat in an oxygen-present environment. Various controls over the photoluminescence can provide 0-100% unsuppressed photoluminescence. The photoluminescence intensity can be utilized for ultra-high density storage of information because the photoluminescence intensity provides for byte (and higher) storage in a small area.

This photoluminescence recovery process disrupts the $Bi_2Se_3$, breaking it into smaller grains, where the grain boundaries facilitate the intercalation of oxygen between the layers. As the oxygen intercalates, it disrupts the interlayer interaction, inducing each material to behave independently. Once the TMD is in an environment that is effectively free standing, it restores the original direct electron-hole recombination path, and the material begins to photoluminesce again. The oxygen can also be de-intercalated from the interlayer region by applying heat to the material in an oxygen-poor or oxygen-free environment. As the oxygen is removed, the interlayer interaction and bonding begin to reform, disrupting the direct electron-hole recombination path, and inducing an indirect electron-hole recombination path.

Accordingly, the present technology is also applicable to optics and optoelectronics and provides a novel oxygen-induced switching between "non-radiative" and "radiative" exciton recombination in a family of 2D heterostructures having $Bi_2Se_3$ grown on arbitrary monolayer transition metal dichalcogenides (TMDs). The signature photoluminescence (PL) peaks of TMDs, which are quenched in all as-grown heterostructures, appear distinctly when they are annealed in air, and re-quench when thermally annealed in $N_2$ or Ar. This switching can also be accomplished locally, controllably, and reversibly using a low-power focused laser, while changing the environment from pure nitrogen to air. This allows for site-programmable 2D optical "Write-Read-Erase" devices and light-emitting pixels whose emission intensity could be precisely varied by a factor exceeding 200×, with a wide range of emission energy values in the visible (1.5 eV<$E_{ph}$<2 eV).

The intensity of the photoluminescence can be controlled as a function of chemical composition, laser power, and oxygen concentration. The photoluminescence intensity can then be controllably decreased by applying heat or energy in an oxygen-absent environment. Additionally, photoluminescence and color can be modified using a focused electron beam applied in a vacuum. Treating the material with a focused electron beam induces a new photoluminescence independent of and distinct from the oxygen-inducing photoluminescence. This effect also induces a color change and can be accomplished with submicron resolution. These modifications are also site-selectable with submicron precision. The material has memory of these heat, laser, and electron beam induced changes, resulting in long-term permanence under ambient conditions. Control over the photoluminescence has high spatial resolution and site-selectability, with precise control of the photoluminescence intensity using controlled heating in an oxygen environment.

The use of a focused electron beam in a vacuum can affect changes with submicron precision. This affords information storage applications similar to the oxygen-induced method above. Thus, the electron beam method is applicable for parts verifications and authentification. The material has negligible weight, mass, and size, and is difficult to detect if its location is not known a priori.

The 2D materials have been demonstrated to function as an oxygen sensor, a calorimeter, and an ultra-high-density information storage device. The photoluminescence color is dependent on the material, demonstrating a wide range of photoluminescence colors (1.5 eV to 2.0 eV). The effect has been demonstrated on alloys, and is applicable using nearly any color within the 1.5 eV-2.0 eV spectrum. The present technology enables new devices that require near-zero mass or thickness. In one example, it is only 8 atoms (2 nm) thick (z-direction) but can be arbitrarily large in the x-y directions.

The present technology provides a 2D oxygen sensor. The material reacts with large changes in luminescence that are easily detectable and require only very low power levels to induce. The thickness of the material enables it to be placed with near-zero intrusiveness to the system.

Because of the precise tunability of photoluminescence intensity and small size of the material, light-emitting pixels (PLPs) with effective volumes of ~$10^{-21}$ m$^3$ are possible. This allows information storage at high-density levels. Additionally, families of materials can be fabricated, with each having a different photoluminescence color and energy, enabling them to be stacked to form complex devices capable of storing even higher information density.

Monolayer TMDs, a class of 2D materials, are well known for a bright photoluminescence, where each TMD photoluminesces with a different color. However, as discussed above, when one layer of bismuth selenide ($Bi_2Se_3$) is grown on the monolayer TMD using chemical vapor deposition (CVD), the bright photoluminescence is over 99% quenched. The photoluminescence is quenched because the interaction of the materials (i.e. the interlayer interaction) disrupts the direct electron-hole recombination path in the TMD and creates an indirect electron-hole recombination path.

Different TMA compositions can be combined with $Bi_2Se_3/MoS_2$, $Bi_2Se_3/MoSe_2$, $Bi_2Se_3WS_2$, $Bi_2Se_3/MoSe_{2-2x}S_{2x}$, or other compositions to provide unique results.

The technology is further summarized by the following list of features.

1. A method of making a 2D heterostructure, the method comprising:

growing a first crystalline layer comprising a material selected from the group consisting of $MoSe_2$, $MoS_2$, $WS_2$, $MoSe_{2-2x}S_{2x}$, and combinations thereof in an inert atmosphere;

growing a second crystalline layer comprising or consisting of $Bi_2Se_3$ in an inert atmosphere, the second crystalline layer in contact with the first crystalline layer at an interlayer region, the second crystalline layer operative to suppress photoluminescence of the first crystalline layer; and adding oxygen to the interlayer region at selected positions, wherein the addition of oxygen reverses the suppression of photoluminescence at said positions in proportion to the amount of oxygen added.

2. The method of aspect 1, wherein adding oxygen to the interlayer region comprises exposing said selected positions of the second crystalline layer to a beam of electromagnetic radiation or particles in an oxygen-controlled atmosphere comprising oxygen, such that oxygen enters the interlayer region at said selected positions.

3. The method of aspect 2, wherein the oxygen-enriched positions exhibit unsuppressed photoluminescence which is proportional to the amount of oxygen intercalated in the interlayer region at each position, and wherein outside said selected positions the 2D heterostructure exhibits suppressed photoluminescence.

4. The method of aspect 2, comprising exposing the selected positions to light having a wavelength of about 200 nm to about 1100 nm, the light focused onto a spot size less than 10 μm in diameter and having an intensity of about 100 nW/μm² to 1 mW/μm².

5. The method of aspect 4, wherein the light has a wavelength of about 488 nm, spot size less than 1 μm in diameter, and an intensity of about 76 μW/μm² intensity.

6. The method of aspect 2, wherein the amount of oxygen that enters the interlayer region is proportional to the intensity and duration of the electromagnetic radiation or particles, the temperature, and the partial pressure of oxygen in the atmosphere.

7. The method of any of the preceding aspects, wherein the first crystalline layer is grown on a substrate.

8. The method of aspect 7, wherein the substrate comprises $SiO_2$ or Si.

9. The method of any of the preceding aspects, wherein the second crystalline layer is grown on the first crystalline layer or the first crystalline layer is grown on the second crystalline layer.

10. The method of any of the preceding aspects, wherein the first and second crystalline layers are grown by a process comprising chemical vapor deposition.

11. The method of any of the preceding aspects, wherein said inert atmosphere comprises helium, radon, neon, argon, xenon, nitrogen, or a combination thereof.

12. The method of any of the preceding aspects, wherein growing the first crystalline layer comprises placing $MoO_2$ or $WO_2$ into a furnace with sulfur, selenium, or a combination thereof.

13. The method of any of the preceding aspects, wherein the first crystalline layer is grown at a temperature from about 100 to about 1200° C.

14. The method of any of the preceding aspects, wherein growing the second crystalline layer comprises placing $Bi_2Se_3$ into a furnace with the first crystalline layer.

15. The method of any of the preceding aspects, wherein the first crystalline layer is grown to an average thickness of about 1 nm and the second crystalline layer is grown to an average thickness in the range of about 1 nm to about 20 nm.

16. The method of aspect 15, wherein the thickness of the 2D heterostructure is increased by about 0.15 nm to about 0.50 nm at said selected oxygen-enriched positions.

17. The method of any of the preceding aspects, further comprising, after adding oxygen, annealing the 2D heterostructure at a temperature from about 150° C. to about 350° C. for about 3 hours in an inert atmosphere, wherein the annealing removes a portion of the oxygen from the selected positions.

18. The method of aspect 2, wherein said exposure to the beam of electromagnetic radiation or particles changes the wavelength of the unsuppressed photoluminescence at said selected positions wherein oxygen enters the interlayer region.

19. A 2D heterostructure comprising:
a first layer comprising a material selected from the group consisting of $MoSe_2$, $MoS_2$, $WS_2$, $MoSe_{2-2x}S_{2x}$, and combinations thereof;
a second layer deposited on the first layer, wherein the second layer comprises one or more atomic layers of $Bi_2Se_3$;
an interlayer region between the first layer and the second layer, the interlayer region comprising oxygen at selected positions within the interlayer region.

20. The 2D heterostructure of aspect 19, wherein the oxygen-containing positions exhibit unsuppressed photoluminescence which is proportional to the amount of oxygen intercalated in the interlayer region at each position, and wherein outside said selected positions the 2D heterostructure exhibits suppressed photoluminescence.

21. The 2D heterostructure of aspect 19 or 20, wherein an average thickness of the heterostructure is between about 2 nm and 20 nm.

22. The 2D heterostructure of aspect 21, wherein the average thickness is from about 2 nm to about 6 nm.

23. The 2D heterostructure of any of aspects 19-22, wherein the positions comprising intercalated oxygen have thickness increased by about 0.15 nm to about 0.50 nm compared to positions lacking intercalated oxygen.

24. The 2D heterostructure of any of aspects 19-23, wherein the first layer has an average thickness of about 1 nm, and the second layer has an average thickness of about 1 nm to about 5 nm.

25. The 2D heterostructure of any one of aspects 19-24 comprising positions that exhibit photoluminescence and positions that exhibit photoluminescence suppressed relative to the positions that exhibit photoluminescence.

26. The 2D heterostructure of aspect 25, wherein the suppressed photoluminescence is suppressed by at least 99% relative to the unsuppressed photoluminescence.

27. The 2D heterostructure of aspect 25 or 26, wherein the positions that exhibit photoluminescence and/or the positions that exhibit suppressed photoluminescence form a pattern that encode information or represents an image.

28. The 2D heterostructure of any of aspects 19-27, wherein information is encoded at selected positions in the 2D heterostructure as bits.

29. The 2D heterostructure of any of aspects 25-28, wherein the second layer comprises grain boundaries that allow oxygen to diffuse into or out of the interlayer region.

30. The 2D heterostructure of any of aspects 25-29, wherein the photoluminescence at different positions is proportional to the amount of interlayer oxygen at those positions.

31. The 2D heterostructure of any one of aspects 19-30 comprising a photoluminescence pattern formed by adding interlayer oxygen at selected positions of the 2D heterostructure.

32. A 2D heterostructure made by a method comprising the method of any of aspects 1-18

33. An information storage device comprising a 2D heterostructure of any of aspects 19-32.

34. The information storage device of aspect 33, further comprising a source of electromagnetic radiation or particles configured to irradiate selected positions of the 2D heterostructure with said radiation or particles and thereby creating or modulating photoluminescence of the 2D heterostructure according to a 2D pattern.

35. The information storage device of aspect 34, further comprising a source of light operative for inducing photoluminescence at selected positions of the 2D heterostructure and a detector operative for detecting photoluminescence at said selected positions.

36. The information storage device of aspect 34 or 35 operative for annealing the 2D heterostructure to restore suppression of photoluminescence at selected positions of the 2D heterostructure.

37. An image display device comprising the 2D heterostructure of any of aspects 19-32 or the information storage device of any of aspects 33-36.

38. An oxygen storage device comprising the 2D heterostructure of any of aspects 19-32.

39. An oxygen sensing device comprising the 2D heterostructure of any of aspects 19-32.

40. A method of storing information on a 2D heterostructure, the method comprising:
(a) providing the 2D heterostructure of any of aspects 19-32;
(b) exposing selected positions of the first crystalline layer of the heterostructure to a beam of electromagnetic radiation or particles in an oxygen controlled atmosphere, whereby photoluminescence of said positions is modified compared to photoluminescence of non-exposed positions.

41. A method of reading information from a 2D heterostructure, the method comprising:
(a) providing the 2D heterostructure of any of aspects 19-32 comprising selected positions having modified photoluminescence compared to other positions;
(b) measuring photoluminescence at said selected positions whereby information is obtained from position, intensity, and/or wavelength of the photoluminescence.

42. A method of modulating photoluminescence of the 2D heterostructure of any of aspects 19-32, the method comprising exposing the 2D heterostructure at selected positions to a beam of electromagnetic radiation or particles in an oxygen-free atmosphere, whereby said exposing causes diffusion of oxygen out of the interlayer region at said selected positions and photoluminescence is decreased at said selected positions.

BRIEF DESCRIPTION OF THE DRAWINGS

FIG. 5A shows the initial SAED image of a $Bi_2Se_3/WS_2$ 2D heterostructure before consecutive application of electron beam treatments (EBTs) to the $Bi_2Se_3/WS_2$ 2D heterostructure, demonstrating the structural rearrangement possibilities.

FIG. 5B shows the SAED image of the same material imaged in FIG. 5A, after two consecutive EBTs (60% followed by 20%), where one spot has vanished and one spot is noticeably more intense (see corresponding panel).

FIG. 5C shows the SAED image of the same material (FIGS. 5A-5B) after applying a third EBT (60%), which disrupted the structure, inducing a spot to split into two.

FIG. 5D shows the SAED image of the same material (FIGS. 5A-5C) after applying three additional EBTs (20%, 10%, and 20%), which annealed the heterostructure.

FIG. 5E compares the variation of the $Bi_2Se_3$ spot intensity from FIGS. 5A-5D (i.e. the photon counts) values relative to the corresponding $WS_2$ spot.

Representative simulation and distribution from randomly placing 216 points into 151 bins is shown.

Figure 3:
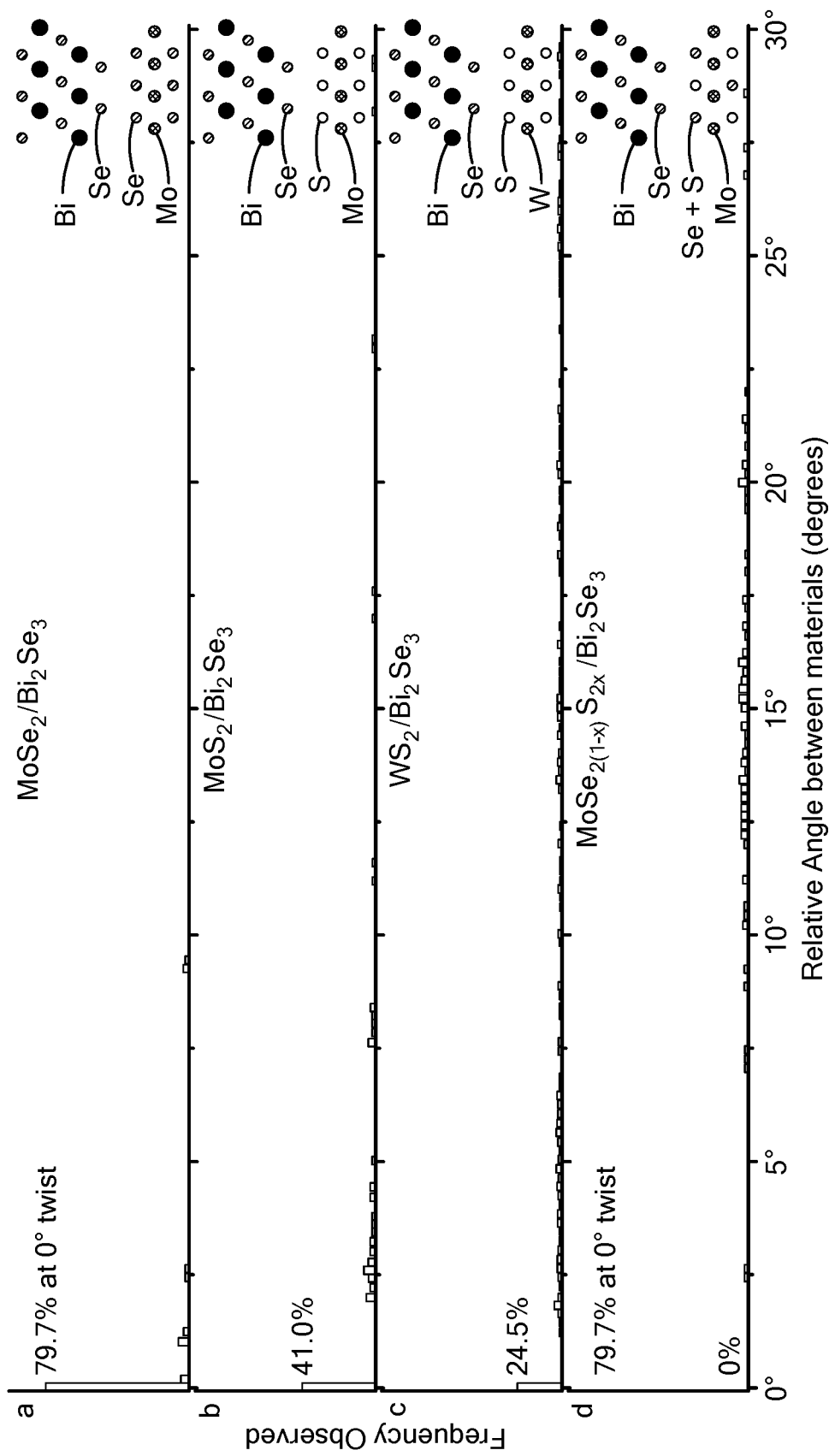
FIG. 3 shows comparisons of the measured twist angle distributions for $MoSe_2/Bi_2Se_3$ (top histogram), $MoS_2/Bi_2Se_3$ (second from top histogram), $WS_2/Bi_2Se_3$ (third histogram), and $MoSe_{2(1-x)}S_{2x}$ (bottom histogram) heterostructures, respectively.
Figure 11A:
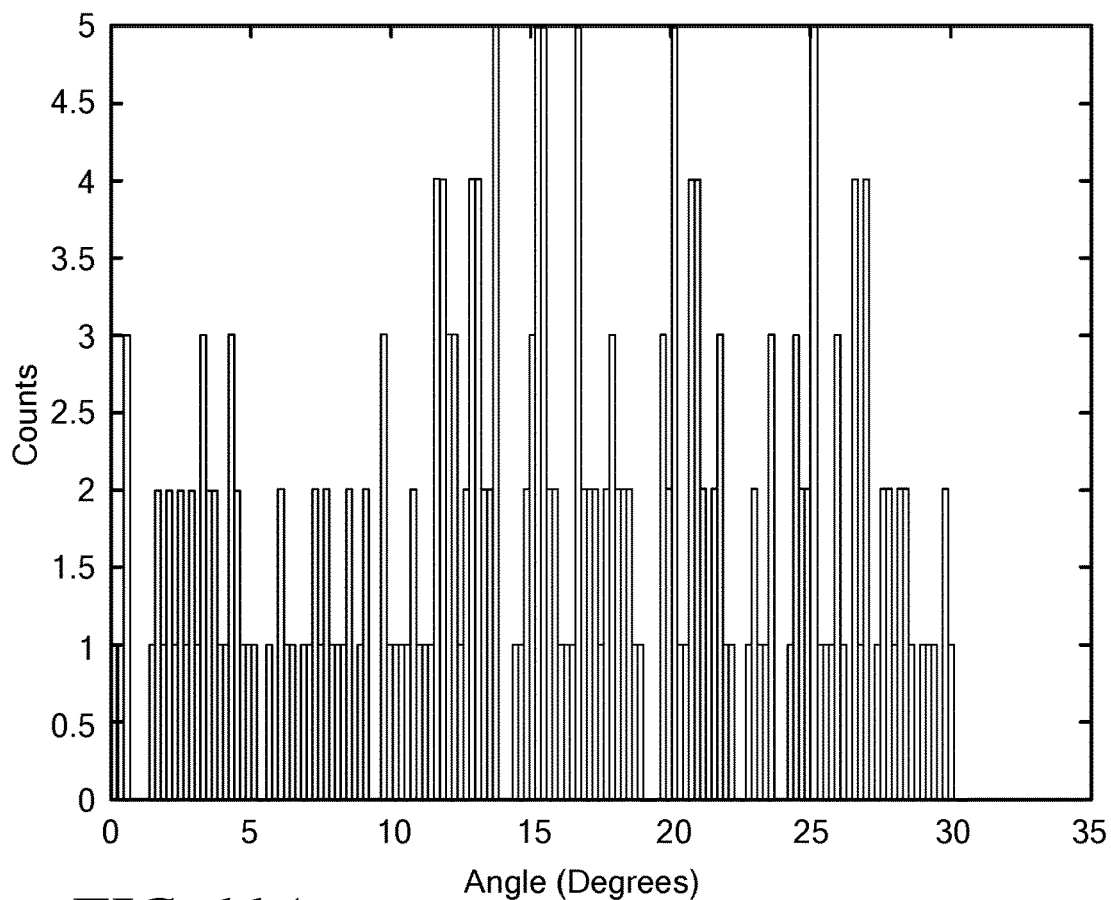
FIG. 11A shows Monte Carlo simulation data to find the instance noise floor for the growth data shown in FIG. 3.
Figure 11B:
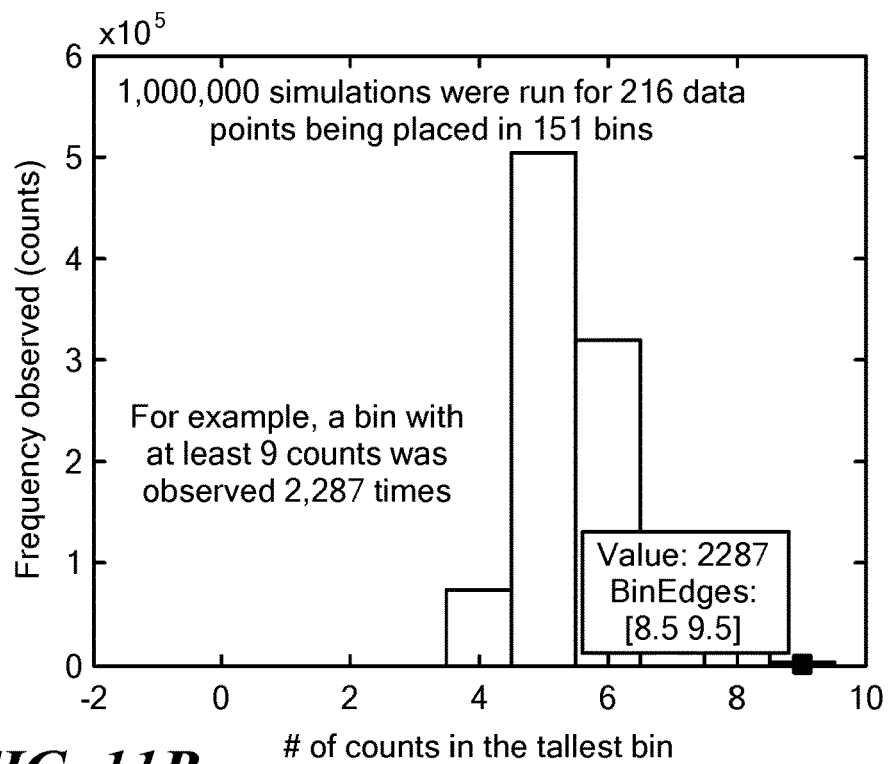

FIG. 11B shows Monte Carlo simulation data to find the instance noise floor for the growth data shown in FIG. 3. One million simulations like that shown in FIG. 11A were run, and the simulation's tallest bin versus frequency are shown.

FIG. 11C shows a table of the values used for running Monte Carlo simulations, as well as calculating the noise floor for each material illustrated in FIG. 3.

FIG. 12 shows a table of data from the Monte Carlo simulations used to calculate the instance noise floor in FIG. 3.

Figure 13:
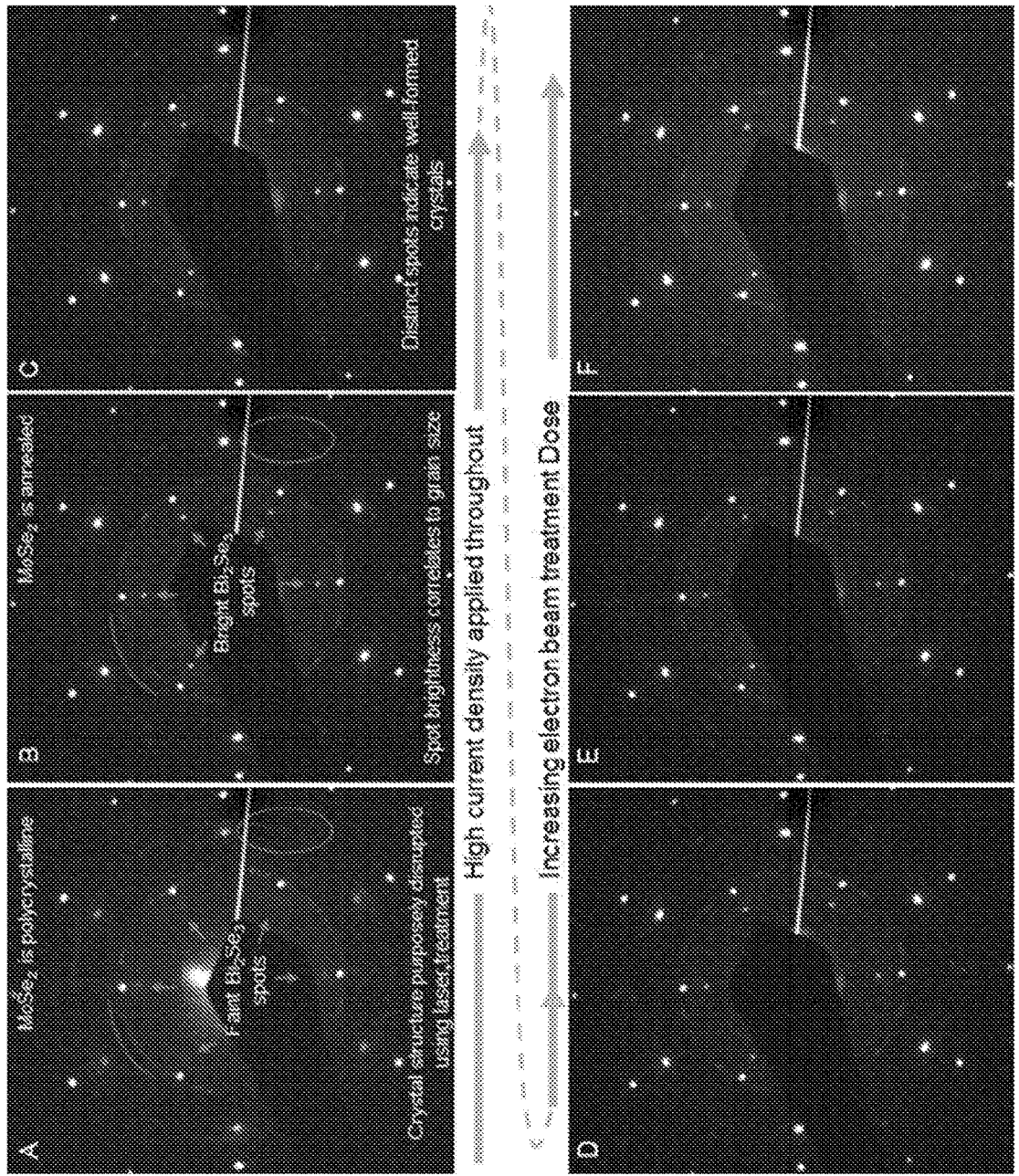

FIG. 13 shows in-situ crystal manipulation of $Bi_2Se_3$/$MoSe_2$ using an electron beam after transferring a $Bi_2Se_3$/$MoSe_2$ 2D heterostructure to a TEM grid and laser treating.

Figure 14:
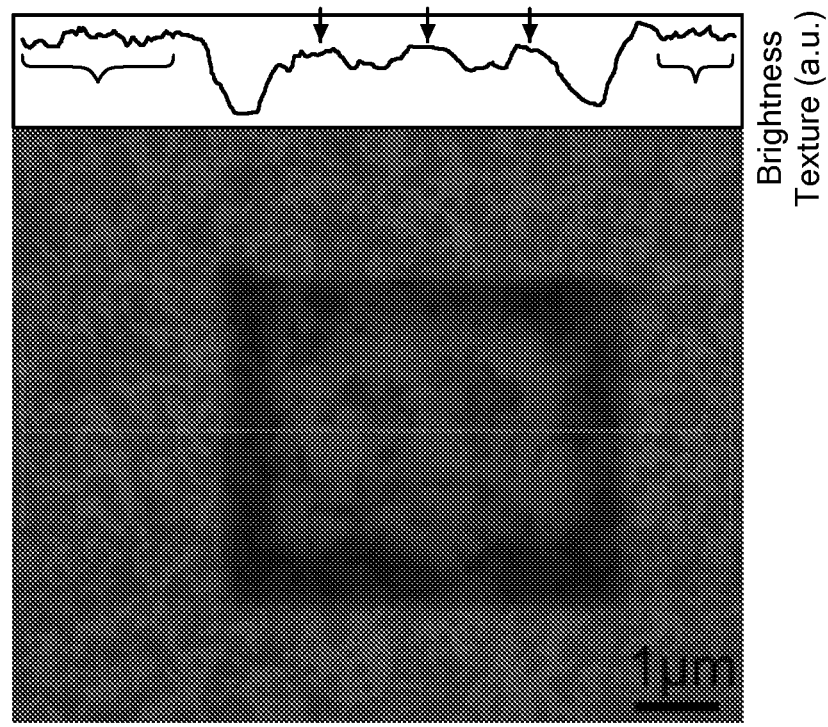

FIG. 14 shows texture and work function induced changes from electron beam treatment (EBT) on a $Bi_2Se_3$/$MoSe_2$ 2D heterostructure.

Figure 15:
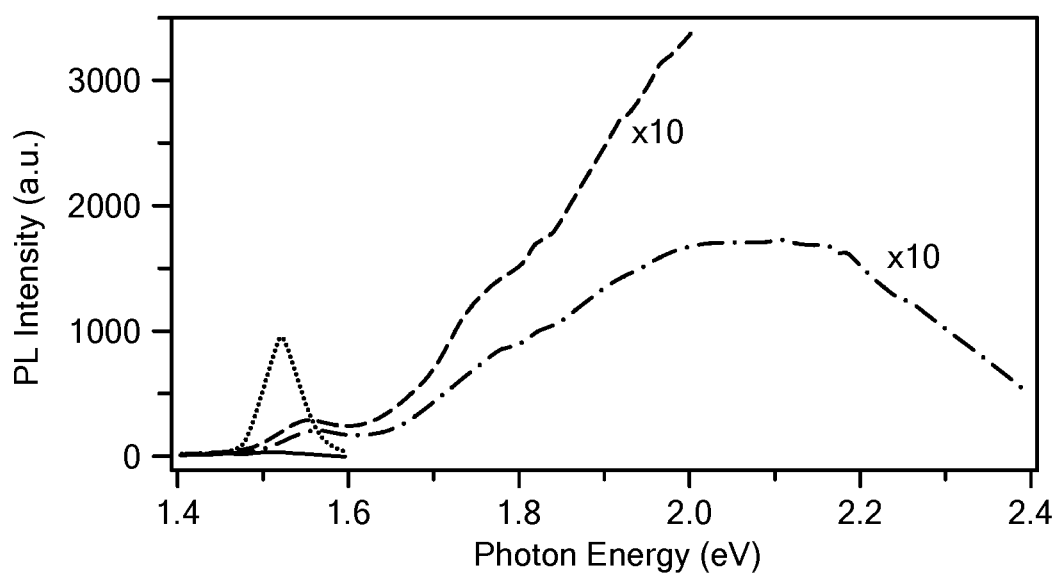

FIG. 15 shows photoluminescence (PL) spectra for $Bi_2Se_3$/$MoSe_2$ (flat, suppressed PL), one-layer $MoSe_2$ (PL intensity ~1000 a.u. with eV≤1.6), high-dose EBT $Bi_2Se_3$/$MoSe_2$ post laser-treatment (PL centered ~1.9-2.1 eV), high-dose EBT $Bi_2Se_3$/$MoSe_2$ (top trace, $Bi_2Se_3$).

Figure 16A:
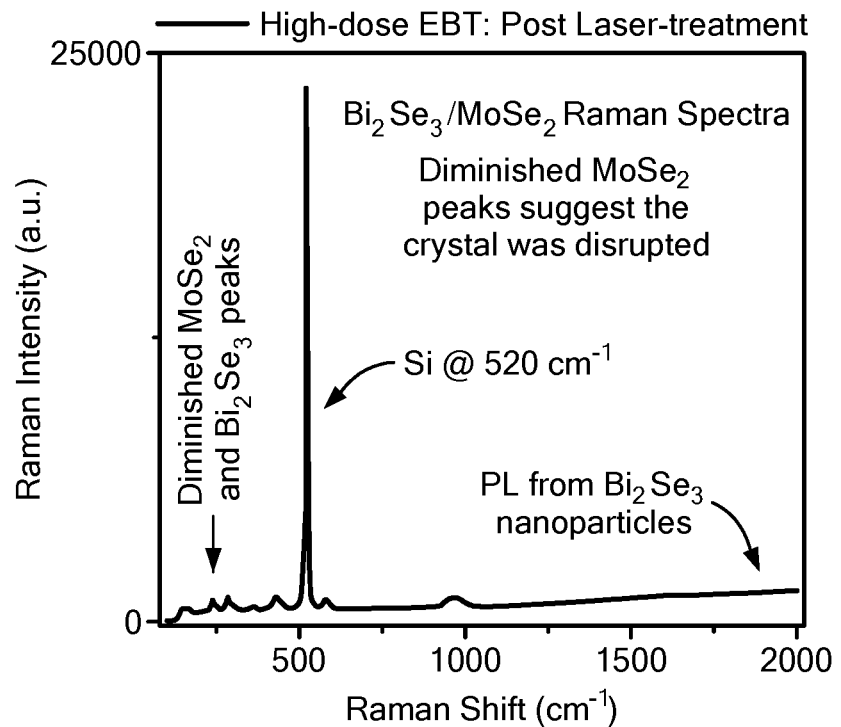

FIG. 16A shows a Raman spectrum of $Bi_2Se_3$/$MoSe_2$ post EBT.

Figure 16B:
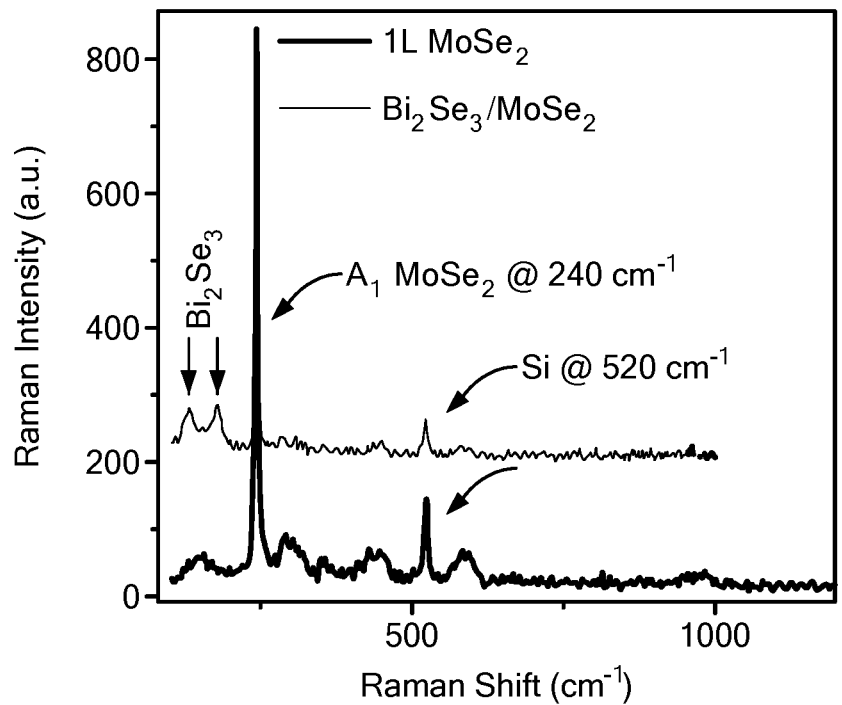

FIG. 16B shows a Raman spectrum of one layer of $MoSe_2$ (bottom spectrum) and 1-2 layers of $Bi_2Se_3$ grown on $MoSe_2$ (top spectrum).

Figure 17A:
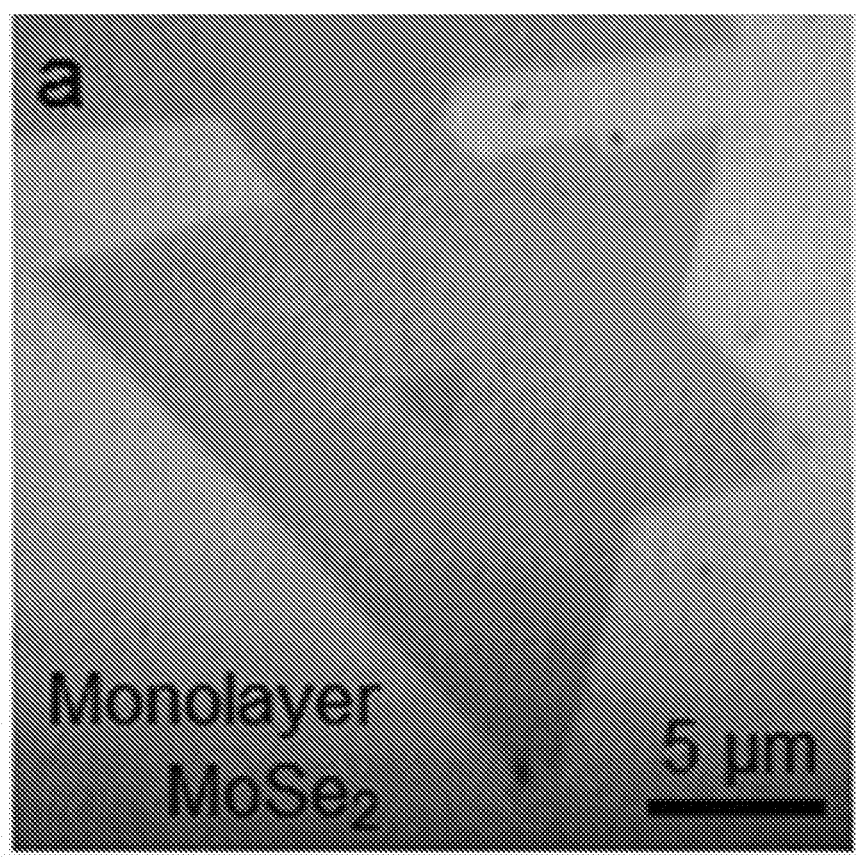

FIG. 17A shows an optical image monolayer $MoSe_2$.

Figure 17B:
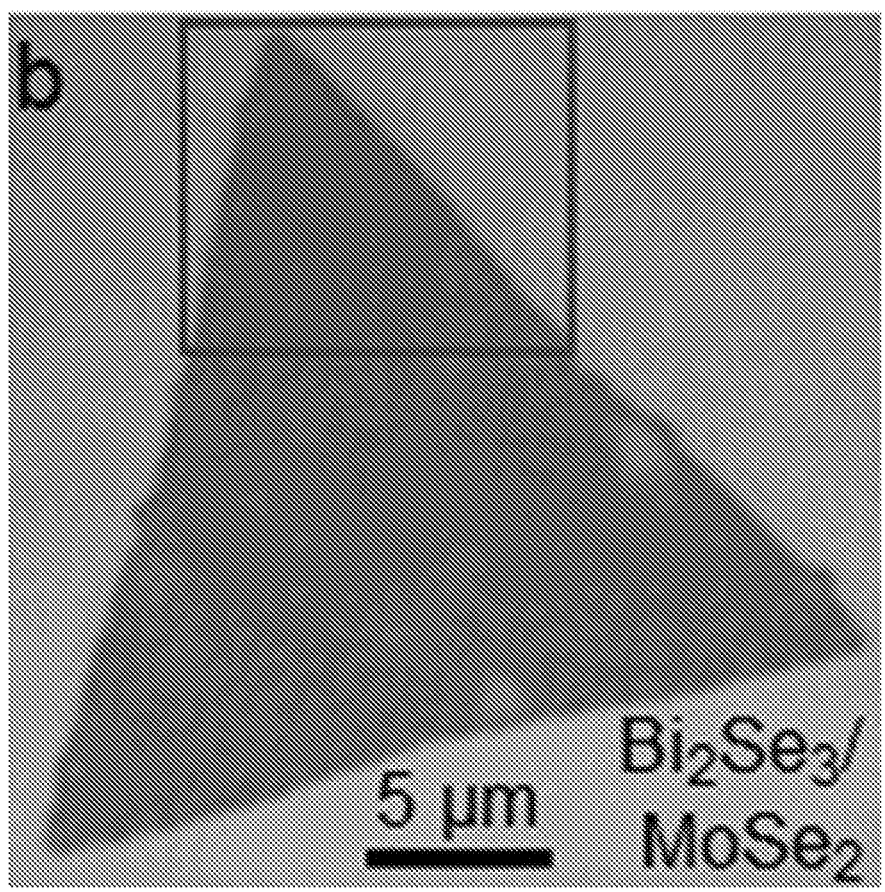

FIG. 17B shows an optical image a $Bi_2Se_3$/$MoSe_2$ heterostructure.

Figure 17C:
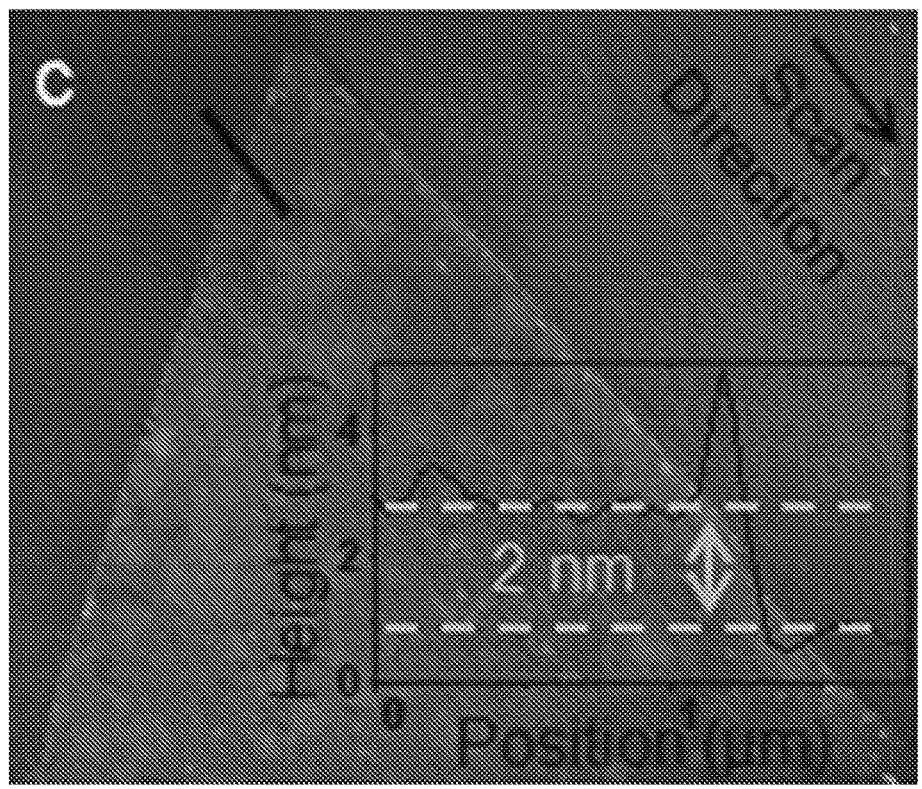

FIG. 17C shows an AFM image of the box area highlighted in FIG. 17B.

Figure 17D:
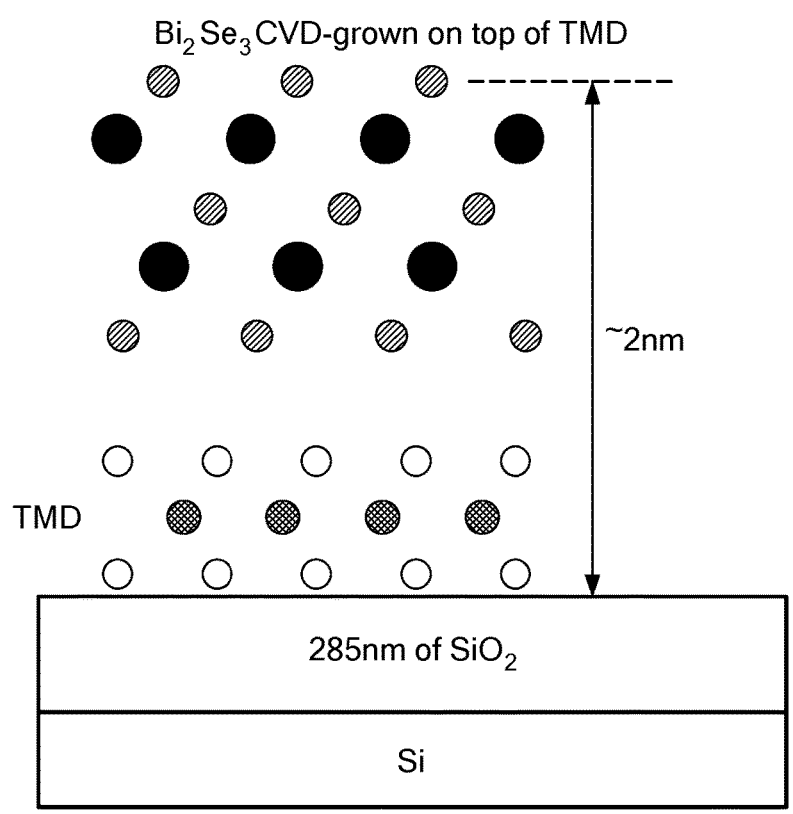

FIG. 17D shows a side-view diagram of a heterostructure on a substrate will scale illustrated.

Figure 17E:
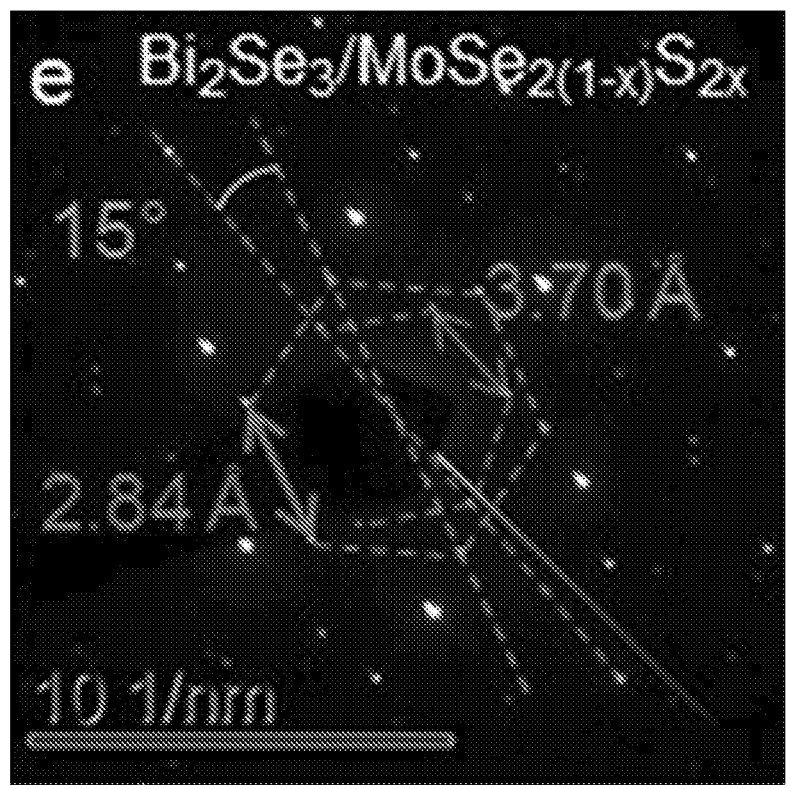

FIG. 17E shows a SAED pattern of a vertical heterostructure of $Bi_2Se_3$ layer grown on top of a TMD alloy layer, $MoSe_{2(1-x)}S_{2x}$, the distinct dots suggesting well-formed separate crystals.

Figure 17F:
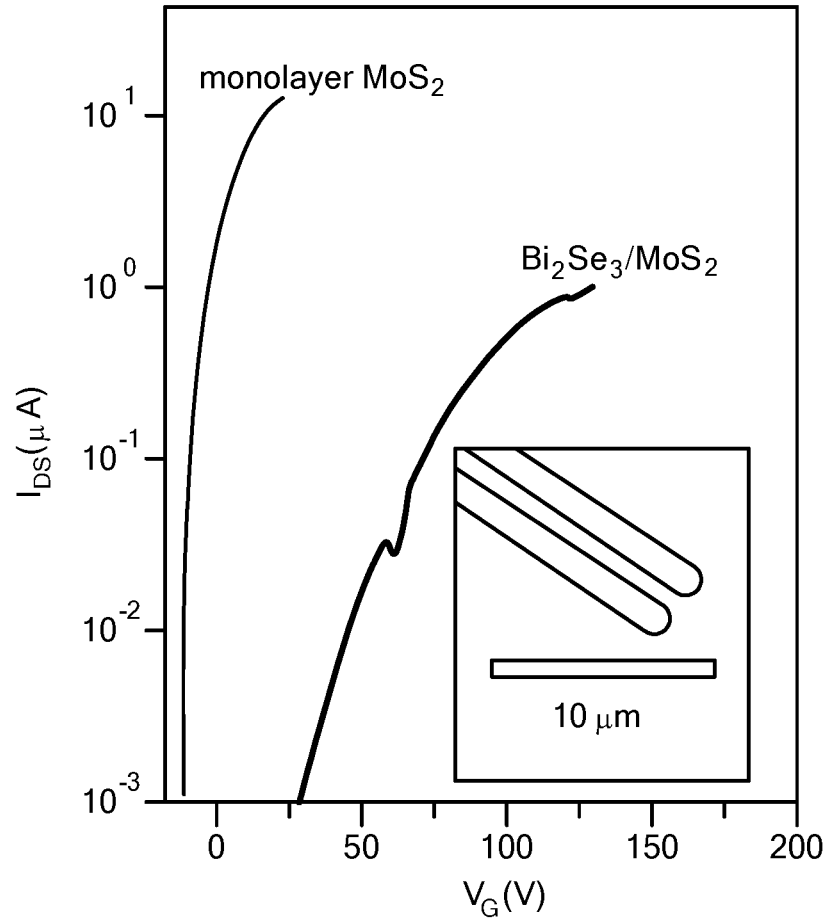

FIG. 17F shows typical drain current ($I_D$s) vs. gate voltage ($V_G$) in back-gated bare (monolayer) $MoS_2$ (top trace) and $Bi_2Se_3$/$MoS_2$ devices (bottom trace), respectively.

Figure 18A:
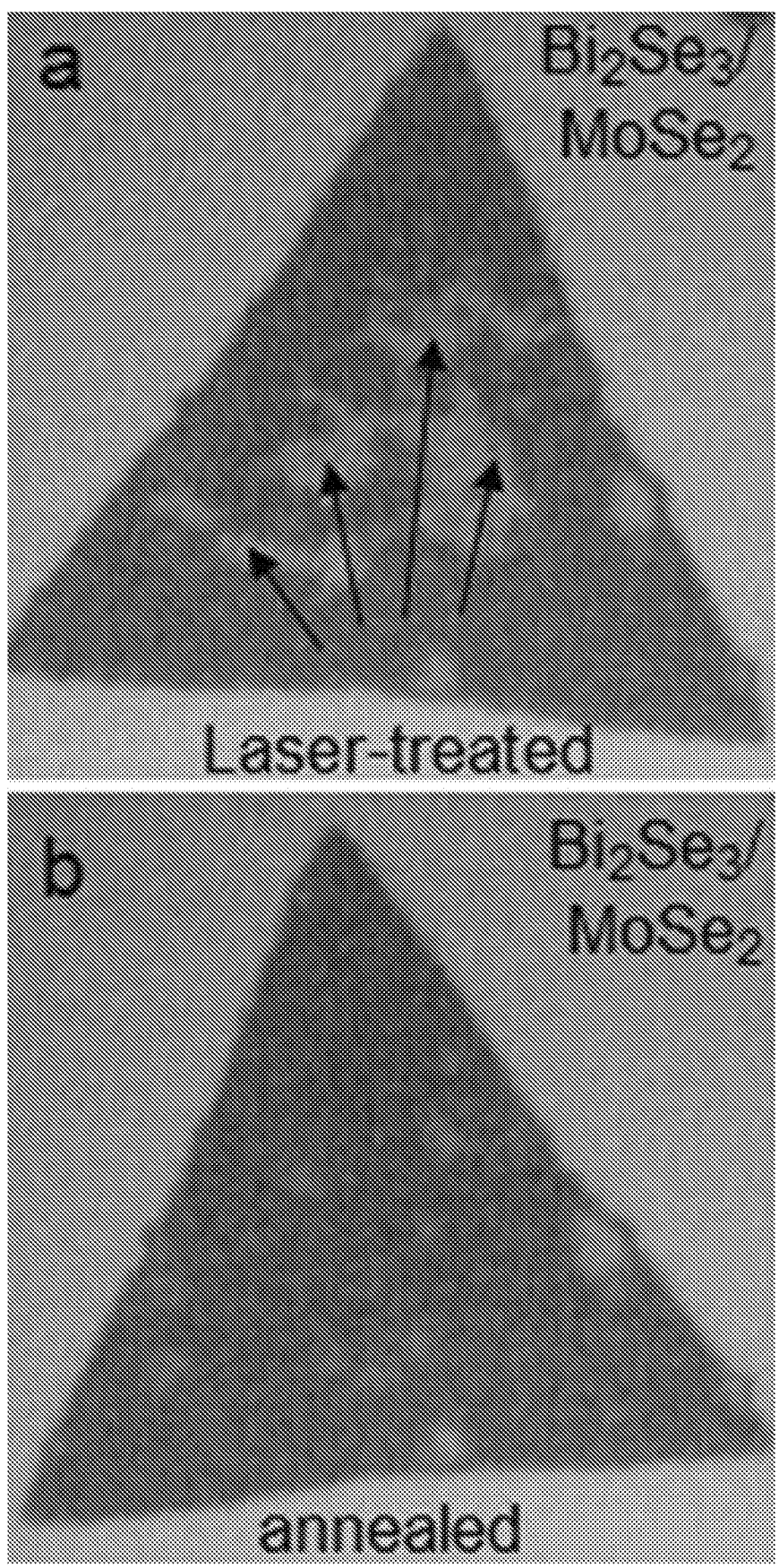

FIG. 18A shows optical images of the same $Bi_2Se_3$/$MoSe_2$ heterostructure from FIG. 17B after laser-treatment in air (top image) and after annealing in Ar (bottom image), respectively, showing a perceptible and reversible change in color.

Figure 18B:
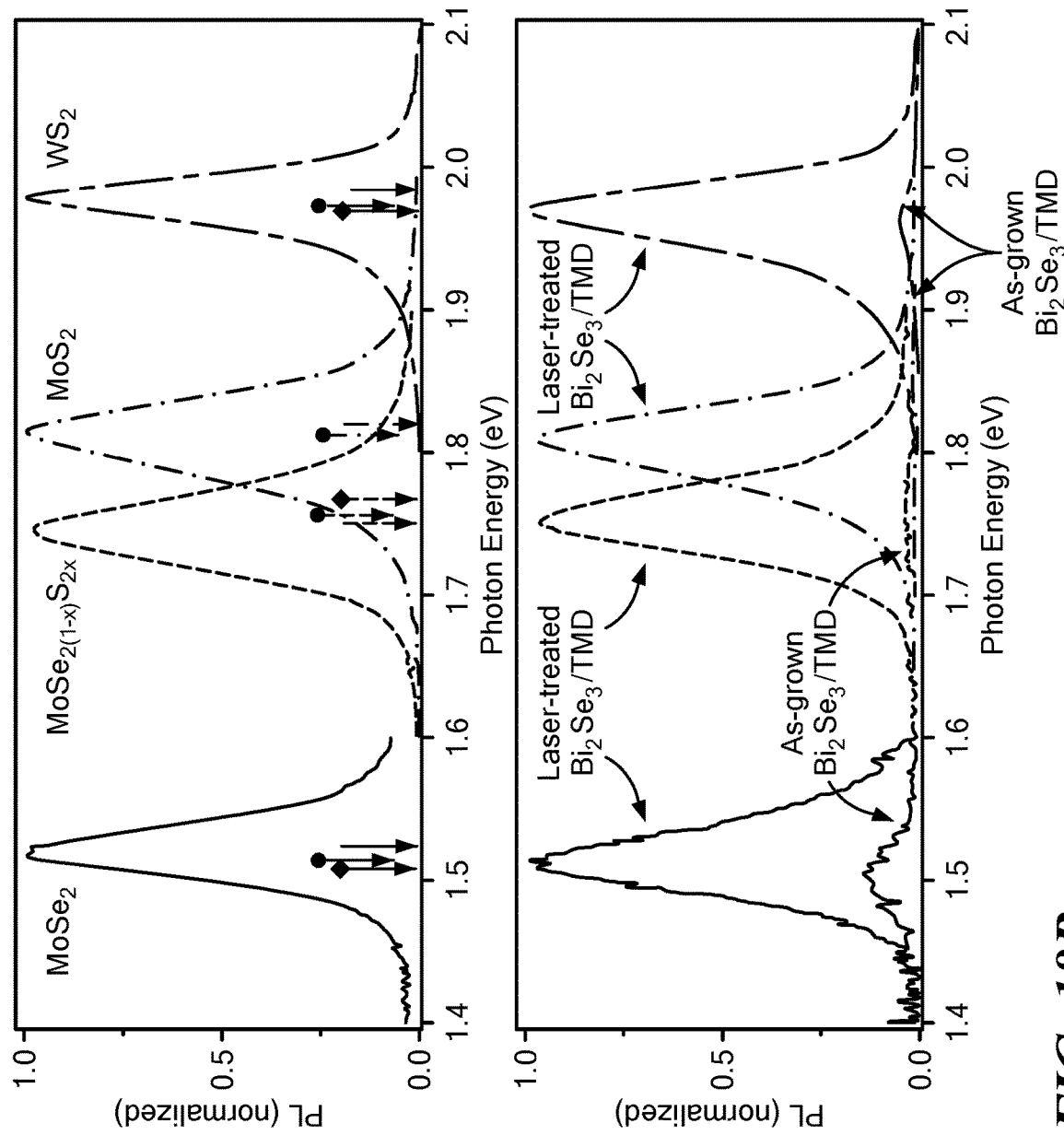

FIG. 18B shows the normalized photoluminescence (PL) spectra of four TMD samples grown on $SiO_2$ prior to growth of $Bi_2Se_3$ (top panel) and the normalized photoluminescence (PL) spectra of four TMD samples after growth of $Bi_2Se_3$ and after laser treatment of each $Bi_2Se_3$/TMD (bottom panel).

FIG. 19A shows an optical image of a $Bi_2Se_3$/$MoS_2$ heterostructure that has the letters "NEU" laser written (in air) on the central region of the $Bi_2Se_3$/$MoS_2$ heterostructure.

FIG. 19B shows a fluorescence microscope (excitation λ=488 nm) image of the same $Bi_2Se_3$/$MoS_2$ heterostructure shown in FIG. 19A; the fluorescence shows the letters "NEU".

FIG. 19C shows the correlation between laser exposure (in air) and the resulting PL intensity of a $Bi_2Se_3$/$MoS_2$ heterostructure using a calibrated recipe (50 μW, 6 s doses followed by 1 μW, 60 s for collecting data), demonstrating a controlled increase in radiation.

FIG. 20A shows a deconvolution of a typical photoluminescence (PL) peak into its two Lorentzian contributions—which represent the exciton and trion quasiparticles.

FIG. 20B shows relative variation of the radiative A-exciton population versus laser dose; during the experiment, the laser power had to be increased from 3.8 μW to 1430 μW to cover the large range (3 decades) of dosing within reasonable time.

FIG. 20C shows variation of the A exciton recombination energy under the same range of doses shown in FIG. 20B.

Figures 20D, 20E:
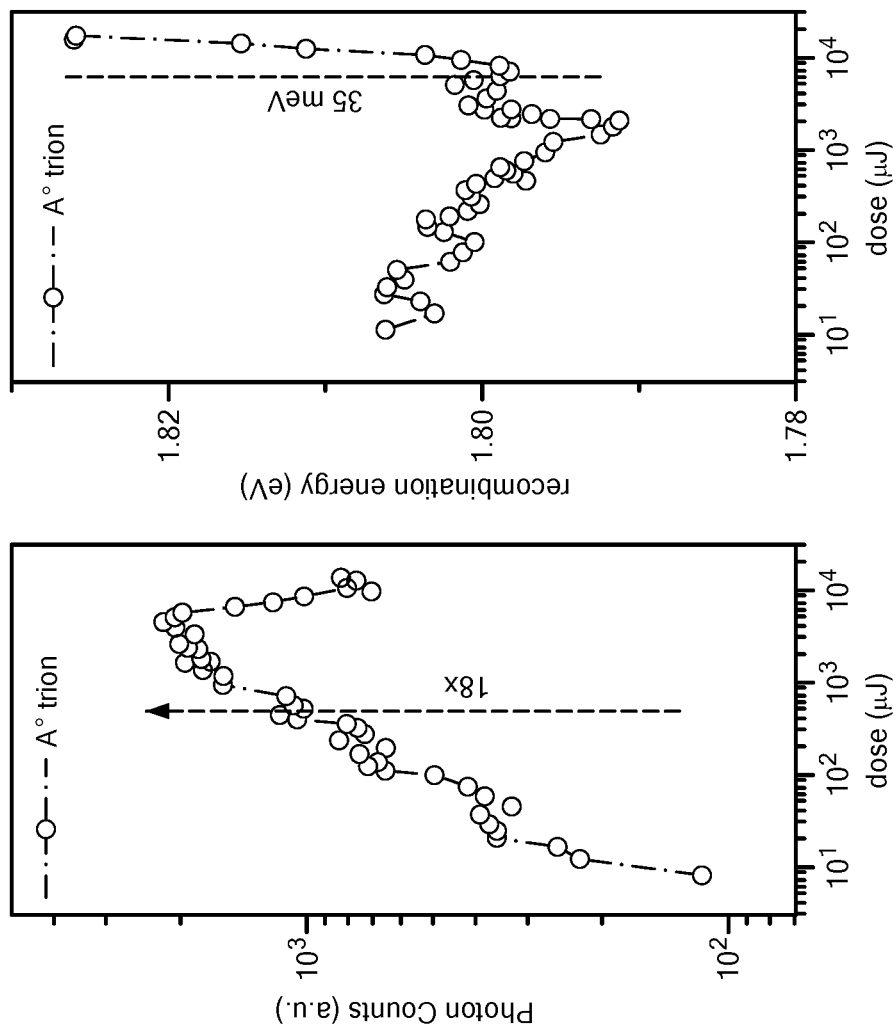

FIG. 20D shows relative variation of the radiative $A^-$-trion population versus laser dose.

FIG. 20E shows variation of the $A^-$-trion recombination energy under the same range of doses.

Figure 21A:
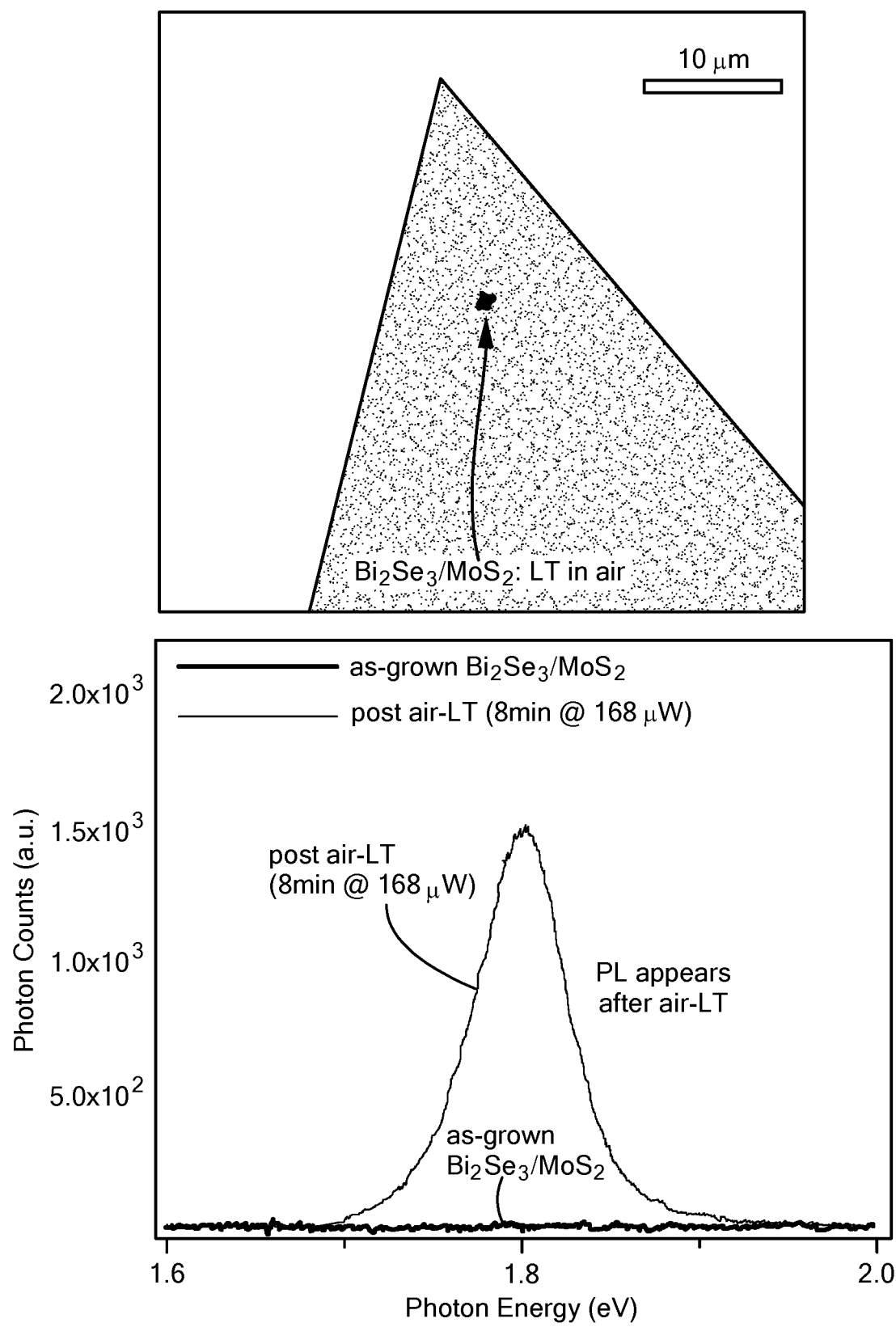

FIG. 21A shows an optical image of a $Bi_2Se_3$/$MoS_2$ heterostructure. The arrow indicates a spot whose color changed after being air-laser-treated (i.e. LT in air); below the optical image, the PL spectra from the same spot indicated by the arrow, before and after the air-laser-treatment, demonstrating the predicted behavior (i.e. PL recovery).

FIG. 21B shows the same sample shown in FIG. 21A, but a different location (indicated by arrow) was $N_2$-laser-treated by flooding the environment with $N_2$ gas flow and displacing the air. $N_2$-laser-treatment inhibits the color change observed in the spot shown in FIG. 21A. Below the optical image, the PL spectra from before and after $N_2$-laser-treatment, shows no perceivable appearance of PL after $N_2$-laser-treatment.

Figure 21C:
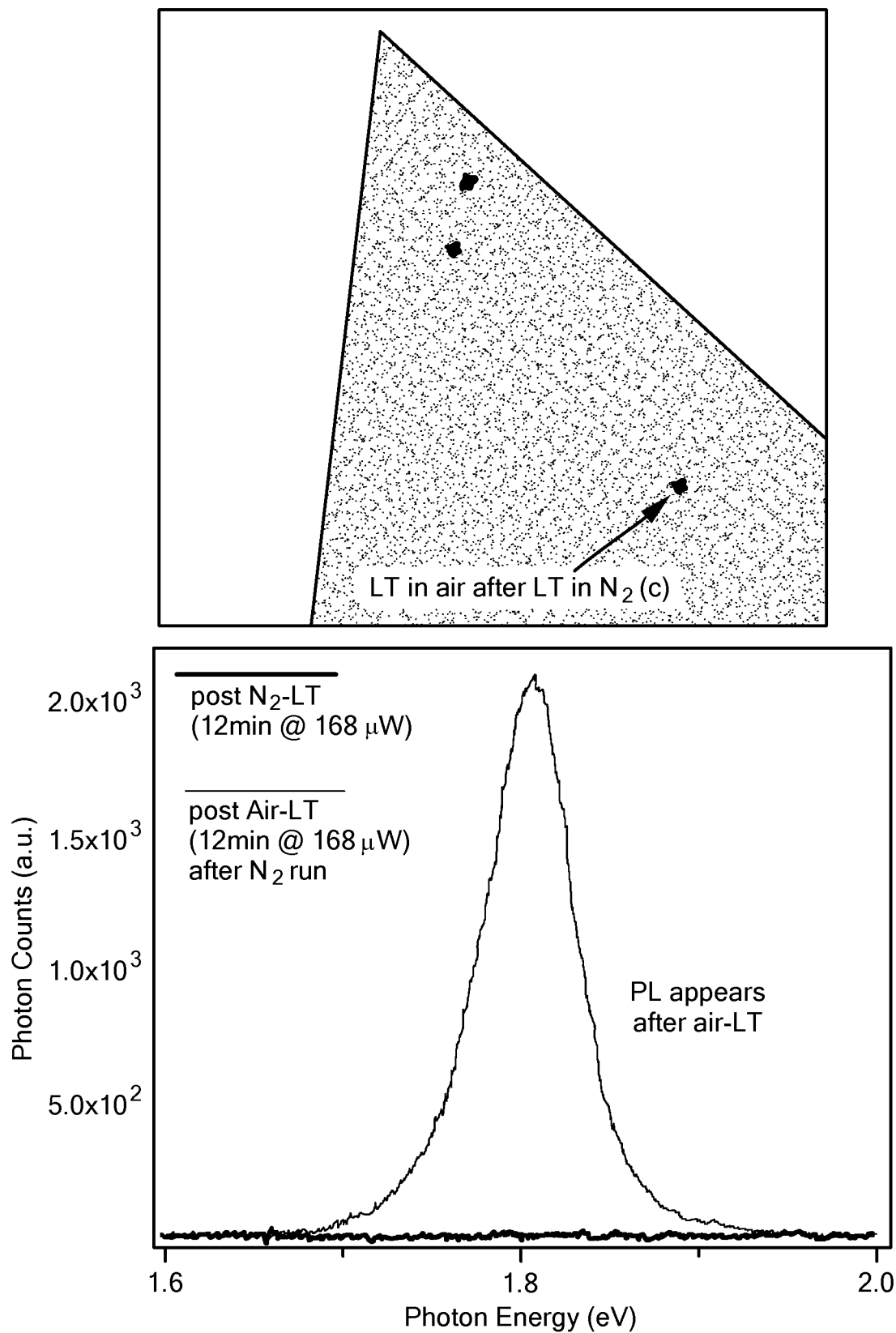

FIG. 21C shows the same spot highlighted by arrow in FIG. 21B was air-laser-treated. Color-change is perceivable, along with the appearance of the PL spectrum, shown below the optical image, demonstrating that extended $N_2$-laser-treatment had no obvious deleterious effect on the switching of the exciton recombination pathways.

Figure 21D:
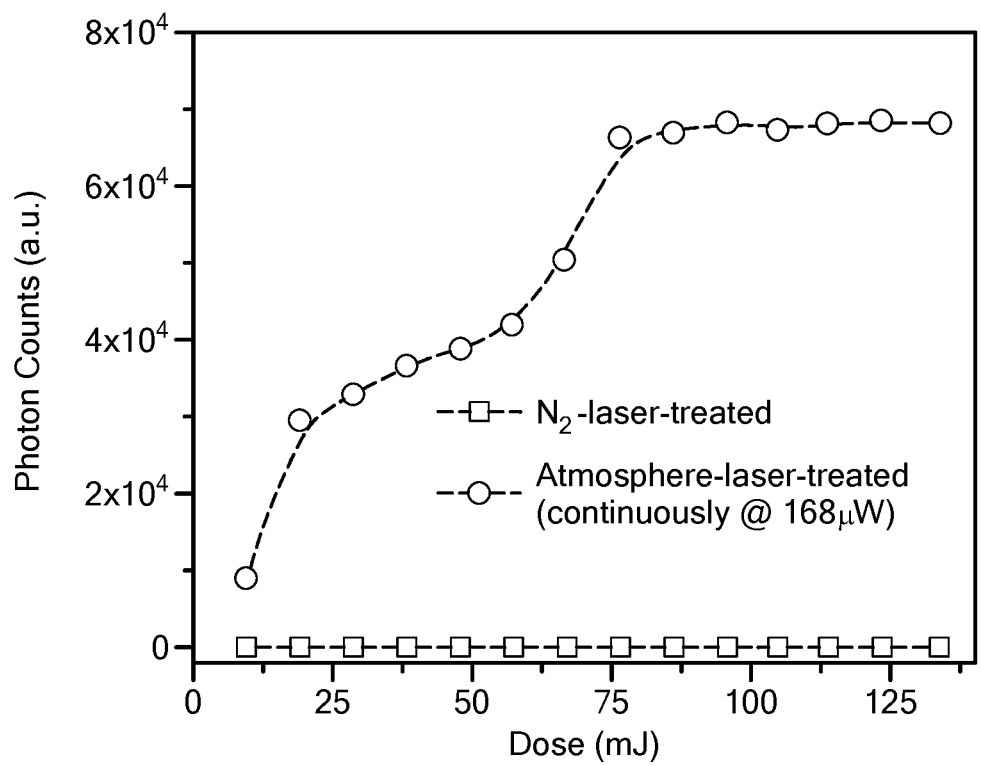

FIG. 21D shows a comparison of air-laser-treatment vs. $N_2$-laser-treatment using a high-power recipe. The PL intensity grew over an order of magnitude under air-laser-treatment, compared to the flat-growth under $N_2$-laser-treatment.

Figure 21E:
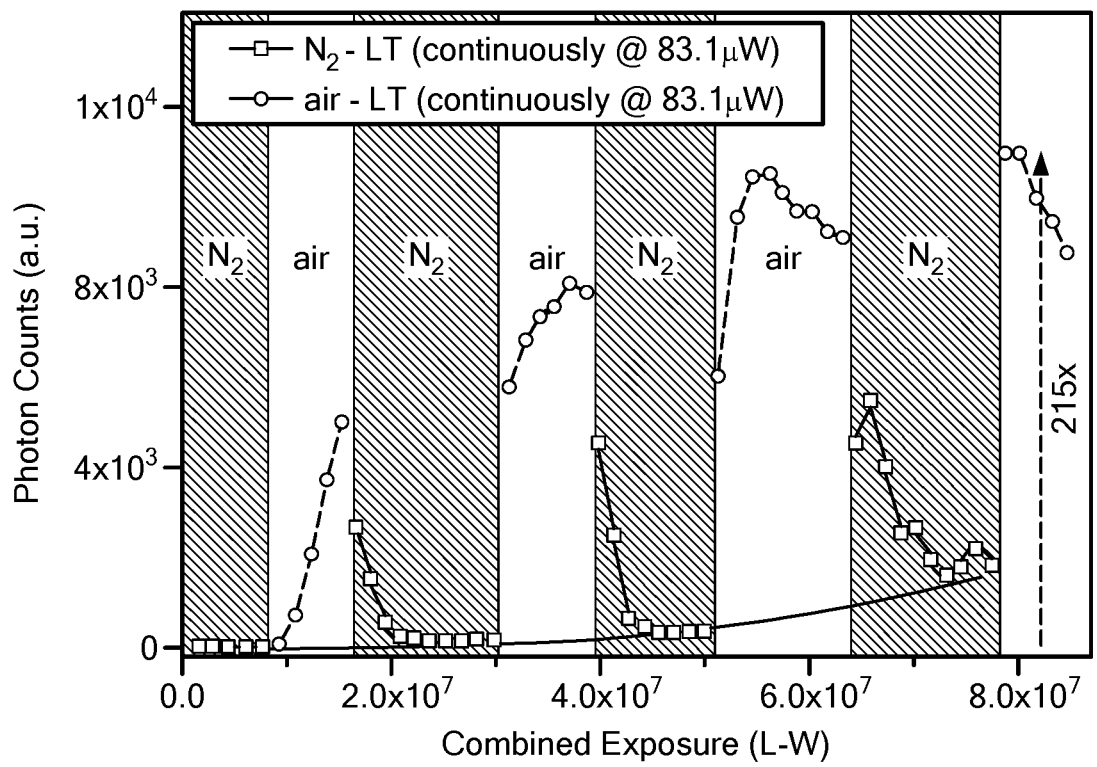

FIG. 21E shows variation of PL intensity under alternating air- and $N_2$-laser-treatments, showing that $N_2$-laser-treatment diminishes the PL intensity several decades.

Figure 22:
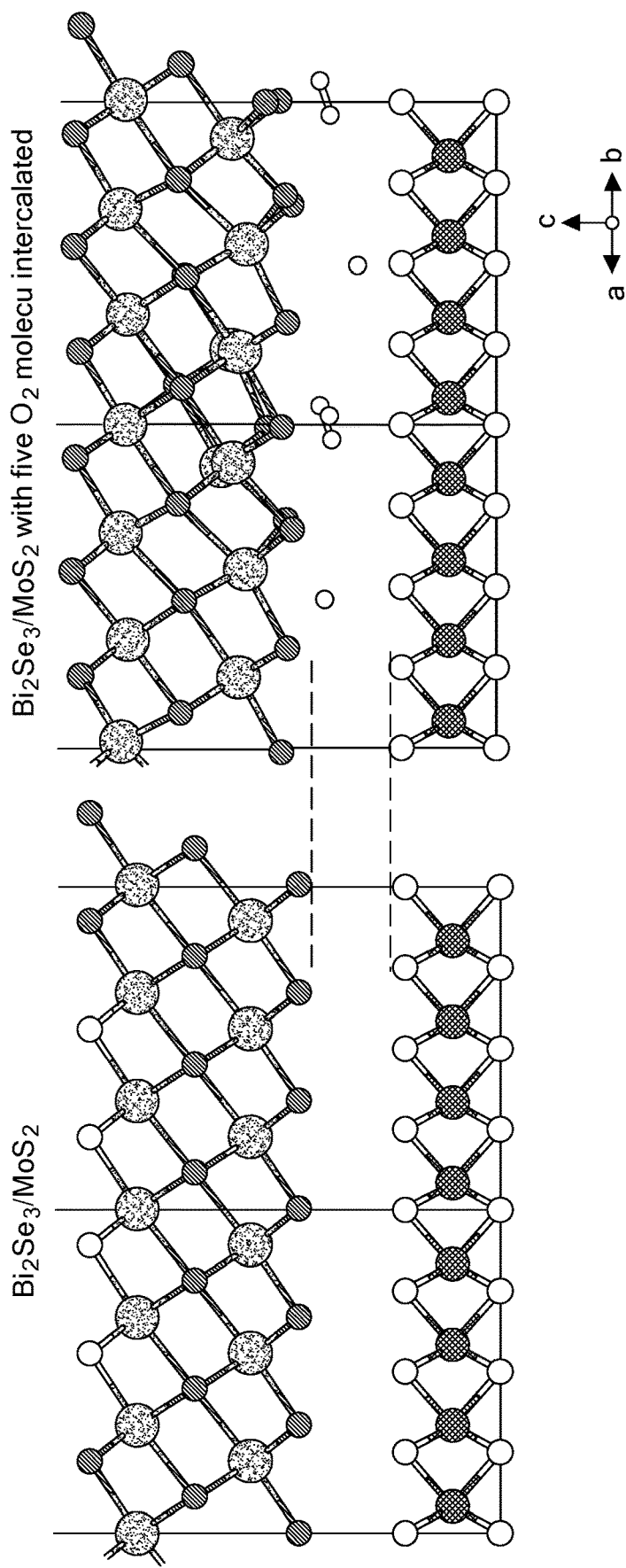

FIG. 22 shows DFT calculations of a rotationally aligned $Bi_2Se_3$/$MoS_2$ superlattice, with moderate interlayer bonding predicted. When $O_2$ molecules are placed in the interface between the layers, DFT calculations predict the average interlayer separation increases from 3.57 Å to 4.18 Å (17% increase), diminishing the interlayer interaction.

FIG. 23 shows DFT calculations showing the location of the $O_2$ (interlayer region).

DETAILED DESCRIPTION

The present technology provides materials containing a layer of $Bi_2Se_3$ deposited on a 2D material, such as a TMD (e.g., $MoSe_2$, $MoS_2$, and/or $WS_2$) or a TMD alloy ($MoSe_{2-2x}S_{2x}$).

The $Bi_2Se_3$ grows epitaxially at preferred angular distributions unique to each TMD. The interlayer interaction mediates the growth and influences the angular distribution into more stable configurations, allowing the relative influence of different parameters (e.g. chemistry, structure, moire patterns) to be inferred. The interlayer interaction stability is then probed using an electron beam, and it is shown that $Bi_2Se_3$/$MoSe_2$ is the most stable and $Bi_2Se_3$/$WS_2$ the least. The crystallographic changes in response to a TEM electron beam treatment (EBT) were observed in-situ using the select area electron diffraction (SAED) mode. Sufficiently high doses of EBT induce the interlayer bonds to break and the $Bi_2Se_3$ to form nanoparticles with a broad photoluminescence centered around 1.9 eV, demonstrating a novel technique that allows for submicron pattern writing using focused electron beams (FIG. 15, FIG. 19A). The interlayer stability was quantified by varying the EBT recipe parameters (i.e. current density, time interval, and accelerating voltage) and observing when the structure began to morph. Probing the Interlayer Interaction between Dissimilar 2D Heterostructures by In-Situ Manipulation of their Twist Angles A method is presented to study the interlayer interaction of 2D heterostructures by analyzing the rotational statistics of the as-grown twist angles, as well as in-situ manipulation of their relative twist angles using an electron beam. The inventors investigated this in a family of 2D heterostructures: 1-2 layers of $Bi_2Se_3$ grown on different monolayer transition metal dichalcogenides (TMDs), i.e. $MoS_2$, $MoSe_2$, $WS_2$, and an alloy $MoSe_{2-2x}S_{2x}$, which enabled us to compare the relative coupling strengths at junctions with not only similar and dissimilar "nearest-layer" chalcogens, but also with "next-nearest-layer" transition metals, as well as "nearest-mixed-layer" chalcogens. The inventors found that while higher e-beam current densities tend to "disrupt", and lower values "anneal" the crystal structure, MAD-specific intermediate-value-ranges can dynamically twist the layers with respect to each other. From their initial as-grown twist angle, as well as the ease with which they can be perturbed to twist in response to various electron beam current densities, the inventors infer that $MoSe_2/Bi_2Se_3$ layers have the strongest interlayer strength, followed by $MoS_2/Bi_2Se_3$, $WS_2/Bi_2Se_3$, and $MoSe_{2(1-x)}S_{2x}$. Finally, the recipe can be tuned to induce the $Bi_2Se_3$ to form nanoparticles, which also affect their optical properties. Our results reveal that interlayer interactions play a substantial role even in heterostructures of chemically and crystallographically dissimilar 2D materials, where they are traditionally expected to be "weak".

Figure 1:
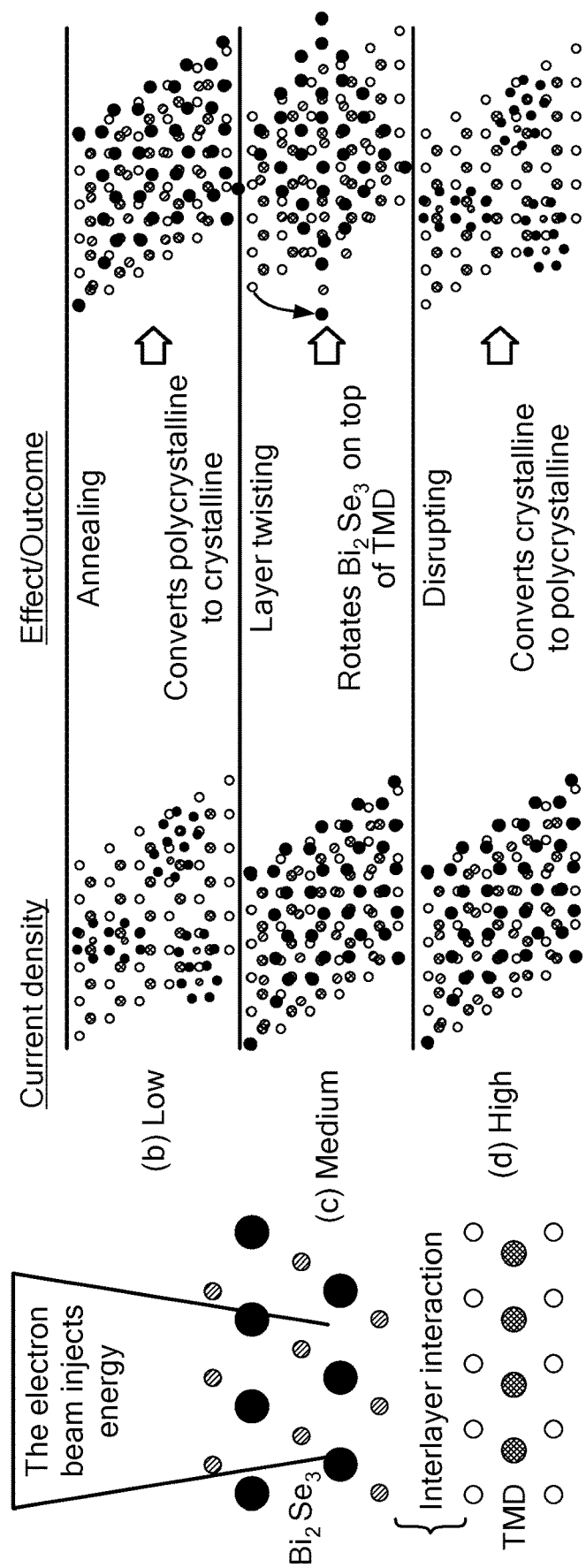
FIG. 1 shows effects of various electron beam energies on interlayer interaction in 2D heterostructures.

In this work, the inventors investigated the interlayer interaction between two chemically and crystallographically-dissimilar 2D layered materials, using statistical analysis of both as-grown and in-situ "twist-angle"manipulated samples. The inventors grew 1-2 layers of $Bi_2Se_3$ on top of several different TMDs ($MoSe_2$, $MoS_2$, and $WS_2$) and a TMD alloy ($MoSe_{2-2x}S_2x$), to test how far the chemical composition of the nearest and next-nearest interacting layer of atoms at the interface impact the interaction strength. The inventors found that the family of 2D heterostructures involving pure TMDs all prefer (to varying degrees) to grow rotationally aligned at or near a twist angle of 0°, with TMD-specific angular-distribution patterns. While the rotationally-aligned growth is a possible consequence of van der Waals epitaxy, the angular distribution between 0-30° is dependent on both interfacial surface atoms chalcogens) and sub-surface atoms on the TMD side (i.e. the transition metals), suggesting that the interlayer interactions penetrate beyond the interfacial chalcogen layers. Additionally, the as-grown heterostructures corresponding to the TMD alloys showed little or no affinity towards the 0° twist angle. The alloy vs. non-alloy TMD results provide compelling evidence that long-range chemical order (i.e. of the same atomic species) is critical for obtaining van der Waals epitaxy Rearrangement of 2D heterostructures can require overcoming the interlayer interactions utilizing focused energy. As illustrated in FIG. 1, a vertically incident electron beam treatment (a) imparts thermal energy into a 2D heterostructure that—at sufficiently high EBT current densities—induces it to overcome the interlayer interaction and rearrange. Low current densities (b) break only the weak interlayer bonds associated with semi-stable grains, resulting in annealing (i.e. grain migration to stable configurations). Intermediate current densities (c) overcome most interlayer bonding, but cannot disrupt the stronger intra-layer bonding, enabling significant grain rotation (twist). Highest current densities (d) break both the inter- and intra-layer bonding, disrupting the crystallographic order and leading to the formation of nano-crystals. The interlayer stability was quantified by varying the EBT recipe parameters (i.e. current density, time interval, and accelerating voltage) and observing when the structure began to morph (or rearrange). By varying the beam current and analyzing the parameters that induce each type of behavior, the interlayer interaction and configurational stability could be compared.

More interestingly, the inventors showed for the first time that a tightly focused beam of electrons on suspended $Bi_2Se_3$/TMD 2D heterostructures can selectively rotate the $Bi_2Se_3$ layer in-situ, and that it is possible to do so on a large number of samples to obtain statistical relevance. This approach enables a direct visualization and quantification of twist-angle-dependent interlayer bonding and charge redistribution.[19b], [31b] The inventors note that in an earlier study, the inventors had seen the first evidence of $Bi_2Se_3$ layers rotating on $MoS_2$ monolayers, triggered by a focused laser under ambient conditions.[3b] This present investigation was done using focused electron beams under high-vacuum, circumventing any role of chemicals, and hence the observations are purely intrinsic measures of the interlayer interactions. Our electron-beam treatment (EBT) is schematically summarized in FIG. 1, and the EBT method was performed inside a JEOL 2010F high-resolution TEM. The intensity of the EBT was controlled using the "brightness" feature of the TEM, and the crystallographic orientation of the two layers in of the TMDs were determined using selected area electron diffraction (SAED) pattern spots. Under the application of an e-beam, the TMD lattice remains unchanged (except for very high-density e-beams, discussed later), while the $Bi_2Se_3$ lattice showed signs of "rotation" with respect to their original positions, the spots visibly "morphing" through continuous, discrete, or diffused rotations. The interlayer stability could be quantified by varying the EBT recipe parameters (i.e. current density, time interval, and accelerating voltage) and observing when the structure began to morph (or rearrange). By investigating 12-16 samples, the inventors were able to categorize the behavior of these SAED spots into three broad categories: disruption, twisting, or annealing. More specifically, depending on the heterostructure being investigated, "low", "medium", and "high" intensity EBT's resulted in either breaking down of the $Bi_2Se_3$ layer into smaller "grains", twisting of these "grains" with respect to the underlying crystallographic axis of the TMD, or "annealing" of multiple grains into a lesser number. These categories are schematically illustrated in FIG. 1. Using this novel approach, the inventors find that among the $Bi_2Se_3$/pure-TMD junctions, the $Bi_2Se_3/MoSe_2$ heterojunction appeared to be the most stable and $Bi_2Se_3/WS_2$ the least, while the $Bi_2Se_3$/TMD-alloy system shows the weakest interlayer interactions. Finally, the inventors show that sufficiently high doses of EBT appear to break the interlayer bonds and induce the $Bi_2Se_3$ to form nanoparticles with a broad photoluminescence centered between about 1.95-2.1 eV (FIG. 15).

Figure 2A:
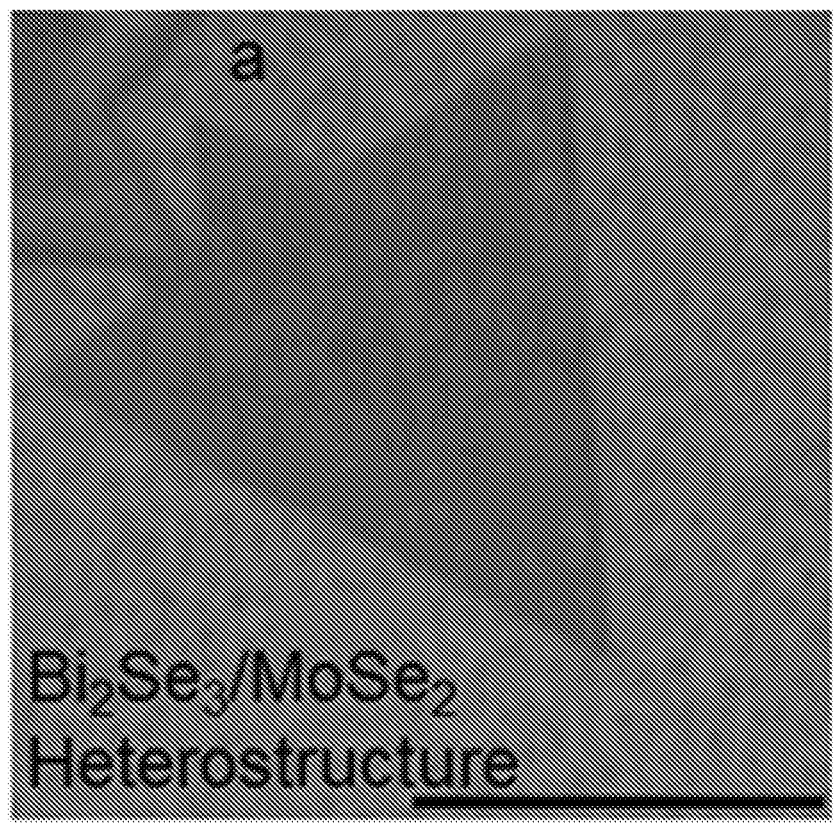
FIG. 2A shows an optical image of a $Bi_2Se_3/MoSe_2$ vertical heterostructure on $SiO_2$, where 1-2 layers of $Bi_2Se_3$ were grown on a monolayer $MoSe_2$ crystal using vapor phase deposition.
Figure 2B:
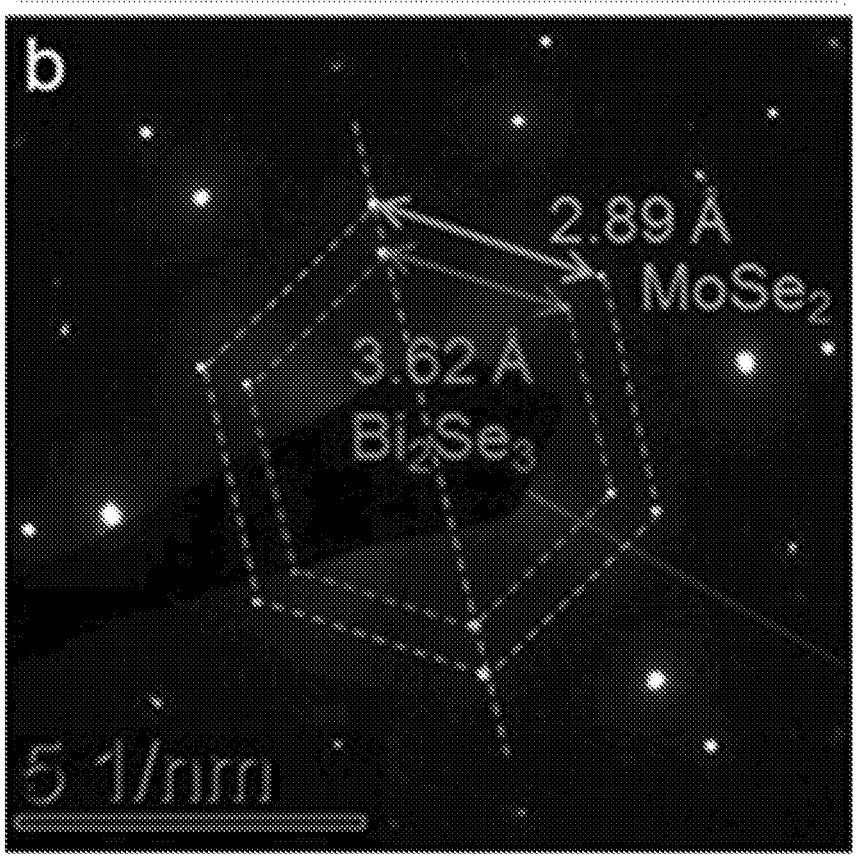
FIG. 2B shows a typical TEM SAED pattern of a $Bi_2Se_3/MoSe_2$ heterostructure with the corresponding diffraction spots labeled.
Figure 2C:
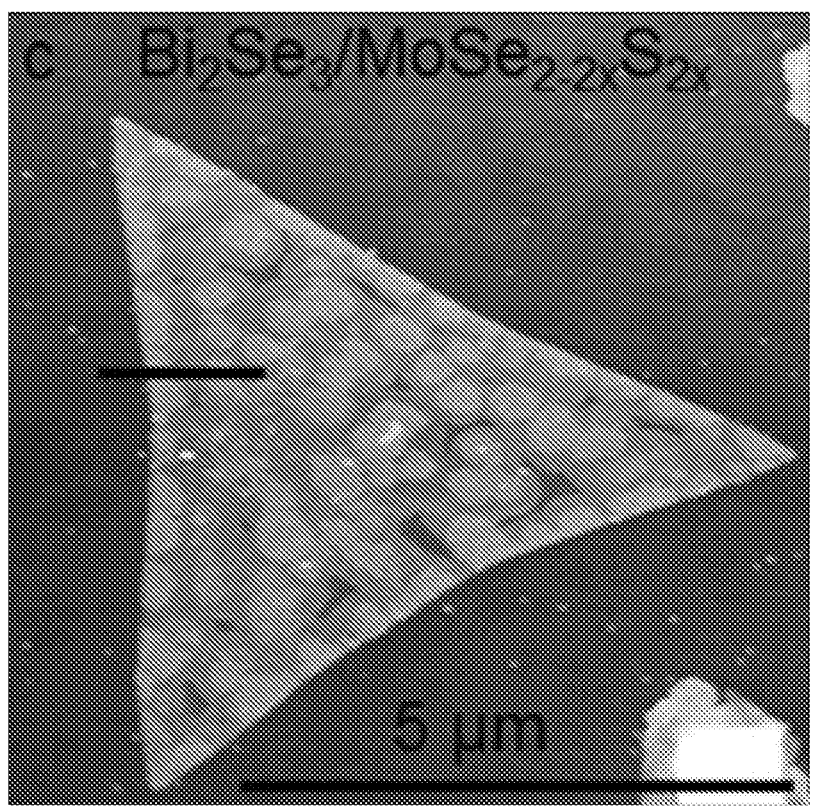
FIG. 2C shows an AFM scan of a $Bi_2Se_3/MoSe_{2-2x}S_{2x}$ heterostructure.
Figure 2D:
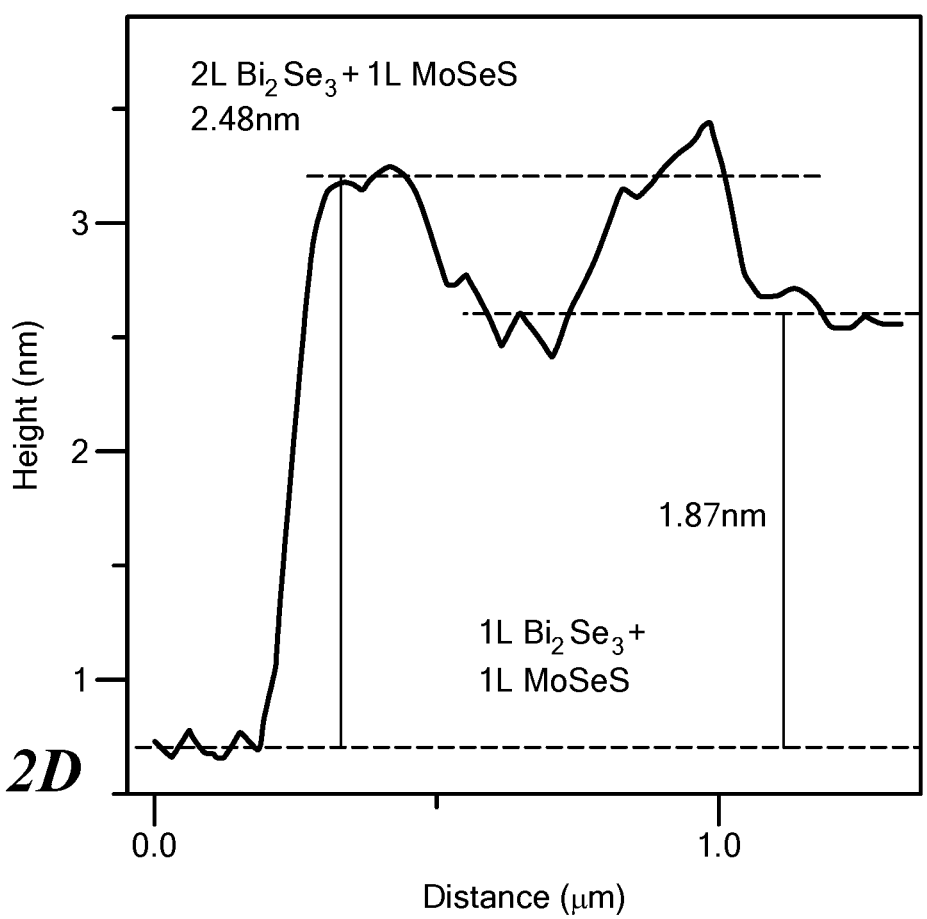
FIG. 2D shows the corresponding line profile (left to right) of the AFM scan in FIG. 2C.

FIG. 2A shows an optical image of a $Bi_2Se_3/MoSe_2$ 2D heterostructure on $SiO_2$, where 1-2 layers of $Bi_2Se_3$ were uniformaly grown on top of a monolayer $MoSe_2$ flake using vapor-phase deposition.[32b] The original monolayer $MoSe_2$ crystal was grown using vapor-phase chalcogenization (VPC). FIG. 2B shows a typical TEM selected area electron diffraction (SAED) pattern of a $Bi_2Se_3/MoSe_2$ heterostructure with the two parent crystals labeled. The distinct dots indicate both materials are highly crystalline, and the central dotted line shows the $Bi_2Se_3$ grew aligned along the 0° with respect to the underlying $MoSe_2$ crystal. FIG. 2C is an AFM scan of a $Bi_2Se_3/MoSe_{2-2x}S_{2x}$ heterostructure. $MoSe_{2-2x}S_{2x}$ grows crystalline with a lattice constant between $MoSe_2$ and $MoS_2$, suggesting the selenium and sulfur are randomly placed. Despite the loss of chemical periodicity, $Bi_2Se_3$ still grows crystalline. FIG. 2D is the corresponding line profile for FIG. 2C. The AFM scan is typical of any of the $Bi_2Se_3$/TMD 2D heterostructures: it contains near-continuous monolayer $Bi_2Se_3$ with islands of bilayer regions.

The inventors also inferred information about the TMD-$Bi_2Se_3$ interlayer interaction by comparing it to $Bi_2Se_3$ growth on $SiO_2$, a material commonly used as a platform to grow 2D heterostructures. First, when lower concentrations of vapor-phase bismuth and selenium atoms are generated, $Bi_2Se_3$ grows only on the TMD (FIG. 2C); however, at higher concentrations, the $Bi_2Se_3$ begins to grow on the $SiO_2$ as well (the "spots" surounding the heterostructure in FIG. 2A). Second, $Bi_2Se_3$ grows as multilayered nanocrystals on $SiO_2$, but prefers to grow monolayer and highly epitaxial/crystalline on TMDs. Together the data suggests there is a substantial interlayer interaction that stabilizes the $Bi_2Se_3$ in its few-layered morphology on TMDs.

The growth of 2D materials is governed by the interlayer interaction, and the inventors use the twist angle of the as-grown heterostructures as our first parameter to indicate the interlayer interaction strength. In other words, if $Bi_2Se_3$ grows at preferred, statistically significant twist angles, they represent energy-minimized configurations; conversely, if the twist angle distribution is more random (i.e. "spread out"), the inventors will infer weaker, non-direction specific interactions. The measured twist angle distributions for each type of heterostructures grown were collected from 75-150"measurements" taken across 15-40 flakes, for each heterostructure type. The resulting angular distribution are shown as histograms in FIG. 3, corresponding to $MoSe_2/Bi_2Se_3$, $MoS_2/Bi_2Se_3$, $WS_2/Bi_2Se_3$, and $MoSe_{2(1-x)}S_2x$ heterostructures, respectively. The insets in each figure (to the right of each histogram) show the relative arrangement of atoms in the nearest and next-nearest layers at the interface. The inventors see that as the TMD and corresponding interlayer interaction change, so does the angular distribution. $Bi_2Se_3$ has a 79.7% probability of growing at a 0° twist angle on $MoSe_2$(top histogram, FIG. 3), whereas it only has a 41.0% probability on $MoS_2$ (second from top histogram, FIG. 3), a 24.5% probability on $WS_2$ (third histogram, FIG. 3), and a near 0% probability on $MoSe_{2(1-x)}S_{2x}$ (bottom histogram, FIG. 3). The twist angles outside of 0° were found to be statistically insignificant based on Monte Carlo simulations (FIGS. 11A-12), suggesting the stability landscape outside of 0° is relatively flat with only weak preference, although the inventors can see some qualitative correlation between how weak the response is, and how far "spread out" the distribution is. The stability and energy of the interlayer interaction is in part determined by both the spatial density and energy of the interlayer bonds, which mediate the amount of charge redistribution/transfer between the layers. Also, the bond energy is dependent on the interatomic distance, where a sufficiently long distance prevents bond formation or significantly weakens it, thereby limiting bond formation to nearest neighbors.[33b]-[35b] The relative positioning, or atomic registry, of the atoms is instructed by the twist angle. In summary, angles with greater stability are more likely to be observed, suggesting a 0° twist is the most stable configuration for the non-alloy heterostructures.

Comparing the distribution in the top histogram and second from the top histogram in FIG. 3, it is clear that the Se-Se nearest-layer interface ($MoSe_2/Bi_2Se_3$, top histogram of FIG. 3) results in a much stronger inter-layer interaction compared to the Se-S interface ($MoS_2/Bi_2Se_3$, second from top histogram, FIG. 3), as inferred from the near halving of the rotationally-oriented (0°) percentage population of the latter.

The more surprising result, however, is how much the chemistry of the "next-nearest-layer" atoms affects the interlayer-interactions, as seen by comparing the distributions in the second from top histogram and the third from top histogram in FIG. 3, which represent dissimilar "next-nearest-neighbors" only: i.e. —Mo—S—Se—, vs. —W—S—Se—. Once again, the percentage population of rotationally-aligned heterostructures fall roughly by half, denoting that W-based TMDs interact less strongly with $Bi_2Se_3$, compared to Mo-based ones. The inventors note that when molybdenum is replaced with tungsten, the in-plane lattice constant increases by less than 1%, and hence it is unlikely that the relatively small change to the in-plane lattice constant could alone induce such a large change to the stability at 0°, suggesting next-nearest-neighbor chemistry is strongly influential in determining the interlayer interaction in these heterostructures.

Finally, the inventors found that the $Bi_2Se_3/MoSe_{2-2x}S_{2x}$ distribution (FIG. 3, bottom histogram) is distinctly different from all other heterostructures, despite the fact that the same atomic compounds were used (i.e. Mo, Se, and S), and that the TMD-alloy has long-range crystallographic order using lattice constants comparable to the other heterostructures. In the bottom histogram of FIG. 3, the inventors saw that the $Bi_2Se_3$ layer showed no tendency for forming rotationally aligned heterostructures (although the underlying alloy-TMD had a well-defined, uniform crystallographic orientation), with the orientations spread widely across the entire measured range. Since the only noteworthy difference is that the chemical nature of the TMD alloy was random, i.e. the Se and S atoms are likely randomly distributed with the TMD lattice, our results suggest that long-range chemical periodicity, not just crystallographic periodicity, is critical for strong interlayer interaction, and possible vad der Waals epitaxy. Taken together, the data from as-grown heterostructures suggests the interlayer interaction (at 0°), arranged from strongest to weakest, is: $Bi_2Se_3/MoSe_2$, $Bi_2Se_3/MoS_2$, $Bi_2Se_3/WS_2$, and $Bi_2Se_3/MoSe_{2-2x}S_{2x}$, and the inventors will use this result to test the efficacy of the inference drawn from the electron beam treatment (EBT), and compare how far they are in agreement, as discussed next.

The effect of an electron beam (e-beam) on the heterostructures was investigated using selected area electron diffraction (SAED) patterns of the samples in situ. SAED is conventionally used to probe a material's crystal structure in reciprocal space, where well defined patterns of bright spots indicates a sample of high crystallinity.[36b], [37b] The material's crystal structure determines the pattern generated, while the lattice constant determines the pattern's size—smaller lattice constants produce larger patterns.[36b], [37b]

When probed along the z-direction, $Bi_2Se_3$ and the TMDs produce similar hexagonal SAED patterns; however, $Bi_2Se_3$ has a smaller pattern because its lattice constant is larger (e.g., FIG. 2B). The bright spots are spaced every 60° along the same radii; however, due to rotational symmetry (i.e. $-\theta=\theta$), only twist angles between 0-30° are unique.

When the TEM e-beam is incident on the heterostructures, it induces structural changes in the SAED spots, and the nature of these changes depend on the e-beam current density (and hence the rate of energy transfer to the crystals or heterostructures). Higher densities break bonds and disrupt the crystallinity, whereas lower densities anneal by gently perturbing the material into a more stable state with greater crystallinity. Densities in between exhibit more complex behavior because the power is sufficient to loosen weak bonds (e.g. interlayer and van der Waals), but not strong bonds (e.g. intra-material). Appropriately-tuned densities tend to loosen the interlayer bonding while simultaneously perturbing $Bi_2Se_3$ grains to rotate relative to the TMD. The movement can be observed in-situ using a TEM in SAED mode, revealing information about the interlayer interaction landscape (e.g. the relative stability of the twist angles). It is reasonable to assume that under EBT treatment, the cumulative time spent at each twist angle configuration correlates to their relative stability, i.e. more time equates to higher stability.

Figures 4A, 4B, 4C, 4D:
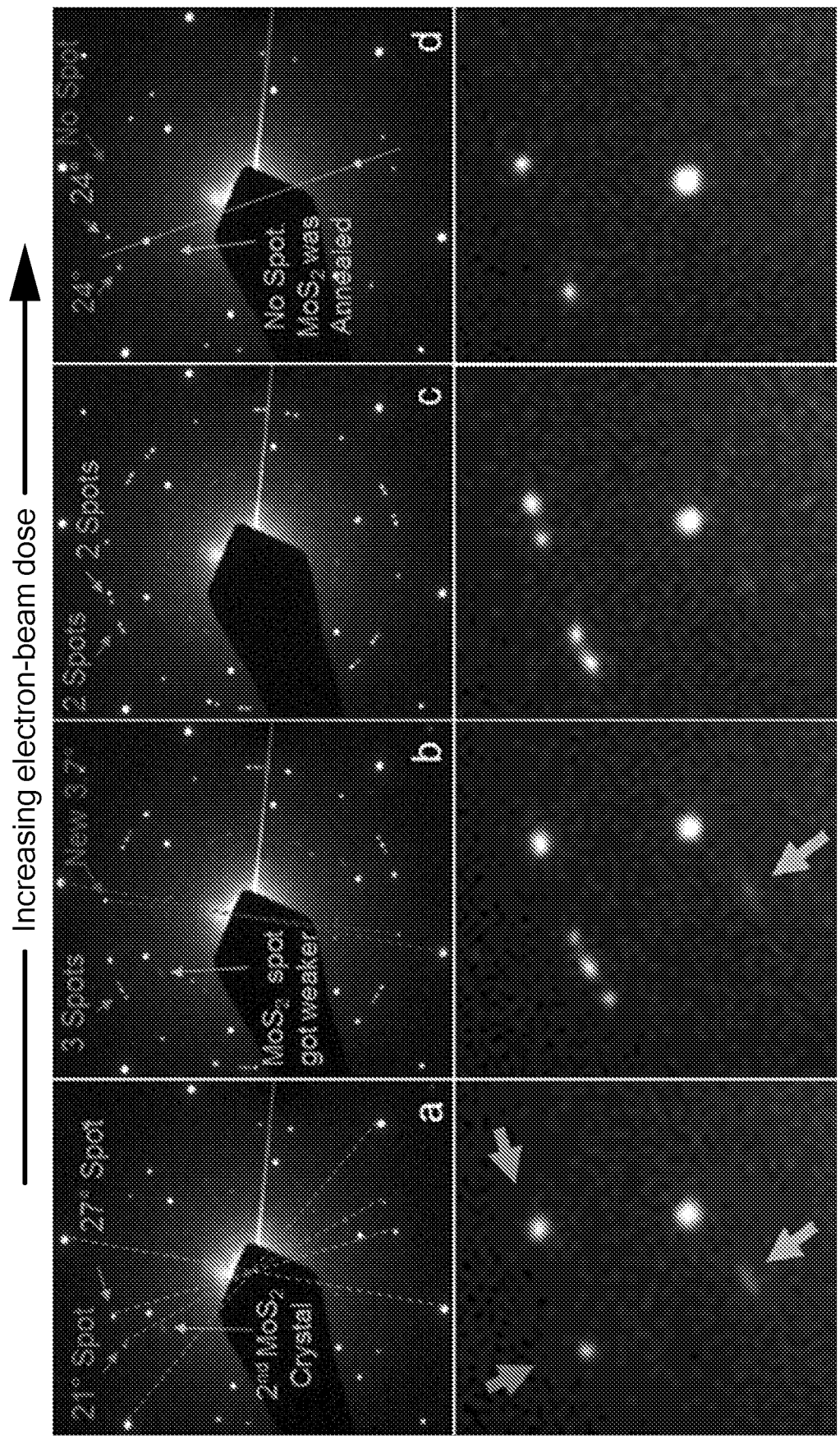
FIG. 4A shows the initial TEM SAED images of a $Bi_2Se_3/MoS_2$ heterostructure subject to consecutive TEM electron beam treatments (EBTs).
FIG. 4B shows the post-first electron beam treatment (EBT), the changed TEM SAED images of a $Bi_2Se_3/MoS_2$ heterostructure shown in FIG. 4A (subject to consecutive TEM EBTs.
FIG. 4C shows the post second electron beam treatment (EBT), consecutive after images shown in FIGS. 4A-4B.
FIG. 4D shows the post third electron beam treatment (EBT), TEM SAED images of a $Bi_2Se_3/MoS_2$ heterostructure subject to consecutive TEM electron beam treatments (EBTs).

Results are first presented for EBT treatment for a fixed beam current, using multiple exposures. The SAED images or snapshots in FIGS. 4A-4D show the evolution of a $Bi_2Se_3/MoS_2$ 2D heterostructure subject to multiple EBTs of the same recipe (e.g., the same electron beam current density was applied), demonstrating in-situ manipulation of the twist angle. The top and bottom images shown in FIG. 4A show the initial configuration of the $Bi_2Se_3/MoS_2$ 2D heterostructure. Two $Bi_2Se_3$ spots, at 21° and 27°, are identified by the top arrows in the images shown in FIG. 4A, and a fainter, spot (nearest $MoS_2$ spot) is also identified by an arrow at bottom. Here, the angles were measured with respect to the nearest stable $MoS_2$ spot, shown by dashed lines on both sides of the spots at 21° and 27°, resulting in the 21° spot measured clockwise and the 27° spot is counter-clockwise from their nearest reference $MoS_2$ spot. The bottom arrow identifies the second, weaker $MoS_2$ spot. The inventors associate the relative brightness of spots with the relative areas of a material associated with the spot, where increased brightness correlates to increased amounts.[36b] Initially the 27° spot is 2.58x brighter than the 21° spot, suggesting the size of the $Bi_2Se_3$ crystallite under the TEM e-beam corresponding to the 27° is bigger. Under the EBT, the observed spots moved in real-time. Although these spot-movements could be seen real-time on the phosphorescent screen of the TEM, unfortunately, they could not be recorded videographically owing to an instrument limitation. Hence, in FIGS. 4A-4D, the inventors present snapshots of the system between EBT treatments.

The first EBT (FIG. 4B) disrupted the $Bi_2Se_3$ spot at 21°, splitting it into three closely aligned spots (18°, 21°, and 24°) that appeared to move within narrow angular ranges, indicating they were only at semi-stable twist angles. The spot at 27° did not appear to move. Interestingly, a spot at 3.7° appeared during the EBT; however, due to its rapid emergence, the inventors are not sure of its origins. This uncertainty led us to question whether the imaged location shifted, which is possible if either the electron beam or the sample moved during the EBT. The inventors tested for this, but found the TEM to be probing the same area before and after EBT, leading us to conclude the changes are due to movement of $Bi_2Se_3$ grains. The inventors believe that a grain moved into the imaging field of view and settled at a twist angle of 3.7°. This is a probable scenario since the electron beam simultaneously treats areas inside and outside of the imaged location. While operating the TEM in SAED mode, an aperture is inserted below the sample to diminish the spot intensities and protect the camera. The aperture only reduces the surface area being imaged, and does not affect the electron beam, its interaction with the sample, or the area being subject to EBT.

The second EBT (FIG. 4C) merged two of the spots (the left spot at 18° merged with the middle spot at 21°), and disrupted the spot at 27° to split into two spots (24° and 27°, respectively). The third EBT (FIG. 4D) merged two spots (21° merged with 24°), and merged another two spots (27° merged with 24°), resulting in only two spots that are both at 24°, but at opposing rotations. More specifically, one spot is twisted 24° to the right, and a second spot is twisted 24° to the left. Very interestingly, both spots at 24° are nearly equally bright, where the one spot is only 1.05× brighter (8.4 vs. 8.0 photon counts), respectively. This is a significant change from the initial SAED image, where the spot at 27° was 2.58× brighter, suggesting the system evolved into a statistical equilibrium where both the right- and left-circular 24° twist angles contain the same amount of $Bi_2Se_3$ crystal. These results are in strong agreement with the fact that these 2D heterostructures have rotational symmetry (i.e. $-\theta=\theta$). Without any external forces to break the symmetry, it appears that the EBT evenly split the $Bi_2Se_3$ crystals between the two 24° twist angles. Lastly, the second $MoS_2$ spot disappears completely after the $3^{rd}$ EBT. It was consistently dimming with each EBT, suggesting that it annealed with the larger $MoS_2$ spot. The spot at 3.7° also disappears, possibly because it moved out of the imaging area. Our investigations hence reveal that although there were some quasi-stable configurations (located at 18°, 21°, and 24°), the fact that both spots settled at 24° suggests that 24° is the most stable twist angle in the $Bi_2Se_3/MoS_2$ heterostructure.

Results are next presented for variable EBT beam currents on the same sample. FIGS. 5A-5D show SAED images acquired at the same location on a $Bi_2Se_3/WS_2$ heterostructure, where multiple consecutive EBTs of varying electron beam current density were applied, demonstrating controllable structural rearrangement of the 2D heterostructure. FIG. 5E compares the variations in spot intensities. The current density was controlled using the TEM "brightness" knob, and is expressed as a percentage of the "brightness" knob's possible range. Higher brightness values correspond to increased current density, which disrupts the heterostructure's crystallinity. Lower brightness values anneal the heterostructure and increase the crystallinity. FIGS. 5A-5D present snapshots of SAED patterns following representative EBT treatments, while the graph in FIG. 5E compares the variation of the $Bi_2Se_3$ spot intensity (i.e. the photon counts) values relative to the corresponding $WS_2$ spot.[37b], [38b] Numerous EBTs of various current density values were consecutively applied to the same location. The EBT current density used is stated below each panel as a percentage of the possible range.

FIG. 5A is the SAED image of the pristine sample, where the two weaker $Bi_2Se_3$ spots are identified by smaller arrows and a stronger spot corresponding to the $WS_2$ crystal is identified by a larger arrow, respectively. The corresponding panel in FIG. 5E shows the relative intensity values of both $Bi_2Se_3$ spots to the $WS_2$ spot. FIG. 5B shows the result after two EBTs were applied (60% and 20%, respectively), which perturbed two spots to merge. A single high-density (60%) EBT was then applied (FIG. 5C), which split one spot into two. The new spot was labeled with an arrow. This was done to facilitate analysis, even though the $Bi_2Se_3$ crystals/atoms that correspond to this spot are likely not the same as indicated by the original spot. Next, as shown in FIG. 5D, three low-density EBTs were applied (20%, 10%, and 20%, respectively), perturbing a spot to rotate into the 0° twist angle and become brighter, as seen in the corresponding FIG. 5E panel. 0° is a known stable twist angle for $Bi_2Se_3$/$WS_2$ 2D heterostructures (FIG. 3), suggesting that the low-density EBTs annealed the 2D heterostructure into its most stable twist angle.

FIG. 5E demonstrates several important results. When EBTs of 60% current density intensity are applied, the combined brightness of the $Bi_2Se_3$ spots decreased, suggesting the heterostructure's crystallinity is being disrupted, [37b], [38b] since amorphous, or non-crystalline, materials do not produce well defined SAED spots or rings. Conversely, when lower EBT current density values are applied (20%), the combined brightness increases, suggesting the heterostructure's crystallinity is being annealed and increased. EBTs of 10% did not appear to have a noticeable effect, suggesting the power was too low to affect change. As EBTs were applied, the relative brightness between the red and green-arrow spots changed, demonstrating that EBTs are able to rotate the heterostructure into new twist angles. An interesting rotation is demonstrated in FIG. 5D where a spot rotated to the 0° twist angle, a known stable twist angle. EBTs of 100% current density values will rapidly disrupt the heterostructure's crystallinity, and even showed the ability to disrupt the $WS_2$. In this manner (FIGS. 5A-5E), it was possible to discern values of EBT-brightness that could controllably manipulate SAED spots, in-situ.

FIGS. 5A-5E demonstrate, along with FIGS. 4A-4D, that modulation of a light source or electromagnetic radiation can be used to control or reverse the suppression of photoluminescence. As discussed later, oxygen is introduced in reversal of photoluminescence suppression.

Figure 6:
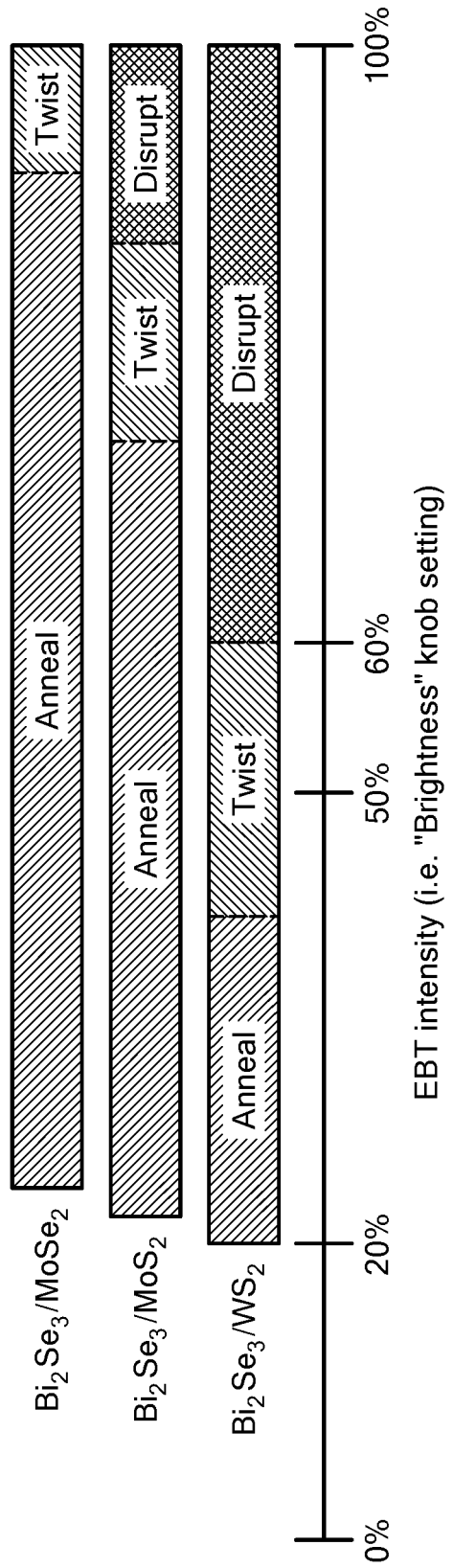
FIG. 6 shows a summary of different 2D heterostructures' responses to lower and higher EBT intensities.

FIG. 6 shows the responses of three different 2D heterostructures ($Bi_2Se_3$/$MoSe_2$, $Bi_2Se_3$/$MoS_2$, and $Bi_2Se_3WS_2$) when different EBT intensities were applied, allowing their interlayer interactions to be probed and compared. These results are in agreement with the epitaxial growth studies (FIG. 3), which indicate that $Bi_2Se_3$/$MoSe_2$ has the strongest interlayer interaction and $Bi_2Se_3WS_2$ the weakest. While high current densities disrupted both $Bi_2Se_3$/$MoS_2$ and $Bi_2Se_3WS_2$ (FIG. 5), they annealed $Bi_2Se_3$/$MoSe_2$ heterostructures, rotating a significant portion of the $Bi_2Se_3$ spots into the 0° twist angle and increasing the crystallinity, in agreement with earlier results that showed the 0° twist angle is very stable for $Bi_2Se_3$/$MoSe_2$ heterostructures (FIG. 3).

Thermal heating is able to rotate and merge monolayer $MoS_2$ nanoparticles.[39b] This suggests that the EBT dose is being converted into thermal energy, which is inducing the observed changes. Additionally, it has been previously shown that vertically incident TEM electron beams are able to rotate and move crystallites and nano-particles.[40b] However, to the best of our knowledge, this is the first demonstration of the in-situ manipulation of a 2D heterostructure's twist angle. The techniques described herein can be used to study the interlayer interaction; however, when combined with other techniques, the ability to manipulate the twist angle in-situ inside a TEM has more significant implications. TEM operation has demonstrated the ability to probe the interlayer van der Waals electronic structure,[19b] measure chemical induced charge redistribution,[41b] probe interlayer energy in 2D heterostructures,[31b] measure the interlayer distance,[42b] and probe crystallographic ordering and charge redistribution of intercalated of atoms.[21b] Combining these methods with the ability to control the twist angle in-situ can hence enable significant progress our understanding of 2D heterostructures whose properties can be engineered using the twist angle.

EBT recipes contain three important parameters: current density, accelerating voltage, and time interval. Using a TEM to apply EBT allows the crystal structure to be observed in-situ; however, precisely measuring the electron beam current density or manipulating the accelerating voltage are difficult, limiting our ability to quantify the beam current. To overcome this, the inventors also applied EBT using a scanning electron microscope (SEM), whose electron beam parameters can be precisely measured and manipulated. Moreover, SEM beams allow us to "write" complex patterns with nanoscale dimensions,[43b] and raster over a greater spatial region, thereby allowing us to EBT-modify samples with regions large enough for their properties to be investigated optically (i.e. under an optical microscope). The three parameters (current density, accelerating voltage, and time interval) can be independently controlled using an SEM. Increasing any of these parameters raises the energy dosage delivered and, thereby, the likelihood of structural modification and the emergence of new properties. The inventors next show that sufficiently intense SEM-EBT recipes induce three notable changes: the perceived color under broad-band illumination shifts from purple to bluish-green, emergence of a new, broadband photoluminescence, and a possible modification of work function of the treated area.

Figure 7A:
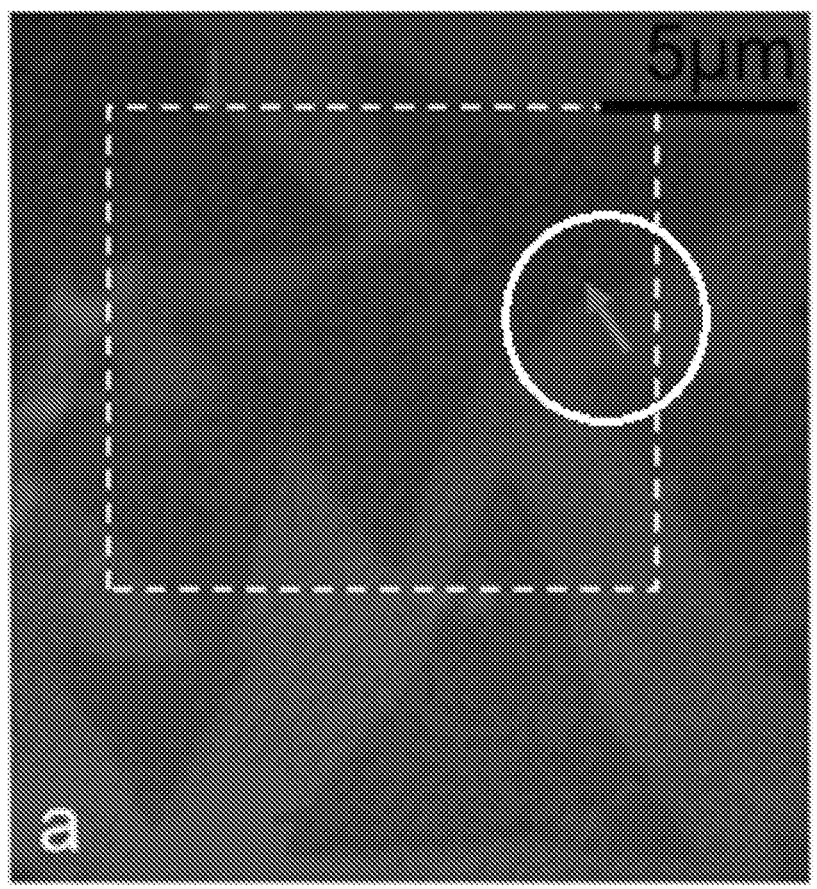
FIG. 7A shows an optical image of $Bi_2Se_3/MoS_2$ heterostructures; arrows mark locations where electron beam treatment (EBT) was applied using a scanning electron microscope (SEM).
Figure 7B:
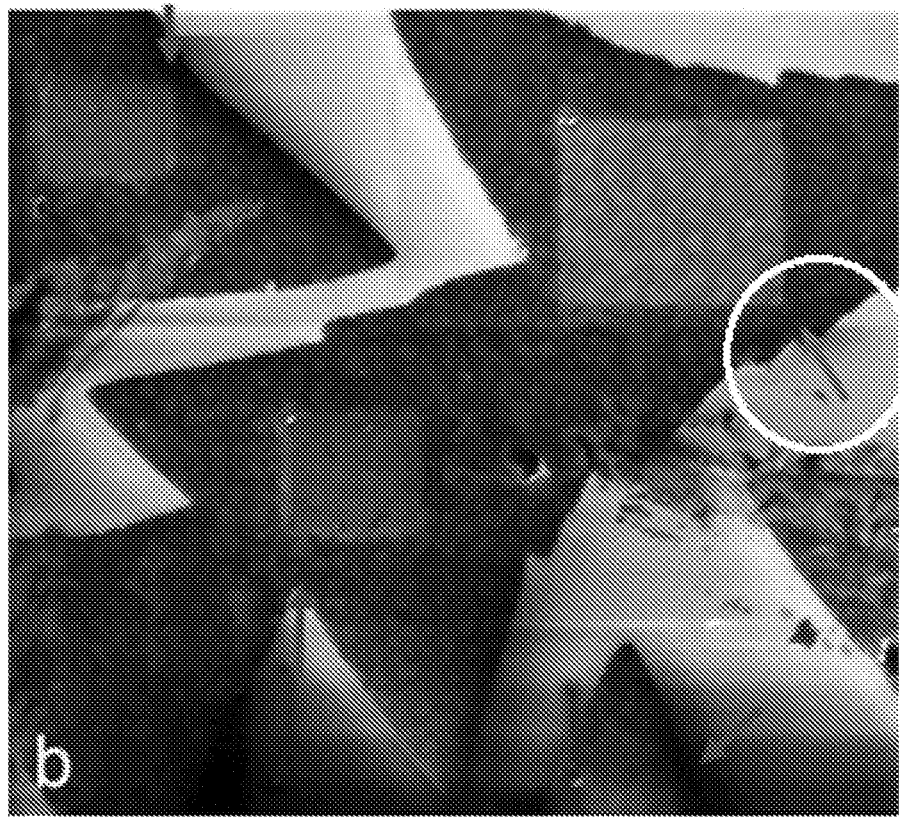
FIG. 7B shows a SEM image of $Bi_2Se_3/MoS_2$ heterostructures; arrows mark locations where electron beam treatment (EBT) was applied using a scanning electron microscope (SEM).

FIG. 7A and FIG. 7B are optical and SEM images, respectively, of $Bi_2Se_3$/$MoS_2$ 2D heterostructures (1-2 layers of $Bi_2Se_3$ CVD grown on monolayer $MoS_2$) subject to different SEM-EBT recipes, where the current density was manipulated, while the time interval (60 seconds) and accelerating voltage (5 keV) were held constant. The exposed areas are identified by plain arrows and by circled arrows, representing recipes using higher vs. lower current densities, respectively. The plain arrows correspond to higher energy densities ($\geq 8.44 \times 10^6$ J·m$^{-2}$) and the circled arrows to lower energy densities ($<3.05 \times 10^6$ J·m$^{-2}$). Changes were only observed for the recipes using higher current (or energy) densities ($8.44 \times 10^6$ J·m$^{-2}$, plain arrows) and not for the lower densities (($<3.05 \times 10^6$ J·m$^{-2}$, circled arrows), suggesting a threshold current density, or energy dose, is required to induce change, which is in agreement with the results in FIG. 5, where threshold current densities (>10% "brightness") were required to induce structural rearrangement. All the experiments came to the same conclusion: changes are only induced when the electron beam current density crosses a certain threshold, and hence the inventors can conclude that this represented intrinsic energy barriers to changes.

Figure 7C:
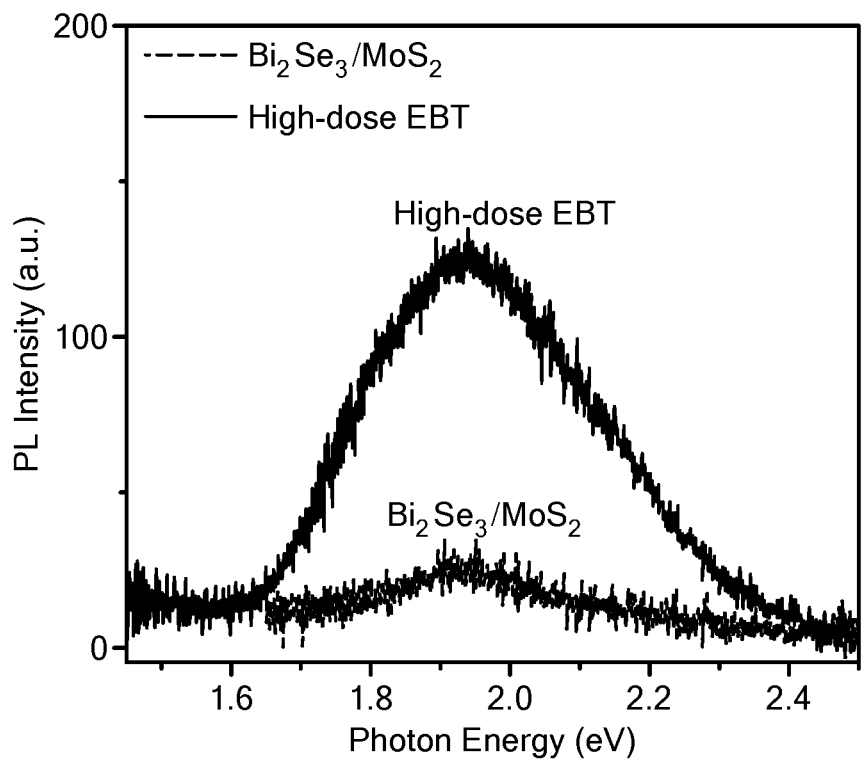
FIG. 7C shows the photoluminescence (PL) of as-grown $Bi_2Se_3/MoS_2$ (bottom trace) and the PL of a $MoS_2/Bi_2Se_3$ heterostructure after high-dose EBT was applied (top trace).

FIG. 7C shows representative PL spectra from as-grown and EBT-affected $Bi_2Se_3$/$MoS_2$ heterostructures, respectively. Very interestingly, high-dose EBT induces the emergence of a new broad PL peak centered between 1.95-2.1 eV, and which corresponds to those seen previously and reported for $Bi_2Se_3$ nanoparticles.[44b], [45b] It was shown in FIGS. 4A-4D and in FIGS. 5A-5E that high-dose EBT can disrupt the heterostructure's crystalline order and induce the formation of smaller $Bi_2Se_3$ crystallites. Both these observations suggest the emergence of the PL might be due to the formation of $Bi_2Se_3$ nanoparticles. Low-dose EBT does not appear to have an effect on the PL, which is in agreement with the optical and SEM images in FIGS. 7A-7B, where no changes were detected.

The time interval is an important parameter of EBT because it reveals the rate of structural rearrangement and change. Nearly all the changes observed for the EBT experiments, both SAED and SEM, were slow and steady enough to be observed by in real time, occurring over time periods of several seconds to several minutes. Hence, in case of the SEM-EBT experiments, it was possible to obtain a videographic representation of the changes.

To understand the formation of the nanocrystals, the inventors note that $Bi_2Se_3$ prefers to grow poly/nano-crystalline on the $SiO_2$; however, it prefers to grow crystalline on the TMD, suggesting the TMD provides a surface that stabilizes the $Bi_2Se_3$ through the interlayer interaction. The inventors believe that as the interlayer bonding it broken, the $Bi_2Se_3$ becomes metastable and begins to breaks into smaller grains, in agreement with the TEM-EBT experiments in FIGS. 5A-5E. Further, the quantity and relative brightness of the $Bi_2Se_3$ spots in FIGS. 5A-5E suggests that high-dose EBT is able to break the $Bi_2Se_3$ into nano-scale particles. Previous work demonstrated that $Bi_2Se_3$ particles tens of nanometers across have a PL,[44b], [45b] suggesting high-dose EBT is able to disrupt the $Bi_2Se_3$ layer into forming nanoparticles that induce a different perceived color (FIG. 18A), work function (FIG. 14), and PL spectra (FIG. 7C).

It is concluded that mono- to few-layer $Bi_2Se_3$ can be grown epitaxial on a family of TMDs (including an alloy), suggesting an influential interlayer interaction is present between the 2D materials. Comparing the angular distributions between the heterostructures provides insight into their interlayer interaction, and the influence of certain parameters (e.g. twist angle, atomic registry, chemistry). For example, when chemical periodicity is present (i.e. non-alloys), the most stable twist angle is at 0°. The inventors then demonstrated a new method to study and quantify the interlayer interaction in-situ by varying the current density of focused electron beams in either a TEM or SEM. While in SAED mode, the heterostructure could be disrupted using higher densities, annealed using lower densities, or rotated in-situ into different twist angles using values in between. EBT measurements indicate $Bi_2Se_3/MoSe_2$ has the strongest interlayer interaction and $Bi_2Se_3/WS_2$ the least, results that are in agreement with the epitaxial growth study (FIG. 3). An SEM allows for greater control of the electron beam parameters (e.g. current density and accelerating voltage), enabling improved quantification of the EBT and subsequent changes. Specific dosing thresholds were measured for when heterostructure disruption begins, experimental results that can improve bonding strength estimates. Very interestingly, the recipe can be tuned to change the optical properties, as well as induce the formation of $Bi_2Se_3$ nanoparticles, allowing the writing of submicron patterns that photoluminesce. This work provides insight into the interlayer interaction in 2D heterostructures, an effect that has been shown to dramatically transform the properties of 2D materials, based on the limited number of experimental tools to probe it. This work demonstrates a facile technique to manipulate the twist angle in-situ, which when combined with previously published TEM-based techniques, is a platform to rapidly collect electronic structure information of 2D materials facilitating statistically significant results, and supports the development of 2D heterostructures whose properties are engineered using the twist angle. Lastly, the demonstration of submicron pattern writing using SEM-EBT holds unique applications for information storage and photonics.

Methods: Growth of TMD and TMD-alloy crystals

All TMDs, as well as the TMD-alloy, were grown using chemical vapor deposition (CVD).[32b] The growth setup consisted of quartz tubes that were 1 inch (2.54 cm) in diameter in a horizontal tube furnace (Lindberg/Blue M). A quartz boat, containing a thin layer of either $MoO_2$ or $WO_2$ powder (3 mg or 15 mg, respectively) with $SiO_2$/Si (MTI Corporation) substrates suspended over the powder with the growth side facing down, was placed in the hot center of the furnace. Either sulfur, selenium, or both powders (150 mg or 50 mg, respectively) were used, depending on the material being grown. To grow the alloy $MoSe_{2(1-x)}S_{2x}$, both powders were used at the same time. Sulfur was placed near the insulating edge of the furnace upstream, whereas selenium was placed ~1 cm past the insulating edge of the furnace upstream. The setup was pumped down and purged with argon gas before it was filled with an Ar atmosphere. Downstream was then opened to atmosphere, in addition to a constant 200 standard cubic centimeter per minute (SCCM) Ar flow. The furnace was heated to different temperatures and at variable rates, depending on the material being grown. The growth was conducted in two stages, $1^{st}$-stage and $2^{nd}$-stage, where $2^{nd}$ stage would start once the $1^{st}$-stage temperature was reached. Table 1 below illustrates material specific growth information. After the elapsed time, the furnace was opened and allowed to cool rapidly.

TABLE 1

Material Specific Growth Information

| 2D Crystal | $1^{st}$ Rate (° C./min.) | $1^{st}$ Temp. (° C.) | $2^{nd}$ Rate (° C./min.) | $2^{nd}$ Temp. (° C.) | Hold time (min.) |
| --- | --- | --- | --- | --- | --- |
| $MoS_2$ | 50 | 500 | 5 | 712 | 20 |
| $MoSe_2$ | 50 | 200 | 20 | 740 | 10 |
| $WS_2$ | 50 | 1080 | 5 | 1150 | 25 |
| $MoSe_{2(1-x)}S_{2x}$ | 50 | 100 | 30 | 750 | 10 |

$Bi_2Se_3$ growth was performed in an identical CVD setup, except a heating wrap was coiled around the quartz tube at the down-stream end, leaving no gap between the furnace and the heating wrap. The $Bi_2Se_3$ powder (50 mg) was placed in the hot center of the furnace. The TMD or TMD-alloy substrate was placed downstream ~0.75cm from the boundary between the furnace and the heating wrap. The system was pumped down to a base pressure of ~10 mtorr before a 35-SCCM Ar flow was introduced, raising the growth pressure to ~490 mtorr. The heating wrap was set to a temperature of 245° C., and a temperature controller (J-KEM Scientific Model Apollo) ensured it remained within ±2° C. The furnace was heated at a rate of 50° C/min to 530° C. and then held there for 20-25 min depending on the desired thickness. Once growth was completed, the furnace was opened and the temperature controller was de-energized, allowing the setup to cool rapidly.

Electron Beam Treatment (EBT) Studies

Figure 8:
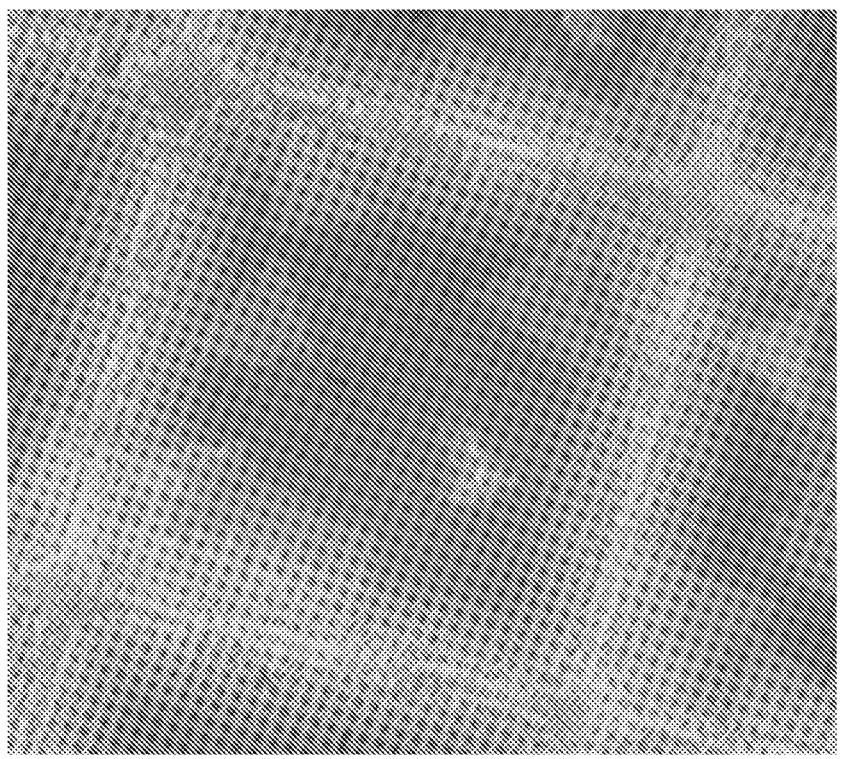
FIG. 8 shows an optical Picture of $Bi_2Se_3$ 2D heterostructures transferred onto a TEM grid.

Prior to select area electron diffraction (SAED) EBT, the 2D heterostructures needed to be transferred to a transmission electron microscope (TEM) grid (FIG. 8). The TEM grids used were Pelco QUANTFOIL® Holey Carbon film. PMMA C4 was first spin-coated at 4000 rpm for 60 s on the $SiO_2$ wafer with the 2D heterostructures and baked 180 C for 1:30 min. Then the chip was immersed in 1 M KOH solution for 4 hours. Obtained PMMA and heterostructure film transferred to new substrate. This was followed by acetone and IPA cleaning to remove PMMA residues. FIG. 8 shows an optical picture of $Bi_2Se_3$ 2D heterostructures transferred onto a TEM grid.

Figure 10A:
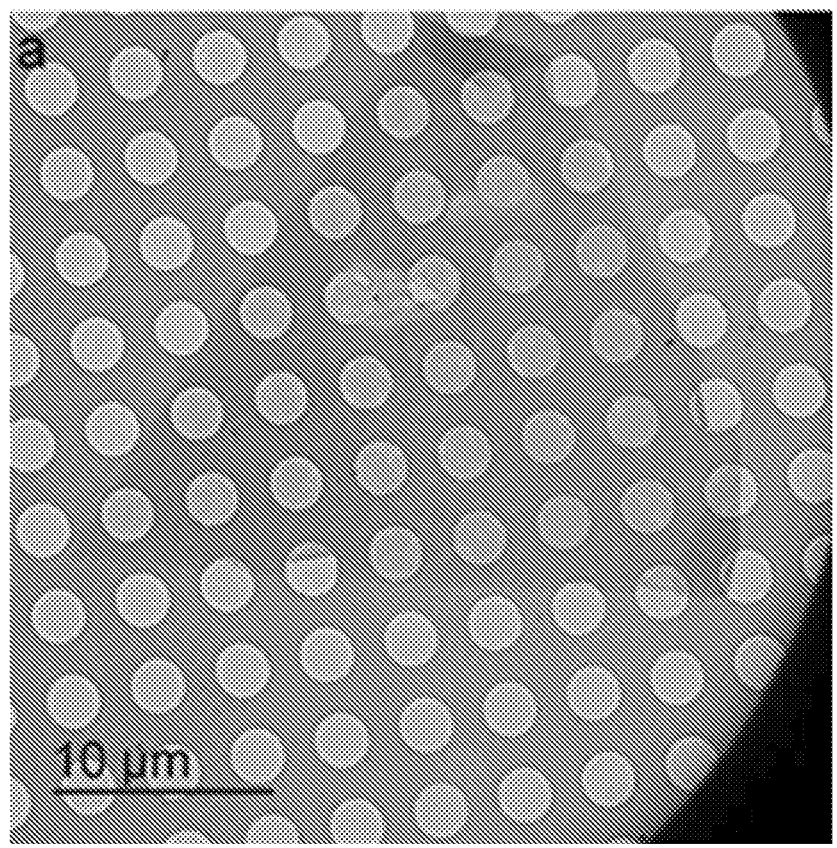
FIG. 10A (TEM image) shows a first perspective of a $Bi_2Se_3/WS_2$ 2D heterostructure.
Figure 10B:
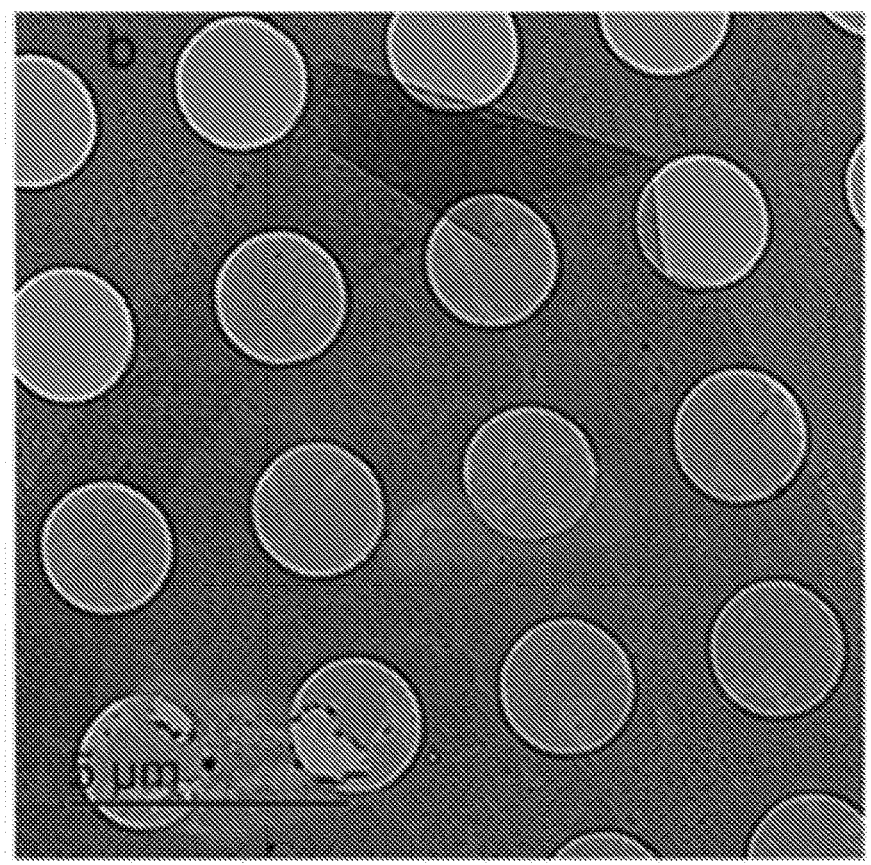
FIG. 10B (TEM image) shows a second perspective of the $Bi_2Se_3/WS_2$ 2D heterostructure shown in FIG. 10A.
Figure 10C:
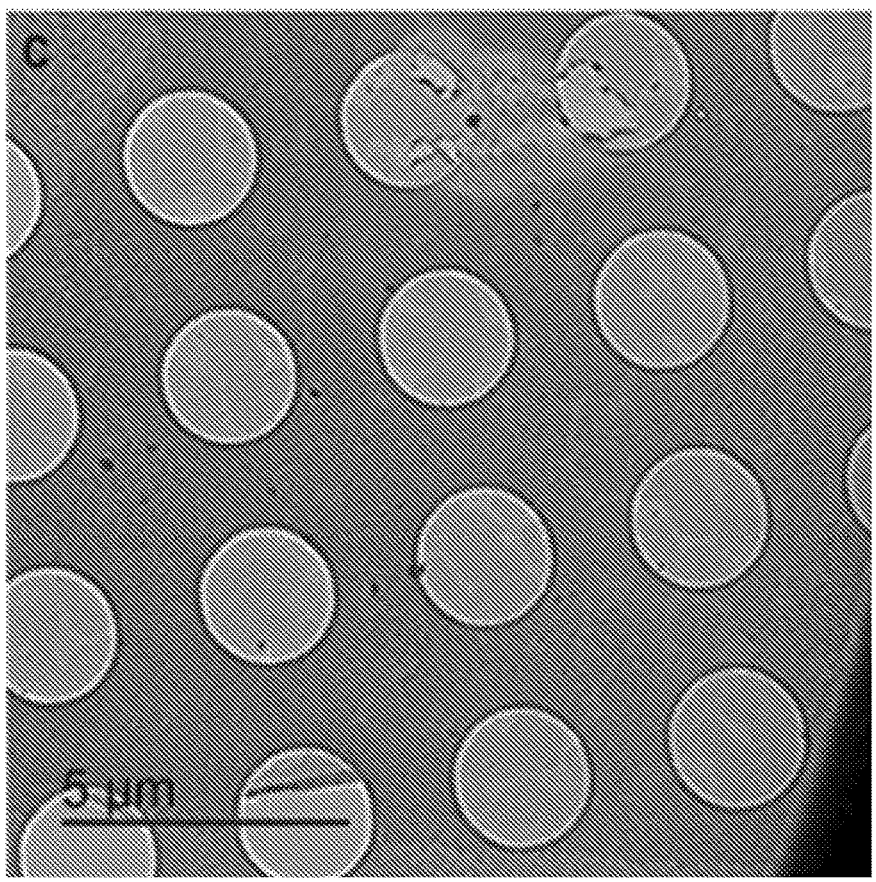
FIG. 10C (TEM image) shows a third perspective of the $Bi_2Se_3/WS_2$ 2D heterostructure shown in FIG. 10A. The blemish on the heterostructure at the top of FIG. 10C is due to laser treatment.
Figure 10D:
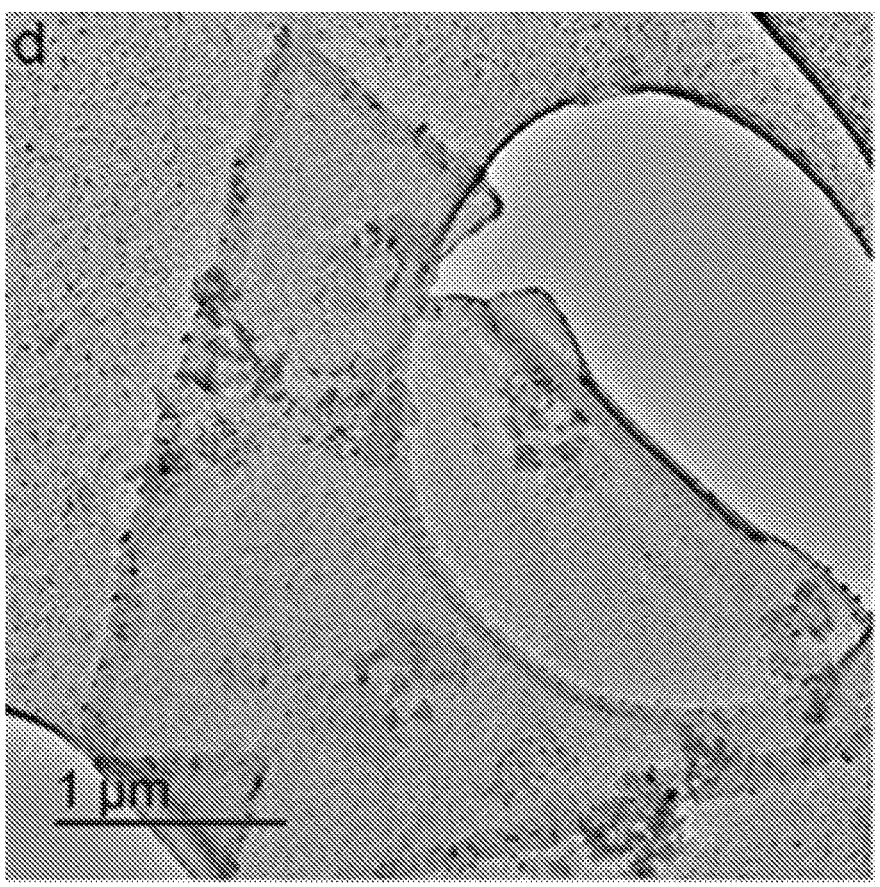
FIG. 10D (TEM image) shows a $Bi_2Se_3/MoSe_2$ 2D heterostructure.
Figure 10E:
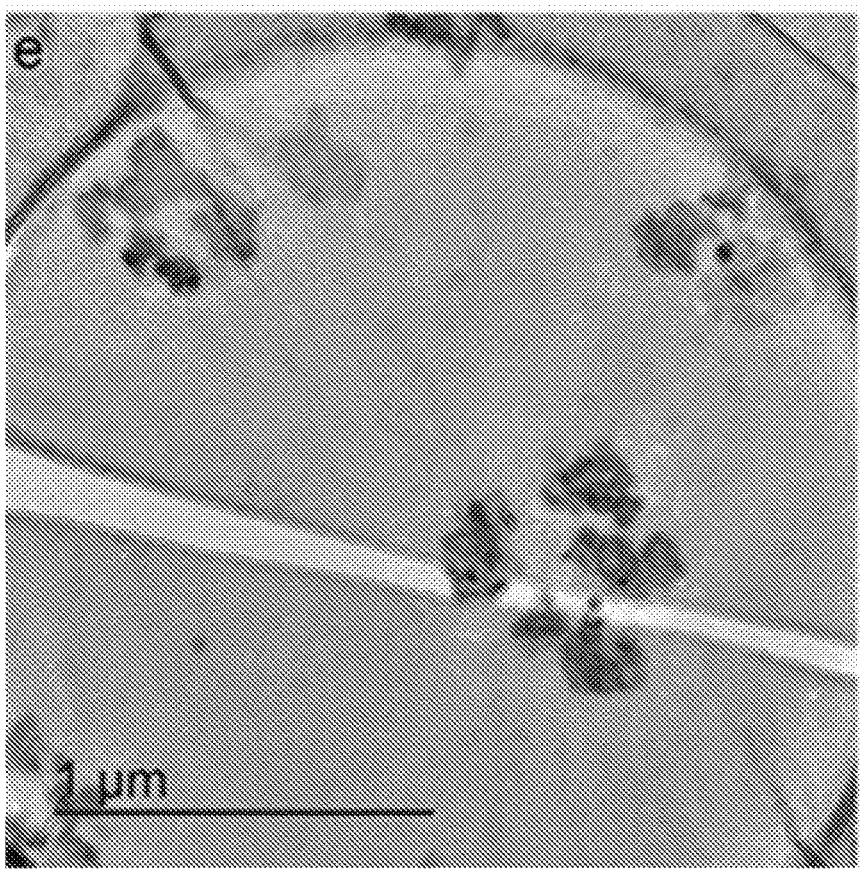
FIG. 10E (TEM image) shows a $Bi_2Se_3/MoS_2$ 2D heterostructure.

TEM images of a $Bi_2Se_3WS_2$ 2D heterostructure are shown in FIGS. 10A-10C. The blemish on the heterostructure at the top of FIG. 10C is due to laser treatment. TEM images of a $Bi_2Se_3/MoSe_2$ 2D heterostructure are shown in FIG. 10D, and TEM images of a $Bi_2Se_3/MoS_2$ 2D heterostructure are shown in FIG. 10E.

Once the grid was inside the TEM, a heterostructure suspended over a hole was found, zoomed-in, and then focused. Then the 200 nm-diameter aperture was inserted and TEM was switched to SAED mode. Then the brightness was decreased to the lowest value, and an SAED image was taken. To EBT the 2D heterostructure, the brightness knob was rapidly increased, while maintaining the focus, until the desired value was obtained. The brightness was maintained for the desired length of time as instructed by the recipe. After the recipe completion, the brightness was rapidly diminished while maintaining focus. The operator had the phosphorous screen lowered throughout the entire evolution and observed the SAED pattern carefully. The pattern did not change as the brightness was rapidly increased or decreased, verifying that the imaged location did not shift. Once the brightness was restored to its lowest value and the image focused, the screen was raised and an image was taken. This process allowed snap-shots of the EBT induced structural rearrangement to be observed.

The movement of the SAED spots would be demonstrated best by taking a movie of the SAED pattern while EBT was being applied; however, this was not possible with the TEM used in this work (JEOL 2010F). The TEM camera is exceptionally sensitive, limiting the exposure time to one second and the current density to the lowest value. The EBTs are not allowed while the camera is imaging. A phosphorous screen was lowered to block the electron beam while EBTs were applied, allowing the crystal's reaction to be observed and recorded by the TEM operator. At periodic intervals the operator would decrease the beam current, restore identical imaging settings, and record an SAED pattern, thereby documenting snap-shots of the EBT-induced changes.

The SEM EBT studies were done on the $SiO_2$ wafer that the 2D heterostructures were grown on, with no transferring needed. Once inside the SEM, the SEM was zoomed-in and focused until near the desired recipe, and pictures were taken. Once ready for the EBT recipe, the accelerating voltage was modified and an area was scanned. The scanned area was calculated using the equations shown below to ensure that the electron beam current density was being applied. In the equations used to calculate the electron beam dosing density, the beam current increases slightly with increasing accelerating voltage. Example values are 152.8 pA, 157.3 pA, and 160.2 pA for 5 keV, 5.5 keV, and 6 keV, respectively. More specifically, by modulating the area being scanned, the EBT current density was modulated. After applying the EBT, the SEM scanning location was moved to a different part of the $SiO_2$ wafer for ~20 minutes to allow for the 2D heterostructure to discharge. After ~20 minutes, the SEM imaged the same area with the same settings.

$$\text{Electron beam dosing density} = \frac{\text{Beam current}}{\text{Surface area}} * \text{Time} * \text{Acceleration voltage}$$

$$\text{Electron beam dosing density} = \frac{152.8 \text{ pA} * 60 \text{ } s * 5 \text{ } k}{\text{Surface area}} = \frac{4.58 \times 10^{-5} \text{ } J}{\text{Surface Area}}$$

Figure 9A:
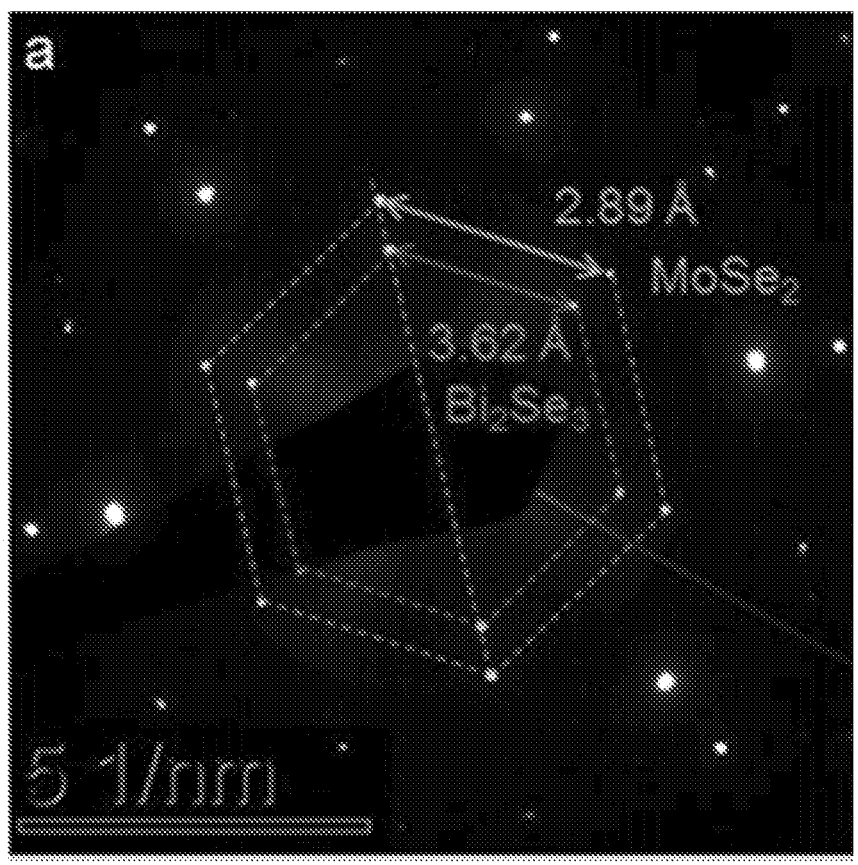
FIG. 9A shows TEM SAED patterns of $Bi_2Se_3/MoSe_2$ 2D heterostructure.
Figure 9B:
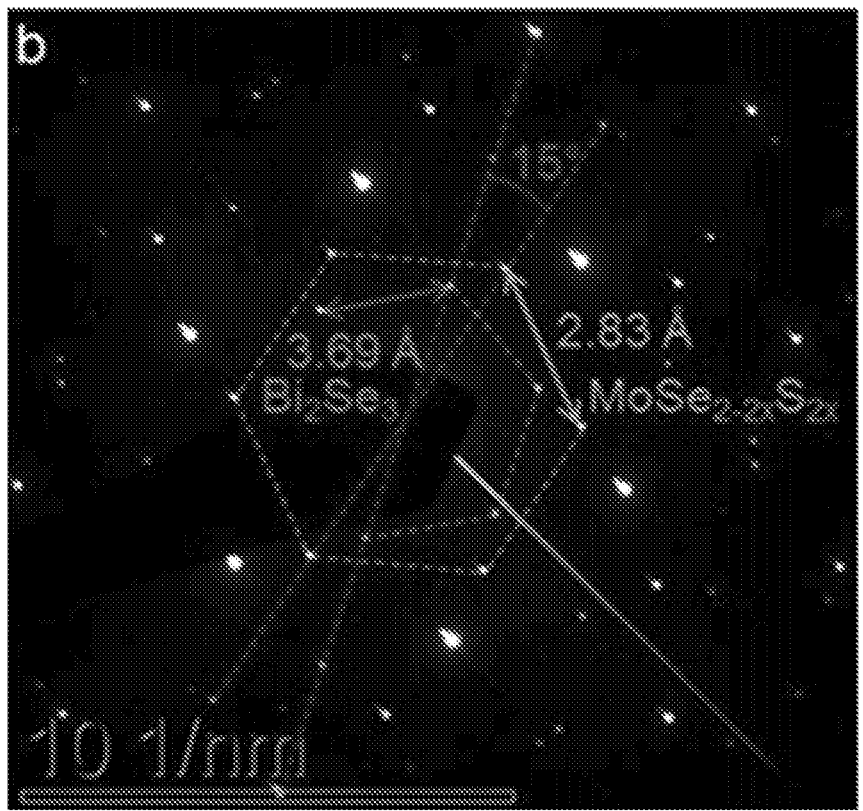
FIG. 9B shows TEM SAED patterns of $Bi_2Se_3/MoSe_{2-2x}S_{2x}$ 2D heterostructure.
Figure 9C:
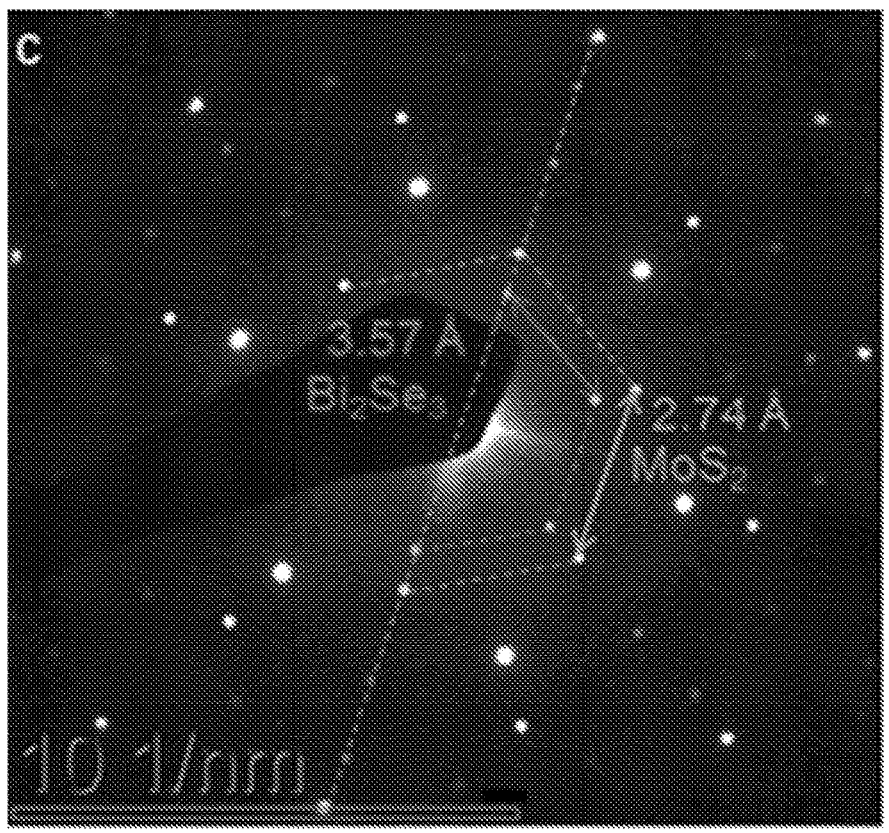
FIG. 9C shows TEM SAED patterns of $Bi_2Se_3/MoS_2$ 2D heterostructure.
Figure 9D:
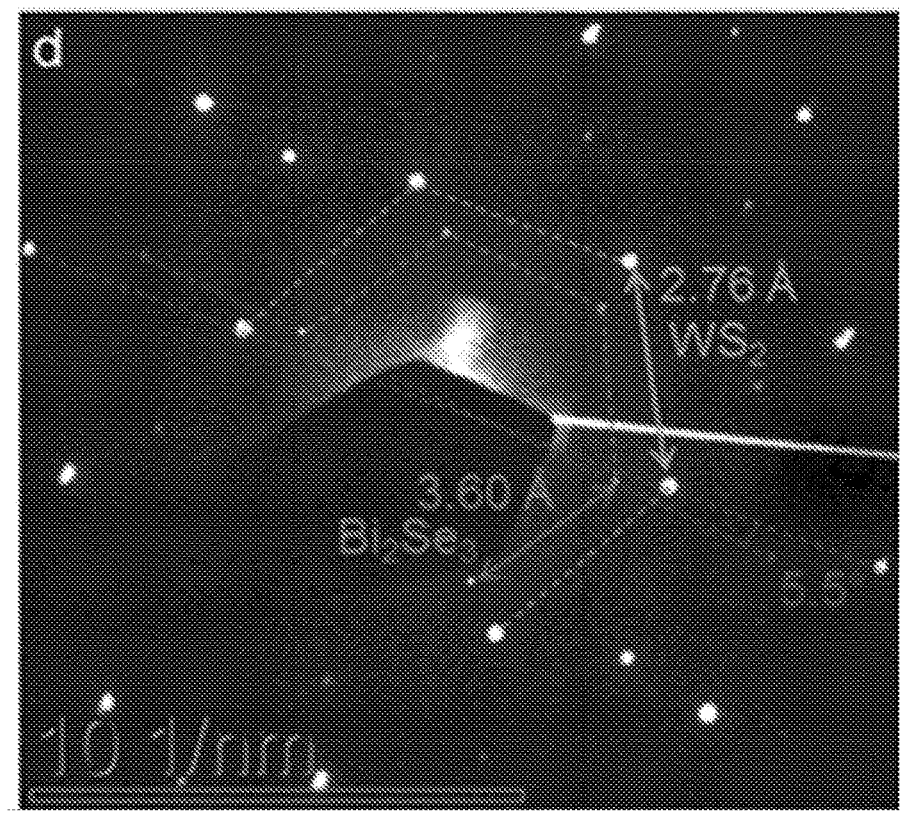
FIG. 9D shows TEM SAED patterns of $Bi_2Se_3/WS_2$ 2D heterostructure.
Figure 9E:
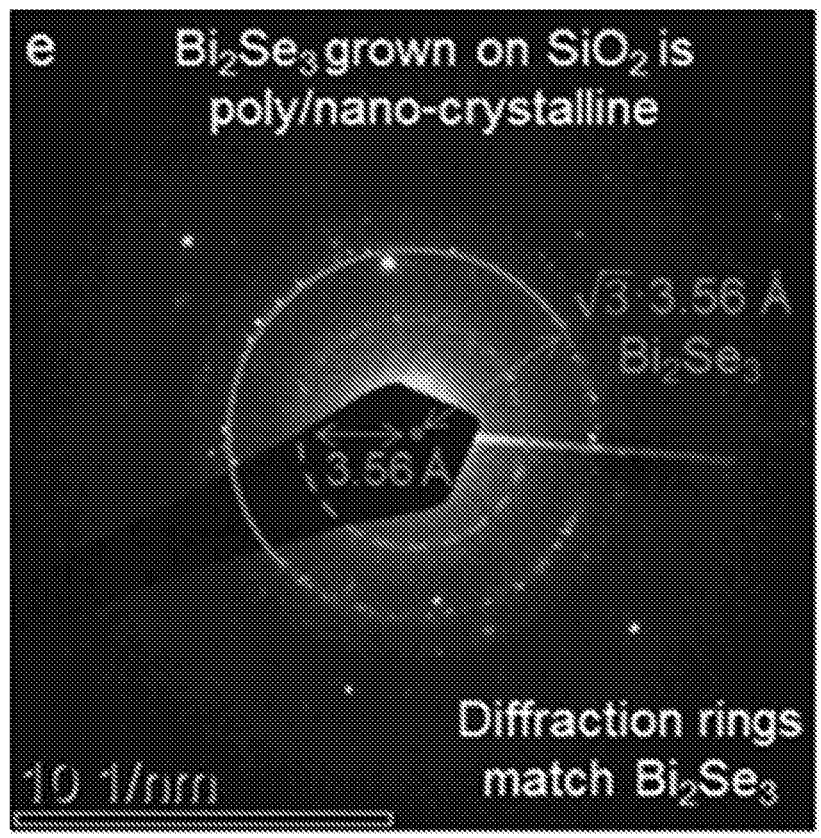
FIG. 9E shows TEM SAED patterns of $Bi_2Se_3$ grown on $SiO_2$.

TEM SAED patterns were measured for the various heterostructures. FIG. 9A shows the TEM patterns of $Bi_2Se_3/MoSe_2$ 2D heterostructure. FIG. 9B shows TEM SAED patterns of $Bi_2Se_3/MoSe_{2-2x}S_{2x}$ 2D heterostructure. FIG. 9C shows TEM SAED patterns of $Bi_2Se_3/MoS_2$ 2D heterostructure. FIG. 9D shows TEM SAED patterns of $Bi_2Se_3WS_2$ 2D heterostructure. FIG. 9E shows TEM SAED patterns of $Bi_2Se_3$ grown on $SiO_2$.

FIG. 13 shows in-situ crystal manipulation of $Bi_2Se_3/MoSe_2$ using an electron beam after transferring a $Bi_2Se_3/MoSe_2$ 2D heterostructure to a TEM grid and laser treating. The laser treatment disrupted the heterostructure enabling the demonstration that the heterostructure can be annealed using an electron beam. A high current density was applied to the heterostructure. Instead of becoming more polycrystalline as seen with $Bi_2Se_3/MoSe_2$ and $Bi_2Se_3/WS_2$, the heterostructure was annealed, suggesting $Bi_2Se_3/MoSe_2$ has a stronger interlayer interaction than the other heterostructures. FIG. 13 demonstrates that both the $Bi_2Se_3$ and the $MoSe_2$ are annealed. Additionally, the smaller $MoSe_2$ grains cease to anneal into the large crystal, and oscillate near their current angle, suggesting those grains are in and that angle is a semi-stable location.

The electron beam treatment (EBT) was shown to induce texture and work function changes. In FIG. 14, the texture and work changes are demonstrated in an image of $Bi_2Se_3/MoSe_2$ integrated over an area marked by the gray line centered on the image. The central line was integrated over to produce the brightness/texture curve as a function of distance, which is shown above the image inside the black-bordered box. Looking at the brightness/texture curve, It can be seen that the middle looks "melted" with larger grains, compared to the undisturbed, as-grown areas outside the box. This is reflected in the curve where the EBT area is smoother and contains three broad peaks (downward pointing arrows), whereas the as-grown areas (brackets on both sides) have more noise and contain only one broad peak (left side). These differences suggest EBT modifies the structure.

FIG. 15 demonstrates that EBT induces a new broad PL peak ($Bi_2Se_3/MoSe_2$) centered about 1.9-2.2 eV. The new broad PL peak corresponds to previously reported $Bi_2Se_3$ nanoparticles, suggesting that high-dose EBT induces the formation of $Bi_2Se_3$ nanoparticles. Laser treatment diminishes the PL intensity, suggesting that the nanoparticles are metastable, and when perturbed by a laser, they will morph into a structure that has a less intense PL. More specifically, when treating $Bi_2Se_3/MoSe_2$ for 3 minutes at ~19.7 $A \cdot m^{-2}$, changes were observed at accelerating voltages greater than 5.5 keV ($2.01 \times 10^7$ $J \cdot m^{-2}$), and no changes were observed at 5 keV ($1.78 \times 10^7$ $J \cdot m^{-2}$).

After EBT, Raman spectra of $Bi_2Se_3/MoSe_2$ were collected. Since collecting Raman spectra requires higher laser powers, the sample was also laser treated at the same time. It can be seen from FIG. 15 that laser treatment diminishes the $Bi_2Se_3$ nanoparticle PL, indicating the $Bi_2Se_3$ is being modified by the laser power. In FIG. 16A, the $Bi_2Se_3$ and $MoSe_2$ Raman peaks are significantly weakened ($240 cm^{-1}$ and below) compared to the silicon peak ($520 cm^{-1}$), suggesting that the crystal order of both materials has been disrupted. In FIG. 16B, the Raman spectra of one layer of $MoSe_2$ and 1-2 layers of $Bi_2Se_3$ grown on $MoSe_2$ are compared. The strength of the A1 peak is several times that of the silicon peak, and the $Bi_2Se_3$ peaks are comparable to the silicon peak, indicating that both the $MoSe_2$ and $Bi_2Se_3$ are well-formed crystals. The change in relative peak intensity between the heterostructure and silicon due to EBT indicates that the EBT disrupts the crystal.

Monte Carlo Simulations described in FIGS. 11A-11C and FIG. 12

Monte Carlo simulations were done using Matlab software by MathWorks. 151 bins were made representing the possible number of twist angles, which was 0-30° at increments of 0.2°. Then a specific number of points were randomly assigned a twist angle and placed inside one of the bins. The number of points assigned a twist angle was dependent on the number of experimental points in the histogram. 4-sigma criteria were applied to determine whether a bin was statistically significant. The simulations were run 1,000,000 instances.

Oxygen-Induced In-Situ Manipulation of Exciton Recombination Pathways in 2D heterostructures The oxygen-affinity of $Bi_2Se_3$ can be used to obtain highly controllable, reversible, and site-selectable switching between direct (i.e. radiative and photoluminescent) and indirect (i.e. non-radiative) exciton-recombination pathways in $Bi_2Se_3$/TMD heterostructures. Our approach allows permanent, in-situ, electrode-less, and use-specific programming of both radiative exciton population and recombination energy values. To demonstrate this, the inventors have directly synthesized an entire family of 2D vertical heterostructures consisting of mono/bi-layers of $Bi_2Se_3$ grown on top of several monolayer TMDs ($WS_2$, $MoSe_2$, and $MoS_2$) and a TMD alloy ($MoS_{2x}Se_{2-2x}$).[15] Exciton recombination dynamics in the entire TMD samples could be switched (between radiative and non-radiative) by annealing the heterostructures in oxygen-present (e.g. air) vs. inert atmospheres (i.e. Ar, He, Rd, Ne, Xe, or $N_2$). Alternately, the switching could be localized in a highly controllable manner at ambient temperatures using a focused laser (as before, in air or under $N_2$), which allowed site-selective reversible manipulation of different regions of the same 2D heterostructures. Additionally, our results suggest that these 2D heterostructures can be used as standard temperature-pressure high-density oxygen storage devices, potentially storing 69 kg/m³ (a factor of 52 times the density of $O_2$ gas at 1 atm).

Oxygen can play a critical role in manipulating the recombination pathways. Our experiments and DFT calculations suggest $O_2$ intercalates between the $Bi_2Se_3$ and TMD layers, disrupting the interlayer bonding and inducing the materials to behave electronically independent.

FIG. 17A shows an optical image of monolayer $MoSe_2$ grown on $SiO_2$ using vapor-phase chalcogenization (VPC).[16] FIG. 17B shows a $Bi_2Se_3$/$MoSe_2$ vertical heterostructure, where 1-2 layers of $Bi_2Se_3$ were uniformly grown on top of the TMD (see AFM image in FIG. 17C). FIG. 17D is a side-view diagram of a typical $Bi_2Se_3$/TMD. Despite the huge lattice mismatch (e.g. 2.84A to 3.70A, see FIG. 17E), uniform 1-2 layers of $Bi_2Se_3$ grow with high regularity on top of all the TMDs, suggesting strong van der Waals epitaxy-mediated growth between the two component layers.[17] FIG. 17E shows a TEM diffraction pattern taken from a $Bi_2Se_3$/$MoSe_{2(1-x)}S_x$ alloy heterostructure. The van der Waals (vdW) epitaxy is evident in this figure, as $Bi_2Se_3$ appears to have grown everywhere along a preferred 15° angle with respect to the underlying alloy crystal direction, despite the giant lattice mismatch. FIG. 17F shows the transfer characteristics of back-gated monolayer $MoS_2$ and $Bi_2Se_3$/$MoS_2$ FET devices. Although both devices show n-type transistor behavior, the right-shift of the threshold gate voltage in the heterostructure indicates a relative downshift of the effective Fermi level from the bottom of the $MoS_2$ conduction band, into the band-gap of the heterostructures due to reduction of excess n-type carriers (by about $\sim 9.50 \times 10^{12}$ cm$^{-2}$), suggesting that the band alignment of the layers allow transfer of excess electrons from the TMD to the $Bi_2Se_3$ sub-lattice.

FIG. 18A (top image) is the same heterostructure as shown in FIG. 17B after being laser-treated in air (air-LT) at multiple locations (note the color change in top image), and FIG. 18A (bottom image) is after annealing the same heterostructure in flowing Ar for 3 hours at 240° C. (note the laser-treatment induced color changes are no longer present in bottom image). Similar changes were observed in all heterostructures tested, and the change/recovery cycle could be repeated multiple times (FIG. 21E). Detailed investigations in different gas environments establish that the optical changes from laser-treatment in air are brought about solely by oxygen ($O_2$), and not by nitrogen, $H_2O$ vapor, or carbon dioxide.

Photo-excited e-h pairs in mono-layered TMDs form tightly-bound neutral and charged excitons.[1] In direct-gap monolayer TMDs, they recombine radiatively, producing the PL peaks observed (FIG. 18B). In few-layered and thicker TMDs the quasiparticle band gaps are indirect, hence the $K \rightarrow \Gamma$ indirect (non-radiative) recombination pathway becomes more favorable, resulting in progressively suppressed PL.[18] Indirect recombination in certain heterostructures can similarly be non-radiative, if the excitons formed near a $\vec{k}$-vector in the reciprocal lattice of one layer finds the most favorable recombination pathway via a lower-energy-state that is located at a different $\vec{k}$-point in the reciprocal lattice of the second layer. FIG. 18B (top and bottom panels) shows the PL spectra measured in representative heterostructures (as grown and air-laser-treated). In all our as-grown heterostructures, exciton recombination was non-radiative, and the PL spectra were strongly quenched, possibly due to band alignment of the layers facilitating the transfer of electrons from the TMD to the $Bi_2Se_3$. Upon laser-treatment in air, all heterostructures recovered their radiative recombination pathways (identifiable by the position of their PL spectra as seen in FIG. 18B). And finally, the PL could be quenched again by annealing in an $O_2$-free environment. The quenched, recovered, and re-quenched behaviors were reproducible in all as-grown, laser-treated, and annealed heterostructures, respectively. To our knowledge, this is the first demonstration of a family of semiconductor heterostructures whose photoluminescence can be reversibly tuned in such a controllable manner, in-situ, and over such a wide range of photon energies (1.5 eV<$E_{ph}$<2 eV).

FIGS. 19A-19C outline the precise location, size and degree of PL-switching achievable in the heterostructures. FIG. 19A shows the optical image where laser spots were used to trace the letters "NEU" using different exposure times. The laser-written sample was then imaged using a fluorescence microscope (FIG. 19b, $\lambda_{ex}$=488 nm). The fluorescence image demonstrates site-selective light emission with a spatial size close to that of the incident laser spot, enabling photoluminescing pixels (PLPs) tailored down to sub-micron diameters. These site-programmable, color-selectable, atomically-thin, micron-scale PLPs (with effective volumes $\sim 10^{-21}$ m³) are attractive for optical and optoelectronic applications that require ultra-small form-factors. FIG. 19C shows the variation of PL intensity measured after repeated doses (t=6 s) of combined exposure to air (at ambient pressure) and laser power (at 50 µW).

At this dose-value, the PL was found to grow approximately logarithmically with combined exposure (along with incident energy or even with the number of photons). The inset shows that these changes can be executed with intensity-changes ($\Delta I_{PL}$) as low as ~5%, suggesting possible applications as low-cost atomically-thin laser calorimeters or photon-counters. Analysis of the PL spectra provides a broader context for the air-laser-induced changes within the encapsulated TMD films under $Bi_2Se_3$. Owing to the possibility that both the population of radiative excitons, as well as the value of their recombination energy (i.e. $E_{ph}$, the energy of the emitted photons) can be manipulated by external probes, 2D materials have become extremely attractive for atomically-thin and tunable functional components in LEDs and lasers,[3], [19] optical modulators,[20] photonic crystals,[19], [20] and optical resonators.[10], [19] In the presence of applied electrical,[1], [21], [22] optical,[23] mechanical[24] and magnetic fields,[25] the excitonic populations and recombination energy values can be manipulated; however, the changes vanish when the fields do. In contrast, our chemical approach allows permanent, in-situ, electrode-less, and use-specific programming of both radiative exciton population and recombination energy values. FIG. 20A shows a typical PL peak arising from two known excitonic contributions (A exciton and A⁻trion) in the $Bi_2Se_3/MoS_2$ heterostructure. FIGS. 20B-20E show the variation peak amplitudes and recombination energies of the A exciton and A⁻trion for a range of laser-treatments (in air). In addition to the 16×-18× change in the population of radiative excitons, there is a large (up to ~35 meV) shift of the excitonic recombination energies. This reflects a significantly larger degree of manipulation compared to some of the previously-reported approaches,[1], [7], [9], [10], [26] suggesting sizable changes in the electronic behavior of the heterostructure. Specifically, the recombination energy for excitons (as measured using PL spectroscopy) is $E_{ph}=E_g-E_b^{(1)}$, where $E_g$ is the quasi-particle band gap of the heterostructure, and the ground-state binding energy $E_b^1$ is given by $$E_b^1 = \frac{2\mu e^4}{\hbar^2 \varepsilon^2},  \quad [27]$$

where $\varepsilon$ is the dielectric constant of the surrounding medium, and $\mu=1/(m_e^{-1}+m_h^{-1})$ is the reduced mass of the e-h system. From this formalism, the inventors conclude that laser-treatment in air imparts large changes to either: (i) the band gap and/or (ii) the binding energy of the excitons. In previous reports, large changes in exciton binding energies have been attributed to changing dielectric environments. [25], [26], [28] In our heterostructures, the overall changes reflected both red and blue shifts in the excitonic energy values, suggesting that multiple competing mechanisms could be present.

The inventors next demonstrate how the switching of exciton recombination pathways is affected by switching the ambient chemical environment under unchanged laser exposure. FIG. 21A (top panel) shows the optical image of a $Bi_2Se_3/MoS_2$ heterostructure that was air-laser-treated using a high-power recipe for several minutes (8 min. exposure, 1.3×10⁷ Langmuir-Watts). The arrow points to the laser-exposed spot identifiable by its changed color, and FIG. 21A (bottom panel) shows its PL spectra before and after air-LT.

A different spot on the same sample (FIG. 21B, arrow) was exposed to the same high-power recipe, while being continuously purged with $N_2$ gas ($N_2$-LT, inset image FIG. 21B), thereby removing oxygen from the vicinity of the exposed spot. The inventors find that even with an increased laser dose (12 min. exposure), there was neither a perceivable color change, nor emergence of the PL peak (FIG. 21B, bottom panel) under $N_2$-LT. Following this experiment, when the same spot was subjected to air-LT, it again resulted in a color-change (arrow, FIG. 21C, top panel) and a strong PL peak recovery (FIG. 21C, bottom panel), confirming that oxygen plays a critical role in the observed changes. Any possible role of humidity or $CO_2$ was ruled out by a sequence of experiments performed in a dry $N_2+O_2$ mixture, and $N_2$ with saturated $H_2O$ vapor. By comparing the PL-recovery in air vs. in $N_2$, FIG. 21D clearly brings out how the suppression of PL-recovery in $N_2$ environment is independent of the LT-dosage, over a wide range of doses, and the presence of oxygen plays a critical role in facilitating the observed optical changes.

Remarkably, N2-LT can not only suppress any PL recovery, it can also "deoxygenate" the system and drive it back to the PL-quenched state. FIG. 21E shows the change in PL intensity in a $Bi_2Se_3/MoS_2$ heterostructure that is first oxygenated using air-LT, and then de-oxygenated using $N_2$-laser-treatment, demonstrating controllable switching between radiative and non-radiative exciton recombination pathways. This process can be cycled several times as shown in FIG. 21E, underscoring the fact that at the initial stage, under identical laser power, the oxygenation is reversed by the mere removal of the $O_2$ partial pressure in the ambient. This indicates that at least initially, the oxygenation process is diffusive and does not form chemical bonds. After a few cycles, the maximum PL intensity grows by as much as 215× and stops quenching fully, suggesting that other more permanent changes occur at higher LT dosage as discussed below.

ARPES measurements have shown that under very low exposures (<0.1 Langmuirs), oxygen inclusion hole-dopes ultraclean $Bi_2Se_3$ samples.[11] However, the exposure level in our system is ~10⁹ orders of magnitude larger, and so the inventors don't expect doping to be a dominant cause behind the observed switching of recombination pathways. The reversible and diffusive behavior at lower exposure ranges suggests oxygen insertion through possible defects in the $Bi_2Se_3$ layers. However, such insertion alone might not be sufficient to accomplish the dramatic electronic changes observed (e.g. over two orders of magnitude change in radiative exciton population). At the same time, oxygen has been shown to easily intercalate between 2D crystals and their substrates, decoupling the two materials and inducing them to behave more "freestanding" (i.e. electronically independent).[29]-[35] DFT calculations of a $Bi_2Se_3/MoS_2$ heterostructure predict that intercalated $O_2$ molecules force the materials apart, enlarging the interlayer separation, thereby diminishing their interlayer hybridization (FIGS. 22-23). Furthermore, intercalation is a diffusive process that has been shown to be reversible,[31], [33]-[35] which could explain why annealing or laser-treating in an $O_2$-free environment is able to reverse the changes. $O_2$ diffusion might be facilitated through the LT induced break-down of $Bi_2Se_3$ into smaller grains, and the subsequent increase in grain boundaries (Tl.3). Such a structural change that facilitates $O_2$ diffusion is in agreement with the rapid reversal in PL intensity and subsequent memory of previous LTs (FIG. 21E). Hence, the inventors believe that under low exposure, the recombination pathway switching is due to defectassisted diffusion and intercalation of oxygen between the $Bi_2Se_3$ and TMD layers, thereby changing the interlayer interaction. At higher oxygen exposures, irreversible chemical bonds might start to form, leading to oxides of bismuth and selenium (Tl.9). Both of these oxides have very large band gaps,[13] and hence could easily prevent any charge-transfer from the $MoS_2$ layer (e.g., by straddling the $MoS_2$ optical/excitonic band gap). However, the high powers used in FIG. 21E are not likely to anneal the heterostructure, or anneal it so rapidly. This work both builds upon fundamental science surrounding interlayer interactions in 2D heterostructures, as well as demonstrates novel capabilities with a direct connection to real-world applications.

It was concluded that the $Bi_2Se_3$/TMD system is complex and requires further in-depth experimental and computational investigations that explore the competing mechanisms discussed above. From a fundamental perspective, in addition rich excitonic physics, this system interplays strong spin-orbit coupling in non-centro-symmetric crystal structures, and hence could potentially demonstrate novel correlated, spin and valley physics.[36]-[38] In addition, as site-programmable, color-selectable, atomically-thin, micron-scale and intensity-tunable photoluminescing pixels, this system could be attractive for ultrathin and flexible optical information storage devices, color converters, microcavity-lasers, and other photonic, plasmonic and optoelectronic applications.[5], [10], [19], [20] The strong oxygen-selectivity of these heterostructures could also be potentially used as low-cost oxygen-sensors and photon/power meters. The inventors also showed data that suggested these materials could be used as $O_2$ storage devices, potentially storing 69 kg/m³ (a factor of 52 times the density of $O_2$ gas at 1 atm). Hence, the inventors believe our work paves the way for rich new science and technology research.

Annealing Experiments

All annealing experiments were performed between 240-245° C. for 3 hours. All experiments used a flow rate of 3 SCCM, except the annealing under air, where no flow rate was used. The five environments were pure Ar, pure $N_2$, $N_2+H_2O^{vapor}$, dry air (21% $O_2$ and 79% $N_2$), and air. All setups, except $N_2+H_2O^{vapor}$, were pumped down and filled with the respective gas prior to annealing. The $N_2+H_2O^{vapor}$ environment was created by flowing $N_2$ at 3 SCCM, while several boats with deionized $H_2O$ were present in the tube. The heating of the tube caused the $H_2O$ to evaporate. The downstream side "rained" significantly during the entire annealing process and $H_2O$ was still present in most of the boats, verifying that sufficient $H_2O^{vapor}$ was present throughout the annealing process.

Device Fabrication $Bi_2Se_3/MoS_2$ heterostructures grown on 285 nm $Si/SiO_2$ were transferred to an identical chip, that had titanium/gold markers, by PMMA transfer method. First, PMMA C4 was spin coated at 4000 rpm for 60 s and baked 180 C for 1:30 min. Then the chip was immersed in 1 M KOH solution for 4 hours. Obtained PMMA and heterostructure film transferred to new substrate. This was followed by acetone and IPA cleaning to remove PMMA residues.

FET devices were made on 285 nm $Si/SiO_2$ substrate by E-beam lithography using PMMA C4 or A4. The electrodes (5 nm Ti/50 nm Au) were deposited by e-beam evaporator with rate deposition 1 and 3 Å/s, respectively. Lift off process was performed with acetone followed by IPA cleaning.

Instrumentation

Raman and PL spectra were measured using a Renishaw Raman microscope equipped with a 488 nm laser and a grating of 1800 lines/mm. A ×100 or ×150 objective focused the laser to diffraction-limited spot size. TEM images and SAED patterns were collected from a JEOL 2010F operated at 200 kV. AFM images were taken from a NanoMagnetics Instruments Ambient AFM. All Raman, PL, AFM, and UV-Vis experiments were performed under ambient conditions.

Computational Details

Ab initio calculations were carried out by using the pseudopotential projector augmented-wave (PAW) method [39] implemented in the Vienna ab initio simulation package (vasp) [40], [41] with an energy cutoff of 420 eV for the plane-wave basis set. Exchange-correlation effects were treated using the generalized gradient approximation (GGA) [42], and van der Waals corrections were included using the DFT-D2 method of Grimme [43], where a 7×7×1 Γ-centered k-point mesh was used to sample the Brillouin zone. A large enough vacuum of 15 Å in the z-direction was used to ensure negligible interaction between the periodic images of the films. All the structures were relaxed using a conjugate gradient algorithm with an atomic force tolerance of 0.05 eV/Å and a total energy tolerance of $10^{-4}$ eV. The spin-orbit coupling effects were included in a self-consistent manner.

Explanation of Possible Radiative and Non-Radiative Exciton Recombination Pathways The material changes its behavior dependent on both the power density applied (Watts/meter) and the time (seconds). There appears to be both a minimum power density, and a minimum total energy (Joules) before changes are affected. The inventors believe this is because the material response is dependent on its temperature. For example, if the sample was put on a cold plate, higher power densities and longer times could be used before changes are affected. Conversely, heating the material will induce changes at earlier power densities and times.

At 22° C. and in normal atmospheric conditions to determine a minimum range, applying standard lithography energy densities of 8.5 mW/cm² show no noticeable effects and do not appear to affect a sample ($Bi_2Se_3/MoSe_2$). Changes to the material appear to start near 10,000 mW/cm2 in atmospheric conditions, when using a 488 nm laser. While subjecting the material to a power density (and photon-energy-spectrum) similar to that used in the photolithography community (i.e., a mercury lamp), the material produces a clear and bright photoluminescence, where edges can be discerned close to a 600 nm resolution. Images were taken with one second exposures.

Treating the materials (i.e., exposing to a certain power density for a certain time in an atmosphere with a certain amount of time) will affect not only the photoluminescence intensity, but will also affect the position of the photoluminescence peak (i.e., the photon energy, which is the color emitted). The photoluminescence peak can be captured up to 5,000 counts (×500 above the noise floor) with sub-micron precision by exposing the area probed to 1,400mW/cm2 for 15 seconds. The photoluminescence peak position can be used to further store data, beyond the photoluminescence intensity.

These calculations assume $MoSe_2$ is the material; however, the other materials (i.e., $WS_2$, $MoS_2$, and $MoSe_{2(1-x)}S_{2x}$-alloy) can have photoluminescence much brighter. Data has shown that $WS_2$ will have a photoluminesce intensity that is approximately ×160 times brighter than $MoSe_2$, which means it needs less exposure time to take a photo with the same information, and it has a greater range for storing information (i.e., more information can be stored if the range is higher).

This family of 2D heterostructures has produced intriguing data that speaks both to the promising applications, as well as the complexity of the underlying science. There are a number of established mechanisms in peer-reviewed literature that may apply because they are in agreement with portions of the data. To the best of our knowledge, our system has multiple competing mechanisms that are taking place to produce the observed behavior.

Below the inventors describe the strengths and weaknesses of a variety of mechanisms that could be present, and then highlight the ones the inventors believe play a primary role. To best convey the observations, the inventors list key observations (KOs) below, followed by a discussion of the mechanisms the inventors believe could be present.

Key Observations (KOs)
1. The PL of the TMD is over 99% quenched when only one layer of $Bi_2Se_3$ is CVD grown on the TMD. One quintuple layer of $Bi_2Se_3$ is not thick enough to reflect or absorb the incoming and outgoing photons, meaning the $Bi_2se_3$ introduces a non-radiative electron-hole recombination path.
2. Several changes are induced from air-laser-treatment:
   a. PL intensity will increase.
   b. PL intensity can be precisely tuned (i.e. recovered with high control) over several orders of magnitude.
   c. Affected regions undergo a perceived color change, appearing brighter and with less contrast, compared to as-grown heterostructures.
   d. PL peak position is in the same location as the monolayer TMD's PL peak position from pre-$Bi_2Se_3$ growth, strongly indicating that the recovered PL observed is from the excitons and trions in the TMD. This would indicate that air-laser-treatment removes the non-radiative electron-hole recombination pathway, allowing the excitons and trions to recombine at the K-point in the TMD, where it is direct bandgap.
   e. Exciton and trion peak positions undergo a massive shift (~10 meV) to lower energies. The PL peak shifts as well (FIG. 15).
   f. Laser-treatment recipe (i.e. laser-power and time interval) will affect the rate of change of the PL intensity and peak position shift.
   g. The Raman response changes with air-laser-treatment. The TMD's peaks increase in intensity, indicating that it has decoupled from the $Bi_2Se_3$ and behaves more free-standing (FIGS. 16A-16B).
3. Air-laser-treatment changes can be spatial controlled with sub micrometer precision (i.e. the laser spot size).
4. $O_2$ is required to be present in the surrounding environment for changes to be induced, meaning it reacts with the heterostructures.
5. Air-laser-treatment induced changes can be reversed by thermally annealing or laser-treating the heterostructure in an $O_2$-free environment.
6. $Bi_2Se_3/MoS_2$ heterostructures are p-type, and p-doped compared to pristine monolayer $MoS_2$.
7. Air-laser-treating does not remove the $Bi_2Se_3$ from the surface, as seen by AFM images and Raman spectra.
8. Larger air-laser-treatment doses appear to induce permanent changes that make the heterostructure more sensitive in subsequent air-laser-treatments (FIG. 21E).
9. $Bi_2Se_3$ grows crystalline and with long-range order on the TMD, suggesting strong van der Waals epitaxy-mediated growth between the two component layers, and that they couple together.
10. Density functional theory (DFT) calculations of the $Bi_2Se_3/MoS_2$ 2D heterostructure predict that intercalated $O_2$ molecules will increase the interlayer separation, disrupt the interlayer bonding, and diminish the interlayer interaction, thereby inducing the two materials to behave more "free-standing" (FIGS. 22-23).

There are three exciton recombination pathways that may be present. #1-A straddled or staggered bandgap can induce the photoluminescence quenching. Well-coupled 2D heterostructures have been shown to have overlapping bandgaps, [10s], [11s] which the inventors believe is happening when $Bi_2Se_3$ is grown on the TMDs, for reasons explained in key observation 9 (KO-9, above). There are three different types of overlapping bandgaps: broken, straddled, and staggered. Device data showed that $Bi_2Se_3/MoS_2$ is p-type, meaning the bandgap is not broken (broken bandgaps behave metallic), but is forming either a straddled or a staggered bandgap. All four TMD's studied in this work are wide bandgap compared to $Bi_2Se_3$ (>1.6 eV to ~0.3 eV),[1s] meaning both a straddled and a staggered bandgap would introduce a non-radiative electron-hole recombination pathway. Mechanism number 1 is in agreement with the PL quenching (KO-1) and why $Bi_2Se_3/MoS_2$ is p-type (KO-6), but cannot explain any other observations. However, it is not in disagreement with any of the data.

2-$O_2$ intercalates between TMD and $Bi_2Se_3$ and diminishes the interaction strength and coupling. As the heterostructure is air-laser-treated, it undergoes numerous dramatic optical and PL changes; however, the $Bi_2Se_3$ is not removed (KO-7), as shown with AFM and Raman spectroscopy (FIGS. 16A-16B). The inventors know that the mechanism is highly local and that $O_2$ is required for the process.

The inventors believe that as the heterostructure is air-laser-treated, $O_2$ intercalates into the interlayer spacing of the heterostructure (i.e. between the $Bi_2Se_3$ and TMD layers), where it disrupts the interlayer coupling, leading to the changes in properties observed. It has been shown that $O_2$ intercalating between 2D materials and their surface decouples the 2D material, making quasi free-standing.[2s]-[8s] In this case, it decouples the materials, allowing the TMD to regain the radiative recombination pathway.

Additionally, each $O_2$ molecule is only able to disrupt the interlayer coupling locally, meaning the amount of disruption in a certain area is dependent on the number of $O_2$ molecules; the more $O_2$ there is, the greater the interlayer coupling disruption. This mechanism (or radiative recombination pathway) is in agreement with numerous key observations. As the interlayer coupling is disrupted, the non-radiative e-h recombination path will no longer be allowed, permitting e-h excitonic pairs to radiatively recombine in the TMD. The amount of recovery is dependent on the amount of $O_2$ that intercalates, explaining the high control. Changing the air-laser-treatment recipe will affect the diffusion of $O_2$, thereby affecting the rate of change. As $O_2$ diffuses into the interlayer region, the environment surrounding the TMD will change, thereby altering the surrounding dielectric constant. All exciton quasiparticles emit electric field lines that affect the quasiparticle's properties, and in 2D materials, these lines exist outside of the material, making the excitons and trions highly sensitive to the surrounding environment. By increasing the dielectric constant, one increases the binding energy, thereby lowering the peak position.[12s] The perceived color change indicates the material is becoming more transparent, which could be because the interlayer bandgap is removed as the materials decouple. The changes can be reversed by annealing in an $O_2$ free environment because the $O_2$ molecules diffuse out. It has been shown that as $Bi_2Se_3$ is air-laser-treated, the $Bi_2Se_3$ will break-up into small grains. It is likely that increasing the number of grain boundaries increases the rate of $O_2$ diffusion, a fact that has been shown previously for graphene and silicene on various metal substrates.[2s]-[7s] Additionally, DFT calculations predict intercalated $O_2$ will disrupt the interlayer interaction.

3-$Bi_xO_y$ is formed during air-laser-treatment, creating a radiative recombination pathway. It is well known that bulk $Bi_2Se_3$ reacts strongly with $O_2$ to form $BiO_x$, a large-bandgap material (~2.6 eV).[13s] As $Bi_2Se_3$ is converted to $Bi_xO_y$, the band alignment will shift from a non-radiative configuration (T1.9a) to a radiative configuration, as supported in FIG. 15.

The ranges and technologies described herein can vary depending on, for example, the specific alloys used and/or combinations to make the 2D heterostructures.

While the technologies described herein have been described in conjunction with the examples outlined above, various alternatives, modifications, variations, improvements, and/or substantial equivalents, whether known or that are or may be presently unforeseen, may become apparent to those having at least ordinary skill in the art. Accordingly, the example technologies, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

As used herein, the term "about" and "approximately" are defined to being close to as understood by one of ordinary skill in the art. In one non-limiting embodiment, the term "about" and "approximately" are defined to be within 10%, preferably within 5%, more preferably within 1%, and most preferably within 0.5%.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

REFERENCES

[1] K. F. Mak et al., "Tightly bound trions in monolayer $MoS_2$," Nat. Mater., vol. 12, no. 3, pp. 207-211, March 2013.

[2] M. Amani et al., "Near-unity photoluminescence quantum yield in $MoS_2$," Science, vol. 350, no. 6264, pp. 1065-1068, November 2015.

[3] J. S. Ross et al., "Electrically tunable excitonic light-emitting diodes based on monolayer $WSe_2$ p-n junctions," Nat. Nanotechnol., vol. 9, no. 4, pp. 268-272, April 2014.

[4] A. Vargas et al., "Tunable and laser-reconfigurable 2D heterocrystals obtained by epitaxial stacking of crystallographically incommensurate $Bi_2Se_3$ and $MoS_2$ atomic layers," Sci. Adv., vol. 3, no. 7, p. e1601741, July 2017.

[5] Q. H. Wang, K. Kalantar-Zadeh, A. Kis, J. N. Coleman, and M. S. Strano, "Electronics and optoelectronics of two-dimensional transition metal dichalcogenides," Nat. Nanotechnol., vol. 7, no. 11, pp. 699-712, November 2012.

[6] S. Manzeli, D. Ovchinnikov, D. Pasquier, O. V. Yazyev, and A. Kis, "2D transition metal dichalcogenides," Nat. Rev. Mater., vol. 2, no. 8, p. 17033, June 2017.

[7] M. M. Ugeda et al., "Giant bandgap renormalization and excitonic effects in a monolayer transition metal dichalcogenide semiconductor," Nat. Mater., vol. 13, no. 12, pp. 1091-1095, December 2014.

[8] M. Palummo, M. Bernardi, and J. C. Grossman, "Exciton Radiative Lifetimes in Two-Dimensional Transition Metal Dichalcogenides," Nano Lett., vol. 15, no. 5, pp. 2794-2800, May 2015.

[9] P. Hu et al., "Control of Radiative Exciton Recombination by Charge Transfer Induced Surface Dipoles in $MoS_2$ and $WS_2$ Monolayers," Sci. Rep., vol. 6, p. 24105, April 2016.

[10] J. Xiao, M. Zhao, Y. Wang, and X. Zhang, "Excitons in atomically thin 2D semiconductors and their applications," Nanophotonics, vol. 6, no. 6, January 2017.

[11] Y. L. Chen et al., "Massive Dirac Fermion on the Surface of a Magnetically Doped Topological Insulator," Science, vol. 329, no. 5992, pp. 659-662, August 2010.

[12] Y. Zhang et al., "Crossover of the three-dimensional topological insulator $Bi_2Se_3$ to the two-dimensional limit," Nat. Phys., vol. 6, no. 8, pp. 584-588, August 2010.

[13] A. J. Green et al., "Surface oxidation of the topological insulator $Bi_2Se_3$," J. Vac. Sci. Technol. A, vol. 34, no. 6, p. 061403, November 2016.

[14] D. Kong et al., "Rapid Surface Oxidation as a Source of Surface Degradation Factor for $Bi_2Se_3$," ACS Nano, vol. 5, no. 6, pp. 4698-4703, June 2011.

[15] Q. Feng et al., "Growth of $MoS_2(1-x)Se_2x$ (x=0.41-1.00) Monolayer Alloys with Controlled Morphology by Physical Vapor Deposition," ACS Nano, vol. 9, no. 7, pp. 7450-7455, July 2015.

[16] I. Bilgin et al., "Chemical Vapor Deposition Synthesized Atomically Thin Molybdenum Disulfide with Optoelectronic-Grade Crystalline Quality," ACS Nano, vol. 9, no. 9, pp. 8822-8832, Sep. 2015.

[17] L. A. Walsh and C. L. Hinkle, "van der Waals epitaxy: 2D materials and topological insulators," Appl. Mater. Today, vol. 9, pp. 504-515, December 2017.

[18] A. Splendiani et al., "Emerging Photoluminescence in Monolayer MoS2," Nano Lett., vol. 10, no. 4, pp. 1271-1275, April 2010.

[19] Y. Ye et al., "Monolayer excitonic laser," Nat. Photonics, vol. 9, no. 11, pp. 733-737, November 2015.

[20] H. Zhang et al., "Molybdenum disulfide ($MoS_2$) as a broadband saturable absorber for ultra-fast photonics," Opt. Express, vol. 22, no. 6, pp. 7249-7260, March 2014.

[21] J. S. Ross et al., "Electrical control of neutral and charged excitons in a monolayer semiconductor," Nat. Commun., vol. 4, p. 1474, February 2013.

[22] A. Chernikov et al., "Electrical Tuning of Exciton Binding Energies in Monolayer ${\mathrm{WS}}_{2}$," Phys. Rev. Lett., vol. 115, no. 12, p. 126802, September 2015.

[23] J. Kim et al., "Ultrafast generation of pseudo-magnetic field for valley excitons in WSe2 monolayers," Science, vol. 346, no. 6214, pp. 1205-1208, December 2014.

[24] H. J. Conley, B. Wang, J. I. Ziegler, R. F. Haglund, S. T. Pantelides, and K. I. Bolotin, "Bandgap Engineering of Strained Monolayer and Bilayer $MoS_2$," Nano Lett., vol. 13, no. 8, pp. 3626-3630, August 2013.

[25] A. V. Stier, N. P. Wilson, G. Clark, X. Xu, and S. A. Crooker, "Probing the Influence of Dielectric Environment on Excitons in Monolayer $WSe_2$: Insight from High Magnetic Fields," Nano Lett., vol. 16, no. 11, pp. 7054-7060, November 2016.

[26] Y. Lin et al., "Dielectric Screening of Excitons and Trions in Single-Layer MoS2," Nano Lett., vol. 14, no. 10, pp. 5569-5576, October 2014.

[27] A. Chernikov et al., "Exciton Binding Energy and Nonhydrogenic Rydberg Series in Monolayer ${\mathrm{WS}}_{2}$," *Phys. Rev. Lett.*, vol. 113, no. 7, p. 076802, August 2014.

[28] S. Borghardt et al., "Engineering of optical and electronic band gaps in transition metal dichalcogenide monolayers through external dielectric screening," *Phys. Rev. Mater.*, vol. 1, no. 5, p. 054001, October 2017.

[29] G. Kowalski et al., "New X-ray insight into oxygen intercalation in epitaxial graphene grown on 4 H -SiC (0001)," *J. Appl. Phys.*, vol. 117, no. 10, p. 105301, March 2015.

[30] L. Alvarez-Fraga et al., "Oxidation Mechanisms of Copper under Graphene: The Role of Oxygen Encapsulation," *Chem. Mater.*, vol. 29, no. 7, pp. 3257-3264, April 2017.

[31] P. Sutter, J. T. Sadowski, and E. A. Sutter, "Chemistry under Cover: Tuning Metal-Graphene Interaction by Reactive Intercalation," *J. Am. Chem. Soc.*, vol. 132, no. 23, pp. 8175-8179, June 2010.

[32] Y. Du et al., "Quasi-freestanding epitaxial silicene on Ag(111) by oxygen intercalation," *Sci. Adv.*, vol. 2, no. 7, p. e1600067, July 2016.

[933] E. Grånäs et al., "Oxygen Intercalation under Graphene on Ir(111): Energetics, Kinetics, and the Role of Graphene Edges," *ACS Nano*, vol. 6, no. 11, pp. 9951-9963, November 2012.

[34] L. Bignardi et al., "Key role of rotated domains in oxygen intercalation at graphene on Ni(1 1 1)," *2D Mater.*, vol. 4, no. 2, p. 025106, 2017.

[35] S. Ulstrup et al., "Photoemission investigation of oxygen intercalated epitaxial graphene on Ru(0001)," *Surf. Sci.*, March 2018.

[36] K. Hamamoto, M. Ezawa, K. W. Kim, T. Morimoto, and N. Nagaosa, "Nonlinear spin current generation in noncentrosymmetric spin-orbit coupled systems," *Phys. Rev. B*, vol. 95, no. 22, p. 224430, June 2017.

[37] M. Smidman, M. B. Salamon, H. Q. Yuan, and D. F. Agterberg, "Superconductivity and spin-orbit coupling in non-centrosymmetric materials: a review," *Rep. Prog. Phys.*, vol. 80, no. 3, p. 036501, 2017.

[38] C. Mera Acosta, O. Babilonia, L. Abdalla, and A Fazzio, "Unconventional spin texture in a noncentrosymmetric quantum spin Hall insulator," *Phys. Rev. B*, vol. 94, no. 4, p. 041302, July 2016.

[39] G. Kresse and D. Joubert, "From ultrasoft pseudopotentials to the projector augmented-wave method," *Phys. Rev. B*, vol. 59, no. 3, pp. 1758-1775, January 1999.

[40] G. Kresse and J. Furthmüller, "Efficient iterative schemes for ab initio total-energy calculations using a plane-wave basis set," *Phys. Rev. B*, vol. 54, no. 16, pp. 11169-11186, October 1996.

[41] G. Kresse and J. Hafner, "Ab initio molecular dynamics for open-shell transition metals," *Phys. Rev. B*, vol. 48, no. 17, pp. 13115-13118, November 1993.

[42] J. P. Perdew, K. Burke, and M. Ernzerhof, "Generalized Gradient Approximation Made Simple," *Phys. Rev. Lett.*, vol. 77, no. 18, pp. 3865-3868, October 1996.

[43] S. Grimme, "Semiempirical GGA-type density functional constructed with a long-range dispersion correction," *J. Comput. Chem.*, vol. 27, no. 15, pp. 1787-1799, November 2006.

[1b] Y. Cao et al., "Unconventional superconductivity in magic-angle graphene superlattices," *Nature*, vol. 556, no. 7699, pp. 43-50, April 2018.

[2b] Y. Cao et al., "Correlated insulator behaviour at half-filling in magic-angle graphene superlattices," *Nature*, vol. 556, no. 7699, pp. 80-84, April 2018.

[3b] A. Vargas et al., "Tunable and laser-reconfigurable 2D heterocrystals obtained by epitaxial stacking of crystallographically incommensurate $Bi_2Se3$ and MoS2 atomic layers," *Sci. Adv.*, vol. 3, no. 7, p. e1601741, July 2017.

[4b] Z. Shi, X. Wang, Y. Sun, Y. Li, and L. Zhang, "Interlayer coupling in two-dimensional semiconductor materials," *Semicond. Sci. Technol.*, vol. 33, no. 9, p. 093001, 2018.

[5b] C. Zhang et al., "Interlayer couplings, Moire patterns, and 2D electronic superlattices in MoS2WSe2 heterobilayers," *Sci. Adv.*, vol. 3, no. 1, p. e1601459, January 2017.

[6b] M.-H. Chiu et al., "Spectroscopic Signatures for Interlayer Coupling in MoS2-WSe2 van der Waals Stacking," *ACS Nano*, vol. 8, no. 9, pp. 9649-9656, September 2014.

[7b] K. S. Novoselov, A. Mishchenko, A. Carvalho, and A. H. C. Neto, "2D materials and van der Waals heterostructures," *Science, vol.* 353, no. 6298, p. aac9439, July 2016.

[8b] C. Androulidakis, K. Zhang, M. Robertson, and S. Tawfick, "Tailoring the mechanical properties of 2D materials and heterostructures," *2D Mater.*, vol. 5, no. 3, p. 032005, 2018.

[9b] Y. Liu, N. O. Weiss, X. Duan, H.-C. Cheng, Y. Huang, and X. Duan, "Van der Waals heterostructures and devices," *Nat. Rev. Mater.*, vol. 1, no. 9, p. 16042, September 2016.

[10b] A. T. Hanbicki et al., "Double Indirect Interlayer Exciton in a MoSe2/WSe2 van der Waals Heterostructure," *ACS Nano*, vol. 12, no. 5, pp. 4719-4726, May 2018.

[11b] P. Rivera et al., "Observation of long-lived interlayer excitons in monolayer MoSe2-WSe2 heterostructures," *Nat. Commun.*, vol. 6, p. 6242, February 2015.

[12b] E. M. Alexeev et al., "Imaging of Interlayer Coupling in van der Waals Heterostructures Using a Bright-Field Optical Microscope," *Nano Lett.*, vol. 17, no. 9, pp. 5342-5349, September 2017.

[13b] M. Yankowitz et al., "Dynamic band-structure tuning of graphene moire superlattices with pressure," *Nature*, vol. 557, no. 7705, p. 404, May 2018.

[14b] H. Fang et al., "Strong interlayer coupling in van der Waals heterostructures built from single-layer chalcogenides," *Proc. Natl. Acad. Sci.*, vol. 111, no. 17, pp. 6198-6202, April 2014.

[15b] H. Heo et al., "Interlayer orientation-dependent light absorption and emission in monolayer semiconductor stacks," *Nat. Commun.*, vol. 6, p. 7372, June 2015.

[16b] S. M. Shinde et al., "Stacking-controllable interlayer coupling and symmetric configuration of multilayered $MoS_2$," *NPG Asia Mater.*, vol. 10, no. 2, p. e468, February 2018.

[17b] R. Bistritzer and A. H. MacDonald, "Moire bands in twisted double-layer graphene," *Proc. Natl. Acad. Sci.*, vol. 108, no. 30, pp. 12233-12237, July 2011.

[18b] J. Jung, A. Raoux, Z. Qiao, and A. H. MacDonald, "theory of moire superlattice bands in layered two-dimensional materials," *Phys. Rev. B*, vol. 89, May 2014.

[19b] H. Yoo et al., "Atomic and electronic reconstruction at van der Waals interface in twisted bilayer graphene," p. 37.

[20b] E. C. T. O'Farrell et al., "Rashba Interaction and Local Magnetic Moments in a Graphene-BN Heterostructure Intercalated with Au," *Phys. Rev. Lett., vol.* 117, no. 7, p. 076603, August 2016.

[21b] M. Kühne et al., "Reversible superdense ordering of lithium between two graphene sheets," *Nature*, p. 1, November 2018.

[22b] L. Yuan et al., "Photocarrier generation from interlayer charge-transfer transitions in WS2-graphene heterostructures," *Sci. Adv.*, vol. 4, no. 2, p. e1700324, February 2018.

[23b] A. Castellanos-Gomez et al., "Deterministic transfer of two-dimensional materials by all-dry viscoelastic stamping," *2D Mater.*, vol. 1, no. 1, p. 011002, 2014.

[24b] S. Masubuchi et al., "Autonomous robotic searching and assembly of two-dimensional crystals to build van der Waals superlattices," *Nat. Commun.*, vol. 9, no. 1, p. 1413, April 2018.

[25b] D. Wang et al., "Thermally Induced Graphene Rotation on Hexagonal Boron Nitride," *Phys. Rev. Lett.*, vol. 116, no. 12, March 2016.

[26b] C. R. Woods et al., "Macroscopic self-reorientation of interacting two-dimensional crystals," *Nat. Commun.*, vol. 7, p. 10800, March 2016.

[27b] Y.-C. Lin et al., "Atomically Thin Heterostructures Based on Single-Layer Tungsten Diselenide and Graphene," *Nano Lett.*, vol. 14, no. 12, pp. 6936-6941, December 2014.

[28b] V. Carozo et al., "Excitonic processes in atomically-thin MoSe 2 /MoS 2 vertical heterostructures," *2D Mater.*, vol. 5, no. 3, p. 031016, 2018.

[29b] N. Yang, K. Choi, J. Robertson, and H. G. Park, "Layer-selective synthesis of bilayer graphene via chemical vapor deposition," *2D Mater.*, vol. 4, no. 3, p. 035023, 2017.

[30b] R. Ribeiro-Palau, C. Zhang, K. Watanabe, T. Taniguchi, J. Hone, and C. R. Dean, "Twistable electronics with dynamically rotatable heterostructures," *Science*, vol. 361, no. 6403, pp. 690-693, August 2018.

[31b] K. Zhang and E. B. Tadmor, "Structural and electron diffraction scaling of twisted graphene bilayers," *J. Mech. Phys. Solids*, vol. 112, pp. 225-238, March 2018.

[32b] I. Bilgin et al., "Chemical Vapor Deposition Synthesized Atomically Thin Molybdenum Disulfide with Optoelectronic-Grade Crystalline Quality," *ACS Nano*, vol. 9, no. 9, pp. 8822-8832, September 2015.

[33b] X. Qiu and W. Ji, "Illuminating interlayer interactions," *Nat. Mater.*, vol. 17, no. 3, p. 211, March 2018.

[34b] N. B. Le, T. D. Huan, and L. M. Woods, "Interlayer Interactions in van der Waals Heterostructures: Electron and Phonon Properties," *ACS Appl. Mater. Interfaces*, vol. 8, no. 9, pp. 6286-6292, March 2016.

[35b] I. Leven, T. Maaravi, I. Azuri, L. Kronik, and O. Hod, "Interlayer Potential for Graphene/h-BN Heterostructures," *J. Chem. Theory Comput.*, vol. 12, no. 6, pp. 2896-2905, June 2016.

[36b] L. A. Bendersky and F. W. Gayle, "Electron Diffraction Using Transmission Electron Microscopy," *J. Res. Natl. Inst. Stand. Technol.*, vol. 106, no. 6, pp. 997-1012, 2001.

[37b] J. Thomas and T. Gemming, Analytical Transmission Electron Microscopy: An Introduction for Operators. Springer Netherlands, 2014.

[38b] R. A. Schwarzer, "The Determination of Local Texture by Electron Diffraction-A Tutorial Review," *Texture, Stress, and Microstructure*, 1993. [Onlineb]. Available: https://www.hindawi.com/journals/tsm/1993/696572/abs/. [Accessed: 27 Nov. 2018b].

[39b] L. Fei et al., "Direct TEM observations of growth mechanisms of two-dimensional MoS$_2$ flakes," *Nat. Commun.*, vol. 7, p. 12206, July 2016.

[40b] J. M. Yuk, M. Jeong, S. Y. Kim, H. K. Seo, J. Kim, and J. Y. Lee, "In situ atomic imaging of coalescence of Au nanoparticles on graphene: rotation and grain boundary migration," *Chem. Commun.*, vol. 49, no. 98, pp. 11479-11481, November 2013.

[41b] J. C. Meyer et al., "Experimental analysis of charge redistribution due to chemical bonding by high-resolution transmission electron microscopy," *Nat. Mater.*, vol. 10, no. 3, pp. 209-215, March 2011.

[42b] T. Latychevskaia, C. Escher, and H.-W. Fink, "Moire structures in twisted bilayer graphene studied by transmission electron microscopy," *Ultramicroscopy*, vol. 197, pp. 46-52, February 2019.

[43b] Y. Chen, "Nanofabrication by electron beam lithography and its applications: A review," *Microelectron. Eng.*, vol. 135, pp. 57-72, March 2015.

[44b] A. Vargas et al., "The Changing Colors of a Quantum-Confined Topological Insulator," *ACS Nano*, vol. 8, no. 2, pp. 1222-1230, February 2014.

[45b] A. Vargas, F. Liu, and S. Kar, "Giant enhancement of light emission from nanoscale Bi2Se3," *Appl. Phys. Lett.*, vol. 106, no. 24, p. 243107, June 2015.

[46b] J. Cazaux, "Material contrast in SEM: Fermi energy and work function effects," Ultramicroscopy, vol. 110, no. 3, pp. 242-253, February 2010.

[47b] Y. Zhou et al., "Quantitative secondary electron imaging for work function extraction at atomic level and layer identification of graphene," *Sci. Rep.*, vol. 6, p. 21045, February 2016.

SUPPLEMENTAL REFERENCES

[1s] Y. L. Chen et al., "Massive Dirac Fermion on the Surface of a Magnetically Doped Topological Insulator," *Science*, vol. 329, no. 5992, pp. 659-662, August 2010.

[2s] L. Bignardi et al., "Key role of rotated domains in oxygen intercalation at graphene on Ni(1 1 1)," *2D Mater.*, vol. 4, no. 2, p. 025106, 2017.

[3s] P. Sutter, J. T. Sadowski, and E. A. Sutter, "Chemistry under Cover: Tuning Metal-Graphene Interaction by Reactive Intercalation," *J. Am. Chem. Soc.*, vol. 132, no. 23, pp. 8175-8179, June 2010.

[4s] Y. Du et al., "Quasi-freestanding epitaxial silicene on Ag(111) by oxygen intercalation," *Science Advances*, vol. 2, no. 7, p. e1600067, July 2016.

[5s] E. Grånäs et al., "Oxygen Intercalation under Graphene on Ir(111): Energetics, Kinetics, and the Role of Graphene Edges," *ACS Nano*, vol. 6, no. 11, pp. 9951-9963, November 2012.

[6s] G. Kowalski et al., "New X-ray insight into oxygen intercalation in epitaxial graphene grown on 4 H -SiC (0001)," *Journal of Applied Physics*, vol. 117, no. 10, p. 105301, March 2015.

[7s] T. Li and J. A. Yarm off, "Intercalation and desorption of oxygen between graphene and Ru(0001) studied with helium ion scattering," *Physical Review B*, vol. 96, no. 15, October 2017.

[8s] S. Ulstrup et al., "Photoemission investigation of oxygen intercalated epitaxial graphene on Ru(0001)," *Surface Science*, March 2018.

[9s] A. Vargas et al., "Tunable and laser-reconfigurable 2D heterocrystals obtained by epitaxial stacking of crystallographically incommensurate $Bi_2Se_3$ and $MoS_2$ atomic layers," *Science Advances*, vol. 3, no. 7, p. e1601741, July 2017.

[10s] E. Xenogiannopoulou et al., "High-quality, large-area MoSe 2 and MoSe 2 /Bi 2 Se 3 heterostructures on AlN(0001)/Si(111) substrates by molecular beam epitaxy," *Nanoscale*, vol. 7, no. 17, pp. 7896-7905, 2015.

[11s] M.-H. Chiu et al., "Spectroscopic Signatures for Interlayer Coupling in MoS2-WSe2 van der Waals Stacking," *ACS Nano*, vol. 8, no. 9, pp. 9649-9656, September 2014.

[12s] K. F. Mak et al., "Tightly bound trions in monolayer $MoS_2$," *Nature Materials*, vol. 12, no. 3, pp. 207-211, March 2013.

[13s] A. J. Green et al., "Surface oxidation of the topological insulator Bi2Se3," *Journal of Vacuum Science & Technology A*, vol. 34, no. 6, p. 061403, November 2016.

The invention claimed is:

1. A method of making a 2D heterostructure, the method comprising:
growing a first crystalline layer comprising a material selected from the group consisting of $MoSe_2$, $MoS_2$, $WS_2$, $MoSe_{2-2x}S_{2x}$, and combinations thereof in an inert atmosphere;
growing a second crystalline layer comprising or consisting of $Bi_2Se_3$ in an inert atmosphere, the second crystalline layer in contact with the first crystalline layer at an interlayer region, the second crystalline layer operative to suppress photoluminescence of the first crystalline layer; and
adding oxygen to the interlayer region at selected positions, wherein the addition of oxygen reverses the suppression of photoluminescence at said positions in proportion to the amount of oxygen added.

2. The method of claim 1, wherein adding oxygen to the interlayer region comprises exposing said selected positions of the second crystalline layer to a beam of electromagnetic radiation or particles in an oxygen-controlled atmosphere comprising oxygen, such that oxygen enters the interlayer region at said selected positions.

3. The method of claim 2, wherein the oxygen-enriched positions exhibit unsuppressed photoluminescence which is proportional to the amount of oxygen intercalated in the interlayer region at each position, and wherein outside said selected positions the 2D heterostructure exhibits suppressed photoluminescence.

4. The method of claim 2, wherein the amount of oxygen that enters the interlayer region is proportional to the intensity and duration of the electromagnetic radiation or particles, the temperature, and the partial pressure of oxygen in the atmosphere.

5. The method of claim 1, wherein the first crystalline layer is grown on a substrate comprising $SiO_2$ or Si.

6. The method of claim 1, wherein the second crystalline layer is grown on the first crystalline layer or the first crystalline layer is grown on the second crystalline layer.

7. The method of claim 1, wherein the first and second crystalline layers are grown by a process comprising chemical vapor deposition.

8. The method of claim 1, wherein growing the first crystalline layer comprises placing $MoO_2$ or $WO_2$ into a furnace with sulfur, selenium, or a combination thereof.

9. The method of claim 1, wherein growing the second crystalline layer comprises placing $Bi_2Se_3$ into a furnace with the first crystalline layer.

10. The method of claim 1, wherein the first crystalline layer is grown to an average thickness of about 1 nm and the second crystalline layer is grown to an average thickness in the range of about 1 nm to about 20 nm.

11. The method of claim 10, wherein the thickness of the 2D heterostructure is increased by about 0.15 nm to about 0.50 nm at said selected oxygen-enriched positions.

12. The method of claim 1, further comprising, after adding oxygen, annealing the 2D heterostructure at a temperature from about 150° C. to about 350° C. for about 3 hours in an inert atmosphere, wherein the annealing removes a portion of the oxygen from the selected positions.

13. The method of claim 2, wherein said exposure to the beam of electromagnetic radiation or particles changes the wavelength of the unsuppressed photoluminescence at said selected positions wherein oxygen enters the interlayer region.

14. A 2D heterostructure comprising:
a first layer comprising a material selected from the group consisting of $MoSe_2$, $MoS_2$, $WS_2$, $MoSe_{2-2x}S_{2x}$, and combinations thereof;
a second layer deposited on the first layer, wherein the second layer comprises one or more atomic layers of $Bi_2Se_3$;
an interlayer region between the first layer and the second layer, the interlayer region comprising oxygen at selected positions within the interlayer region.

15. A 2D heterostructure made by a method comprising the method of claim 1.

16. An information storage device comprising a 2D heterostructure of claim 14.

17. An image display device comprising the 2D heterostructure of claim 1.

18. An oxygen storage device comprising the 2D heterostructure of claim 14.

19. An oxygen sensing device comprising the 2D heterostructure of claim 14.

20. A method of storing information on a 2D heterostructure, the method comprising:
(a) providing the 2D heterostructure of claim 14;
(b) exposing selected positions of the first crystalline layer of the heterostructure to a beam of electromagnetic radiation or particles in an oxygen controlled atmosphere, whereby photoluminescence of said positions is modified compared to photoluminescence of non-exposed positions.

21. A method of reading information from a 2D heterostructure, the method comprising:
(a) providing the 2D heterostructure of claim 14 comprising selected positions having modified photoluminescence compared to other positions;
(b) measuring photoluminescence at said selected positions whereby information is obtained from position, intensity, and/or wavelength of the photoluminescence.

22. A method of modulating photoluminescence of the 2D heterostructure of claim 14, the method comprising exposing the 2D heterostructure at selected positions to a beam of electromagnetic radiation or particles in an oxygen-free atmosphere, whereby said exposing causes diffusion of oxygen out of the interlayer region at said selected positions and photoluminescence is decreased at said selected positions.

* * * * *